United States Patent [19]
Saitoh et al.

[11] Patent Number: 6,097,064
[45] Date of Patent: Aug. 1, 2000

[54] SEMICONDUCTOR DEVICE AND MANUFACTURING METHOD THEREOF

[75] Inventors: Yutaka Saitoh; Jun Osanai, both of Chiba, Japan

[73] Assignee: Seiko Instruments Inc., Japan

[21] Appl. No.: 08/873,327

[22] Filed: Jun. 12, 1997

Related U.S. Application Data

[63] Continuation of application No. 08/415,039, Mar. 30, 1995, abandoned.

[30] Foreign Application Priority Data

Mar. 31, 1994 [JP] Japan .................................. 6-063780
Mar. 15, 1995 [JP] Japan .................................. 7-056140

[51] Int. Cl.[7] ........................... H01L 29/76; H01L 29/94; H01L 31/062; H01L 31/113
[52] U.S. Cl. .......................................... 257/345; 257/344
[58] Field of Search ..................................... 257/345, 344

[56] References Cited

U.S. PATENT DOCUMENTS 4,691,217  9/1987  Ueno et al. ........................ 357/23.13

FOREIGN PATENT DOCUMENTS

| 189914 | 6/1986 | European Pat. Off. . |
| 266768 | 5/1987 | European Pat. Off. . |
| 248292 | 9/1987 | European Pat. Off. . |
| 276850 | 3/1988 | European Pat. Off. . |
| 444686 | 4/1991 | European Pat. Off. . |
| 58-219766 | 12/1983 | Japan . |
| 4127537 | 4/1992 | Japan . |
| 5121436 | 5/1993 | Japan . |
| 2020484 | 11/1979 | United Kingdom . |

OTHER PUBLICATIONS

Patent Abstracts of Japan, vol 12, No. 250 (E–633) Jul. 14, 1988.
Patent Abstracts of Japan, vol 10, No. 306 (E–446) Oct. 17, 1986.
Patent Abstracts of Japan, vol. 17, No. 549 (E–1443) Oct. 4, 1993.
Patent Abstracts of Japan, vol. 17, No. 440 (E–1414) Aug. 13, 1993.
IEEE Electronic Device Letters, vol. 14, No. 7, Jul. 1993, New York, USA, pp. 326–328, Keon Verhaege et al., "Double Snapback in SOI nMOSFET's and its Application for SOI ESD Protection".
Electrical Overstress/Electrostatic Discharge Symposium Proceedings, Anaheim, CA, USA, Sep. 27–29, 1988, C. Duvvury et al., "Output ESD Protection Techniques for Advanced CMOS Processes".
Sze, *Semiconductor Devices, Physics & Tech*, pp. 218, 219, 394–397, and 401, ©1985.

*Primary Examiner*—Stephen D. Meier
*Attorney, Agent, or Firm*—Adams & Wilks

[57] ABSTRACT

An improvement of a resistance to electrostatic discharge of a semiconductor integrated circuit device is aimed. An IC having a high ESD immunity is realized by causing a surface concentration of N type impurities in a drain area of an N-channel type MOS transistor to be more than $5 \text{ E } 18/\text{cm}^3$ in maximum in the direction of gate electrode of a gate electrode terminal and to have a monotonous concentration profile in which there is no kink in a portion less than $5 \text{ E } 18/\text{cm}^3$ in the surface direction.

83 Claims, 46 Drawing Sheets

F I G. 1 6
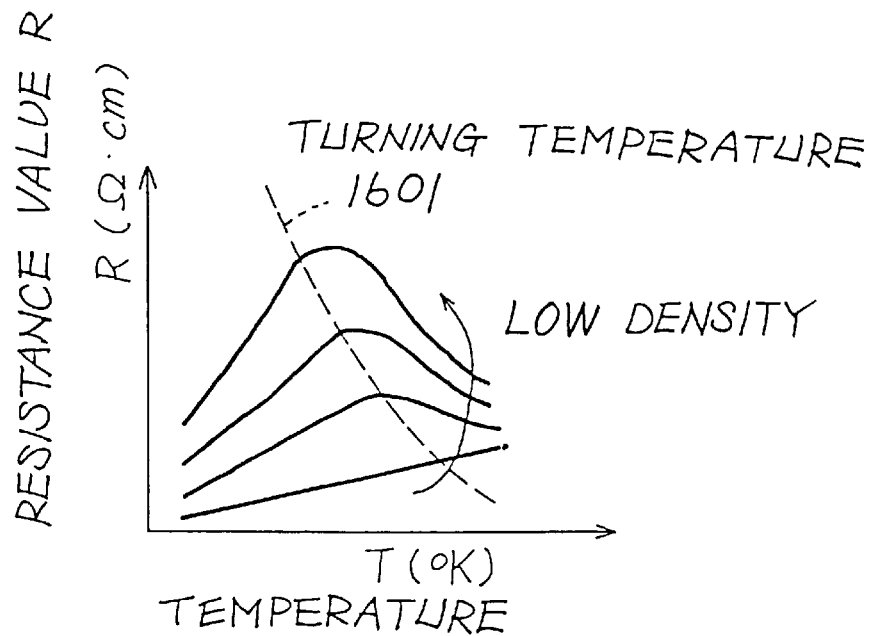
F I G. 1 7
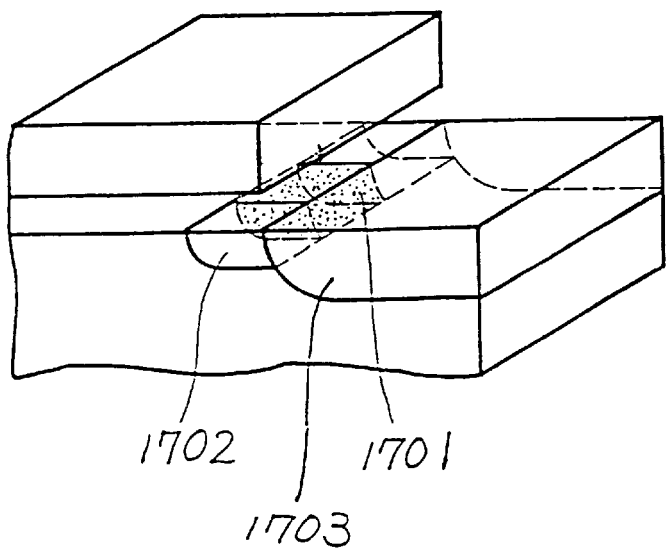

2411 PROTECTIVE NROM TRANSISTOR

2412 INTERNAL NMOS TRANSISTOR

F I G. 2 6
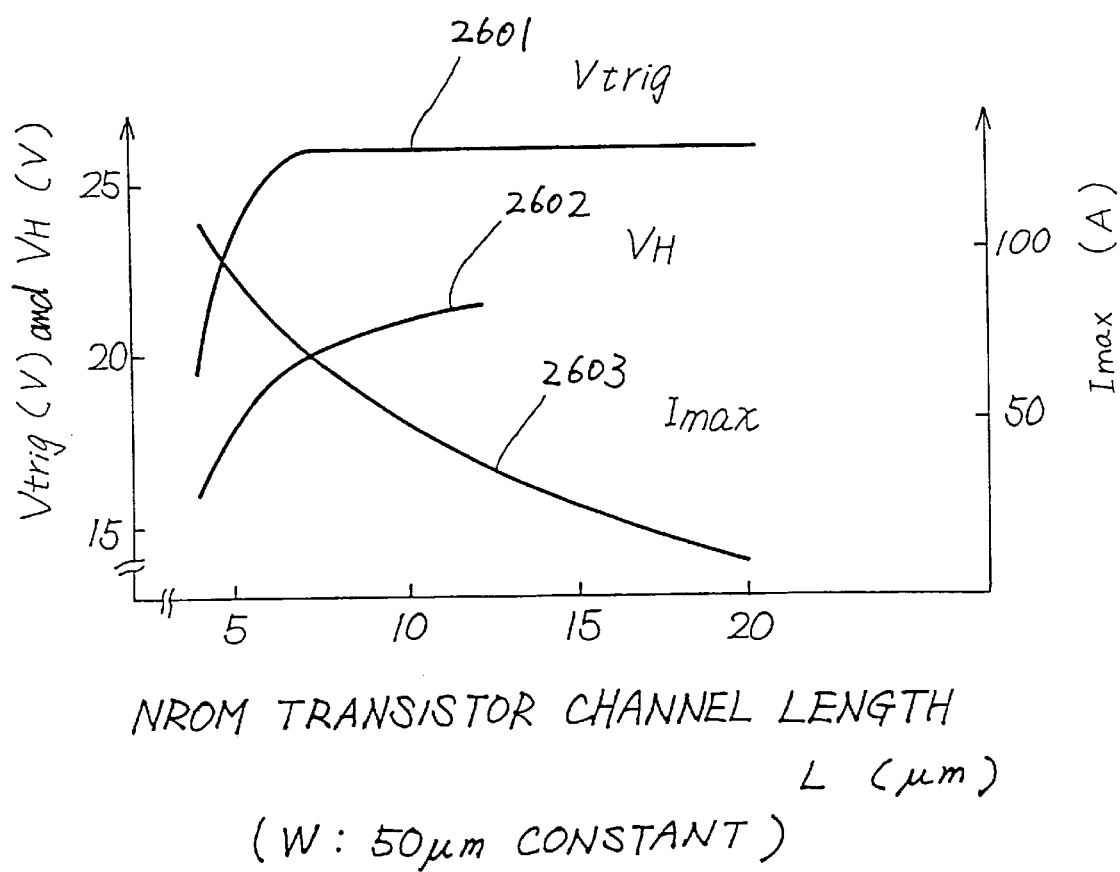

5204 PCS SIDE

5301 LOCOS EDGE
5302 NROM IMPLANTATION AREA
5303 Poly Si GATE ELECTRODE

SEMICONDUCTOR DEVICE AND MANUFACTURING METHOD THEREOF

This is a continuation application of parent application Ser. No. 08/415,039 filed Mar. 30, 1995 now abandoned.

BACKGROUND OF THE INVENTION

The present invention relates to a MOS type transistor and a configuration and manufacturing method of a semiconductor integrated circuit device containing it, and more particularly to its structure for preventing electrostatic discharge. Hereinafter the electrostatic discharge (destroy) will be abbreviated as ESD.

FIG. 50 is a block diagram showing a typical prior art input protection circuit against ESD. To protect an internal circuit (CMOS inverter in the initial stage) 5010 from ESD from an input terminal 5001, an input protection circuit 5007 is structured by a diode $D_1$ 5005 connected to a resistor R 5002 and a signal line $V_{dd}$ 5003 and a diode $D_2$ 5005 connected to GND (called an earth or $V_{ss}$). The CMOS inverter comprises an N-channel type MOS transistor 5009 (hereinafter referred to as an NMOS transistor) and a P-channel type MOS transistor 5008 (PMOS transistor). An arrow 5011 indicates a signal line connected to a circuit further inside. Such structure is the main stream.

The technology described above has the following problems.

FIG. 51 is a graph showing a characteristic (I-V characteristic) between voltage and current of the diode in the reverse direction used in the prior art protection circuit. A withstand voltage $V_R$ of the diode approaches to a withstand voltage $BV_{OX}$ of a gate insulating film (called as gate $SiO_2$ or gate OX, etc.) of the MOS transistor when the current $I_R$ reaches to the level of about 100 mA, even if $V_R$ has been set lower than $BV_{OX}$ when $I_R$ is in the level of 1 nA or 1 μA. In the description below, as against CMOS semiconductor integrated circuit devices (IC) used in the standard of 5V of $V_{dd}$, those used in more than 10 V, 12 V or more than 16 V and 24 V will be described as high withstanding CMOS ICs.

When the high withstanding CMOS is used, it is necessary to increase a withstand voltage of the diode by some degrees and the gate OX has become thin in the advancement of refinement ($BV_{OX}$ has been lowered). Accordingly, the margin for protecting the internal circuit has come to be reduced.

It is noted that for ESD immunity presently used, a machine model 200 PF, 0 Ω series resistance and 400 V (meaning that IC will not be destroyed by min. 400 V; normally 200 to 400 V is the criterion) become one of criteria in the EIAJ standard.

When a pulse width at this time is about 100 nsec., a flowing current is represented as follows:

$$\text{Current } I = \frac{200 \times 10^{-12} \times 400}{100 \times 10^{-9}} = 0.8 \ (A) \quad \text{(Equation 1)}$$

ESD is a short time high current event.

Although there is a human model loaded with a series resistance (a standard and device charge model often used in the U.S.) as another notation of ESD immunity, the machine model which is common in Japan will be explained in the present invention since it is fully correlated qualitatively with the EIAJ standard described above.

If the resistor R in FIG. 50 is increased for example to restrict I entering the diode, it then takes a large area, causing a problem in the high integration. It is because the volume is also an important parameter, beside the resistance value itself, and hence it requires an area which far exceeds the initial expectation.

The withstand voltage of the diode is normally about 20 to 30 V in a CMOS IC. If the withstand voltage is tried to be increased in a case of LOCOS (Local Oxidation of Silicon: the generic name of processes in the field separation method which is presently the main stream) process, although the field dope (concentration of an impurity layer under a thick oxide film in a field separation area in the case of LOCOS) has to be densified, there arises a problem of inviting either or all of the increase of capacity of junctions and wires, the induction of crystal defects, the increase of processes and the drop of the narrow channel effect.

Accordingly, there is a problem in the aspect of protecting other circuits in the end even if the ESD immunity of the diode itself is increased.

SUMMARY OF THE INVENTION

In order to solve the above-mentioned problems, the present invention takes the following measures.

As a first measure, a surface concentration of N type impurities in a drain area of an NMOS transistor is caused to have more than 5 E $18/cm^3$ in maximum in the direction from the drain edge to the gate electrode and to be monotonous concentration profile having no kink in the portion of less than 5 E $18/cm^3$ in the surface direction.

As a second measure, a diffusion depth related to the first drain area is caused to be more than 0.5 μm or is set with a relationship shown in FIG. 60 which will be described later. As a third measure, while a bipolar operation (described later) is brought about when a gate electrode and a source electrode of the NMOS transistor and a transistor substrate (called as a body, board or Sub) electrode are short-circuited and earthed (hereinafter such electrical connection state will be called as "off-connection" and a transistor in such off-connection state will be called as an "off-transistor" or "off-tra") and when a voltage $V_{dd}$ of the drain is raised, a hold voltage (described later) $V_H$ after a 1st snap-back (lst breakdown; described later) at this time is set higher than the upper limit $V_{ddmax}$ of an operating power voltage of a semiconductor integrated circuit device (IC) containing said NMOS in the normal use state.

As a fourth measure, the drain area of the NMOS transistor is structured such that it is surrounded all by the gate electrode continuously planewise (called a DAA structure; detail will be described later).

As a fifth measure, when a voltage of the 1st breakdown of the NMOS transistor described in the fourth measure is a trigger voltage $V_{trig}$ and when the NMOS transistor is used as a protecting element, it is set lower than $V_{trig}$ of a transistor composing an internal circuit to be protected. At this time, a thickness of the gate insulating film of the NMOS transistor is the same with or thicker than that of the internal transistor.

As a sixth measure, the NMOS transistors in the first to fourth measures are used as a component of an IC.

As a seventh measure, the NMOS transistors in the first to fifth measures are used as a protection element of an IC against ESD as an off-transistor.

As an eighth measure, the NMOS transistors in the first to fifth measures and in the seventh measure as a component or as a protection element against ESD of an IC whose operation rating max. (upper limit of specified operating power supply voltage range $V_{ddmax}$) is more than 12 V or an IC in which there is more than one terminal whose rating is more than 12 V.

As a ninth measure, the NMOS transistors in the first to seventh measures are used as a component or as a protection element against ESD of an IC whose operation rating min. (lower limit of specified operating power supply voltage range, $V_{ddmin}$) is less than 1.5 V.

As a tenth measure, the NMOS transistors in the first to seventh measures are used as a component or as a protection element against ESD of an IC using a so-called SOI (Silicon On Insulator) having an insulating film on a support substrate (quartz, Si, etc.) and having a thin film semiconductor substrate on the insulating film.

As an eleventh measure, an IC manufacturing method comprising steps of introducing more than $5 \times 10^{14}/cm^2$ of N type impurities surface-selectively in introducing impurities to form at least a drain area; forming a gate insulating film; forming a gate electrode; implementing a non-oxidant heat treatment at more than 1,100° C. for more than 30 minutes; and then introducing more than $1 \times 10^{15}/cm^2$ of second N type impurities is adpoted in a process of forming the NMOS transistor.

The following operations are brought about by taking the measures described above.

By taking the first measure, an ESD immunity of the NMOS transistor itself may be enhanced.

By taking the second measure, the ESD immunity of the NMOS transistor may be enhanced and at the same time, a full drive-ability of the drain (to suppress the increase of drain resistance) may be assured and the increase of a contact resistance (contact resistance of the drain electrode such as Al and the drain area) may be suppressed.

By taking the third measure, the NMOS transistor can assure a latch up resistance, in addition to the ESD immunity.

By taking the fourth measure, no current (electric field) concentrates at the interface between the gate and drain area, thus allowing to improve $BV_s$ (surface breakdown at the gate electrode end of the drain connection).

By taking the fifth measure, the NMOS transistor which is an off-transistor operates as the protection element, protects the internal circuit and allows to give a full ESD immunity as an IC.

By taking the sixth measure, a full ESD immunity may be given as an IC since the elements themselves which compose the whole IC become strong against ESD.

By taking the seventh measure, the internal circuit is protected by the effective protection element, the area of the IC is not increased (cost does not increase) and a full ESD immunity may be given.

By taking the eighth measure, a full ESD immunity may be given also to the high withstanding CMOS IC.

By taking the ninth measure, a full ESD immunity may be given also to a low voltage IC (such ICs whose lower limit of the specified operating power voltage range is less than 1.5 V; hereinafter it will be explained in the standard of 25° C.).

By taking the tenth measure, a full ESD immunity may be given also to an IC using a SOI substrate.

By taking the eleventh measure, the NMOS transistors described above may be manufactured without significantly increasing their steps.

BRIEF DESCRIPTION OF THE DRAWINGS

FIG. 16 is a graph showing a temperature and resistance value characteristic of the first embodiment of the present invention;

FIG. 17 is a perspective view of the MOS transistor of the first embodiment of the present invention;

FIG. 26 is a graph showing a characteristic of the NROM transistor of the first embodiment of the present invention;

FIG. 53b is a diagrammatic drawing showing a section of the similar portion of the NMOS transistor in which no NROM ion is doped, and FIG. 53c is a diagrammatic drawing showing a section along a line B-B' in FIG. 53;

In the aforementioned drawings, the numeral (101) denotes an input terminal and (107) an NROM off-transistor for input protection.

DETAILED DESCRIPTION OF THE PREFERRED EMBODIMENTS

Preferred embodiments of the present invention will be explained in detail with reference to the drawings.

Figure 1:
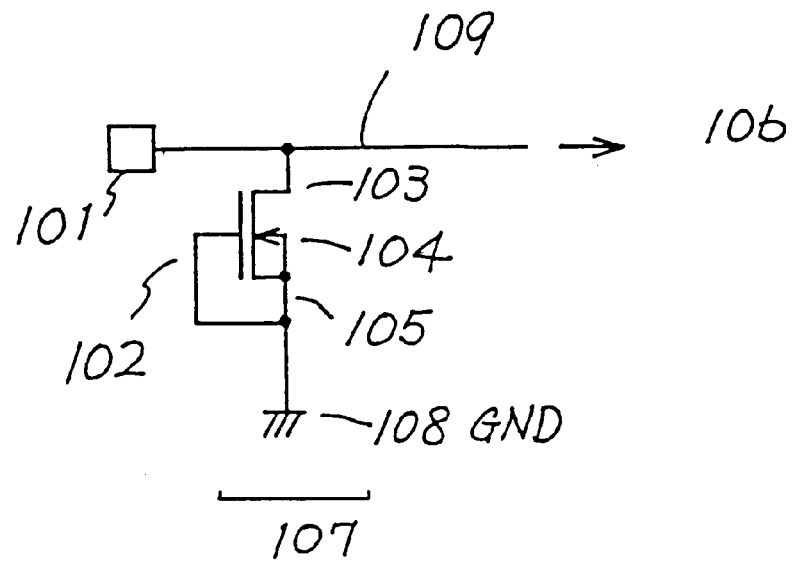
FIG. 1 is a block diagram showing a circuit of an NMOS transistor according to a first embodiment of the present invention.

FIG. 1 is a block diagram showing a circuit showing a state of an NMOS off-transistor used for input protection for explaining an NMOS transistor of a first embodiment of the present invention. An input terminal 101 is connected to a signal line 109 and to an NMOS off-transistor 107 added for input protection and a gate (G) 102 is connected to GND (called a ground or Vss) 108. A drain (D) 103 is connected to the signal line 109. A transistor substrate 104 is connected to the GND. A source (S) 105 is also connected with the GND. An arrow 106 indicates that the signal line is connected further to an internal circuit of an IC. As described before, the protection circuit by means of the diodes and resistor had various problems. Then, the use of a protection circuit as shown in FIG. 1 (example of input protection) may be proposed.

It is noted that there are three conditions as the necessary conditions of an ESD protection circuit, as follows:
(1) A withstand voltage (1-st breakdown) of the protection circuit should be smaller than that of the internal circuit to be protected;
(2) An ESD immunity of the protection circuit itself should be large; and
(3) $V_H$ (hold voltage after snap back) of the protection circuit should be higher than $V_{ddmax}$. The condition (3) is related to a phenomenon of latch up.

Figure 2:
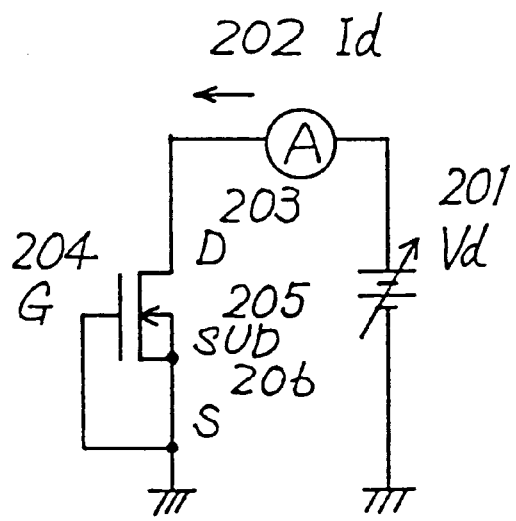
FIG. 2 is a circuit diagram for measuring a characteristic of the NMOS transistor of the first embodiment of the present invention.

FIG. 2 is a block diagram showing a circuit for measuring an I-V characteristic of the NMOS off-transistor of the first embodiment of the present invention. The reference numeral (201) denotes a drain voltage $V_d$, (202) a drain current $I_d$, (203) a drain, (204) a gate, (205) a substrate and (206) a source, respectively.

Figure 3:
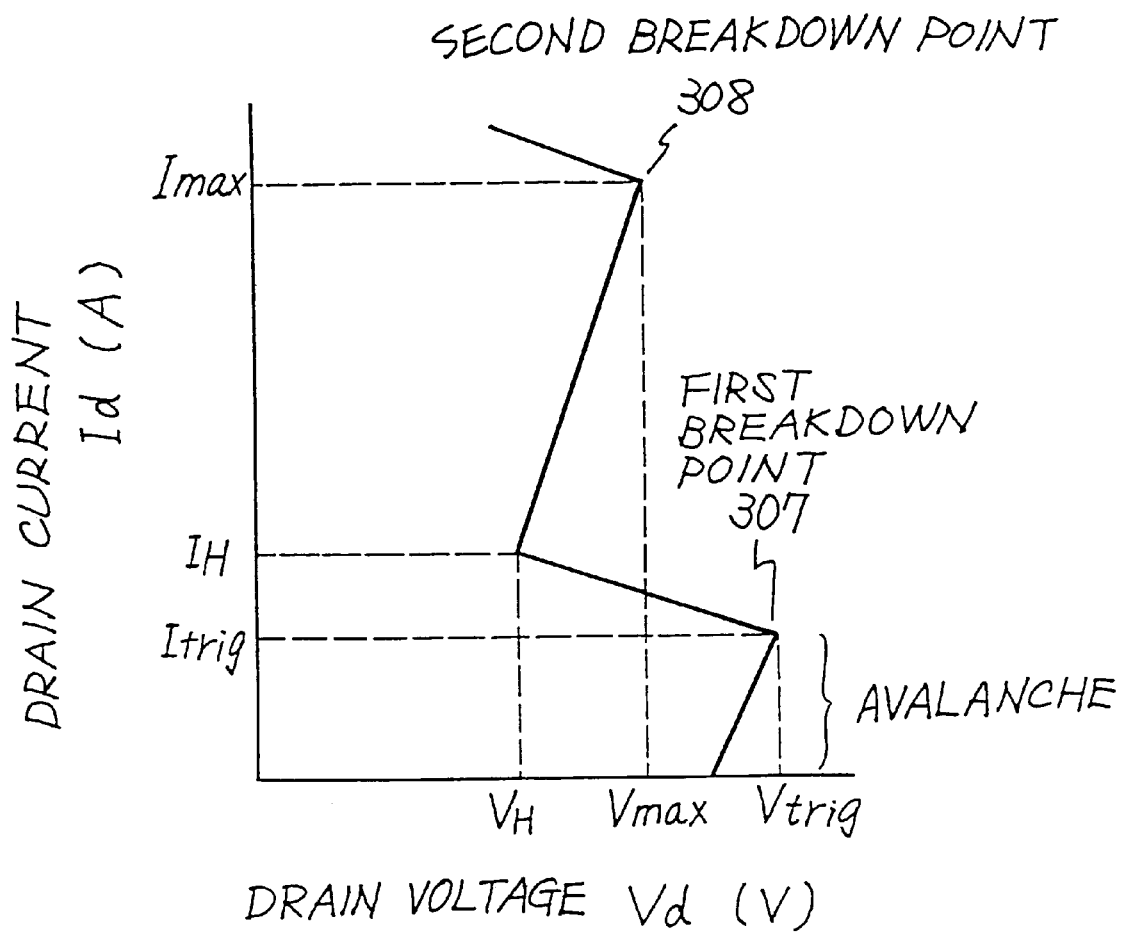
FIG. 3 is a graph showing the characteristics of the NMOS transistor of the first embodiment of the present invention.

FIG. 3 is a graph showing the I-V characteristic of the NMOS transistor of the first embodiment of the present invention. When the drain voltage $V_d$ is increased, a current flows at first by avalanche (surface breakdown) between the drain and the substrate, shifting soon to a low impedance bipolar operation. Although ESD is a short time high current event as described before, the off-transistor can protect the internal circuit because it can flow a large current in low voltage during the bipolar operation. If $I_{max}$ of the second breakdown is large in addition to that, it means that its own ESD immunity is also large. The reference numeral (307) denotes the first breakdown point and (308) denotes the second breakdown point. As for its own ESD immunity, $P_{max}$ (maximum power) which is a product of $I_{max}$ and $V_{max}$ well correlates. The greater, the stronger it is.

Generally, the surface breakdown of a MOS transistor is lower than a withstand voltage of PN junction diode from the beginning. Therefore, although it is difficult to increase its withstand voltage, it is more advantageous in statically protecting at the input section since $V_{trig}$ (avalanche breakdown voltage)<$BV_{OX}$ (dielectric breakdown voltage of gate insulating film).

However, things are different at the output as described later. Concerning to a point whether it itself is strong or not, although there is a problem in a DDD (Double Diffused Drain; a drain structure having another drain area with less concentration; used for assuring hot carrier resistance by refinement and for a high withstanding MOS) or in a LDD (Lightly Doped Drain; a drain structure having a low concentration area, the purpose is same with the DDD), there is no problem in a CONV (Conventional; a single diffused drain structure) since $I_{max}$ is large. Accordingly, the off-transistor type protection will become an effective protection circuit.

Figure 4:
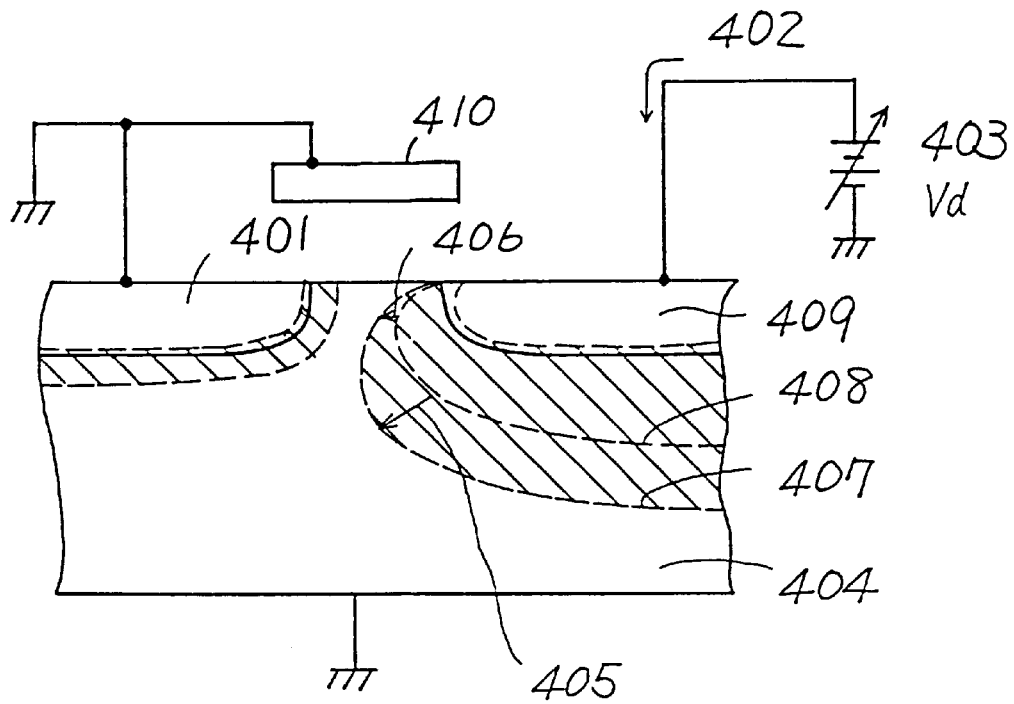
FIG. 4 is a section view of the NMOS transistor of the first embodiment of the present invention.

FIG. 4 is a section view of the NMOS transistor of the first embodiment of the present invention.

The reference numeral (401) denotes an $N^+$ type layer of the source area, (410) the gate electrode, (403) $V_d$, (409) an $N^+$ type layer of the drain area, (404) a $P^-$ type substrate, and (408) a depletion layer end on the substrate side when $V_{di}$. $V_{d2}$ 407 is a depletion layer end on the substrate side when a voltage is increased more than $V_{d1}$ 408. An arrow 406 indicates an extension of the depletion layer near the surface when $V_d$ is increased. An arrow 405 indicates an extension of the depletion layer within the substrate when $V_d$ is increased. $I_d$ 402 is a drain current.

The surface breakdown is, in short, an avalanche, i.e. a function of an electric field. Accordingly, a withstand voltage drops at a junction where concentration is high, because width of the depletion layer is narrow. In a MOS, it is necessary to consider a fixation of channel potential by the gate, beside the concentration. The MOS can deplete the channel by potential of the gate. In other words, depletion of channel is hardly brought about if the potential of the gate is fixed. When the drain voltage is raised in this state, the depletion layer on the substrate side extends, though that on the surface side does not extend. Accordingly, an avalanche breakdown is brought about near the surface where the electric field is the strongest. This is called as a surface breakdown. Its withstand voltage becomes lower than that of the junction of the $N^+$ (drain) type layer and P± (field dope) type layer even though the concentration is low since the gate potential has been fixed as described above.

Figure 5:
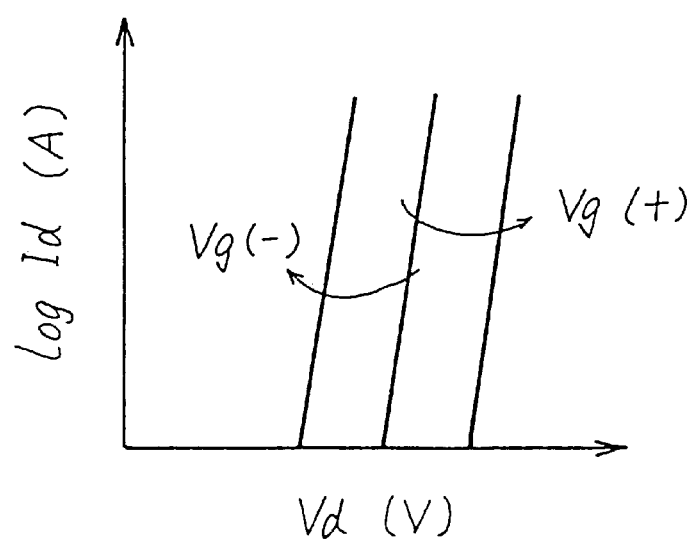
FIG. 5 is a graph showing the characteristics of the NMOS transistor of the first embodiment of the present invention.

FIG. 5 is a graph showing an I-V characteristic of the drain voltage $V_d$ and drain current $I_d$ of the NMOS transistor of the first embodiment of the present invention. A withstand voltage of the MOS may be confirmed whether it is caused by the surface breakdown or by other breakdown by keeping source open in a MOS having a long gate length (L) and by observing a dependency of the withstand voltage on a gate voltage $V_g$. When there is a $V_g$ dependency as shown in FIG. 5, it may be judged as a surface breakdown (SB). Although a band to band tunneling current (BBT) is generated at this time, SB and BBT may be discriminated by observing a temperature dependency.

In the high withstanding CMOS, it is a keypoint how to raise SB. (As described before, the high withstanding CMOS refers to those whose upper limit of the specified power voltage range is 9 V and 12 V or more than 16 V and 24 V, not 5 V which is very common, and it is used for ICs of power system that creates 5 V of power. Accordingly, because the high withstanding CMOS controls an input power voltage (6 to 12 V), it must be able to withstand to $V_{ddmax}$ such as 12 V. A driver IC for driving an external load is well known as an IC in this category). To that end, the following two methods are conceivable:
(1) Extend the depletion layer toward the drain side (have a drain area with less concentration like DDD and LDD); and
(2) Extend the depletion layer in the direction of the channel (thicken the gate insulating film). From the aspect of ESD, a device needs to be constructed by considering the method (2) above.

Figure 6:
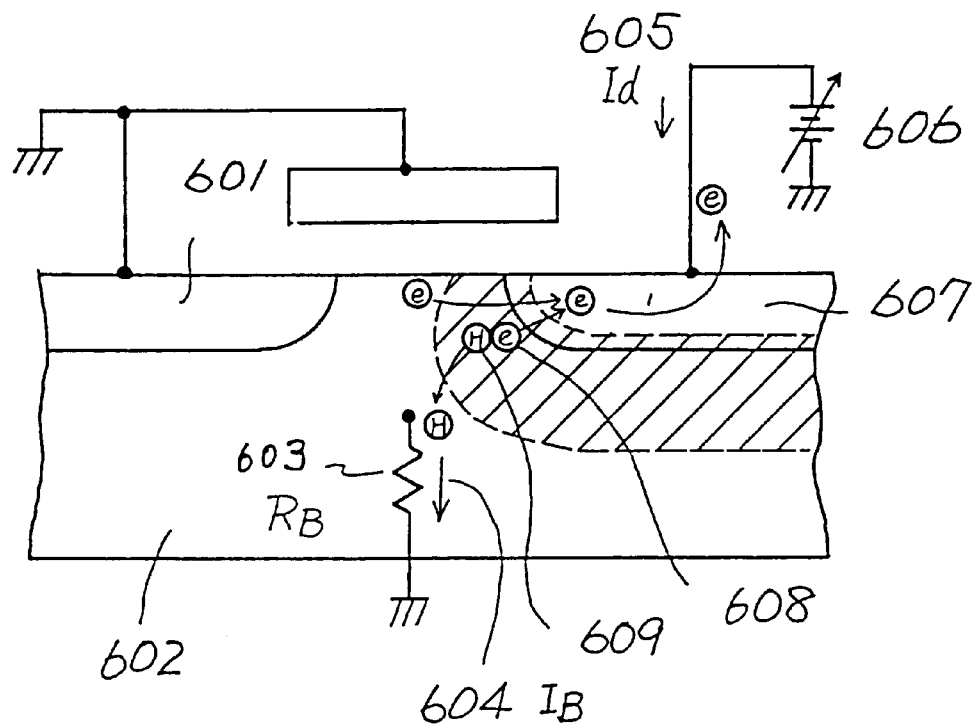
FIG. 6 is a section view of the NMOS transistor of the first embodiment of the present invention.

FIG. 6 is a section view of the NMOS transistor of the first embodiment of the present invention.

Figure 7:
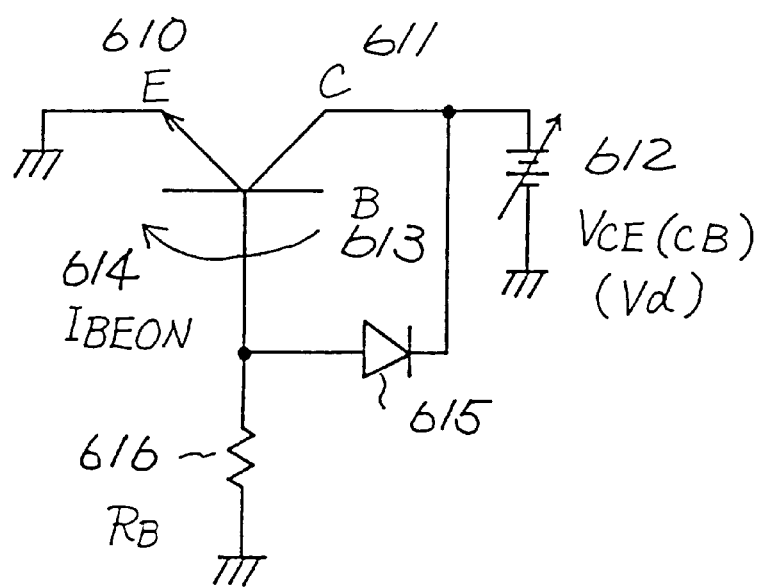
FIG. 7 is an equivalent circuit diagram of the NMOS transistor of the first embodiment of the present invention.

FIG. 7 is a block diagram showing a circuit in which the NMOS transistor of the first embodiment of the present invention is assumed to be equivalent to an NPN bipolar transistor.

Figure 8:
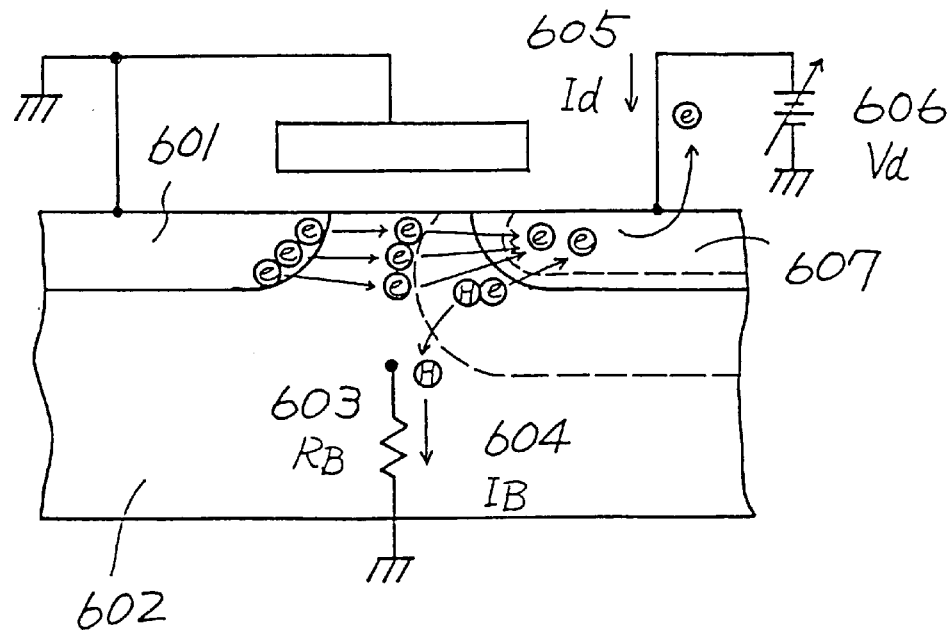
FIG. 8 is a section view of the NMOS transistor of the first embodiment of the present invention.

FIG. 8 is a section view of the NMOS transistor of the first embodiment of the present invention and shows a state in which the bipolar operation is performed. In FIGS. 6 and 7, the reference numeral (601) denotes the source area, (602) the $P^-$ type substrate, (603) a substrate resistance $R_B$, (604) a substrate current $I_B$, (605) $I_d$, (606) an applied $V_d$, (607) the drain area, (608) a symbol representing an electron, (609) a symbol representing a positive hole, (610) an emitter (E), (611) a collector (C), (613) a base (B), (614) an arrow indicating a base-on current ($I_{BEON}$) and a base-on voltage ($V_{BEON}$), (612) $V_{ce}$ (CB), (615) a diode (Di) assuming a junction which avalanches between the substrate and the drain (collector), (616) $R_B$, (617) the source area (emitter area), (618) the P⁻ type substrate (base area), (619) $R_B$, (620) $I_B$, (620) $I_B$, (621) $V_d$, and (622) the drain area (collector area).

$I_d$ increases when $V_d$ is raised while continuing the avalanche.

While this current flows between the drain and substrate, the substrate potential near the source and drain rises when $I_d$ is increased since the resistance ($R_B$) of the substrate is high. When the rise of the potential exceeds ON voltage $V_{BEON}$ (about 0.6 V) between the base and the emitter, electrons are injected from the source to the substrate and reach to the drain by diffusion. That is, the bipolar operation is brought about. FIG. 8 explains this bipolar operation, by electrons.

Figure 9:
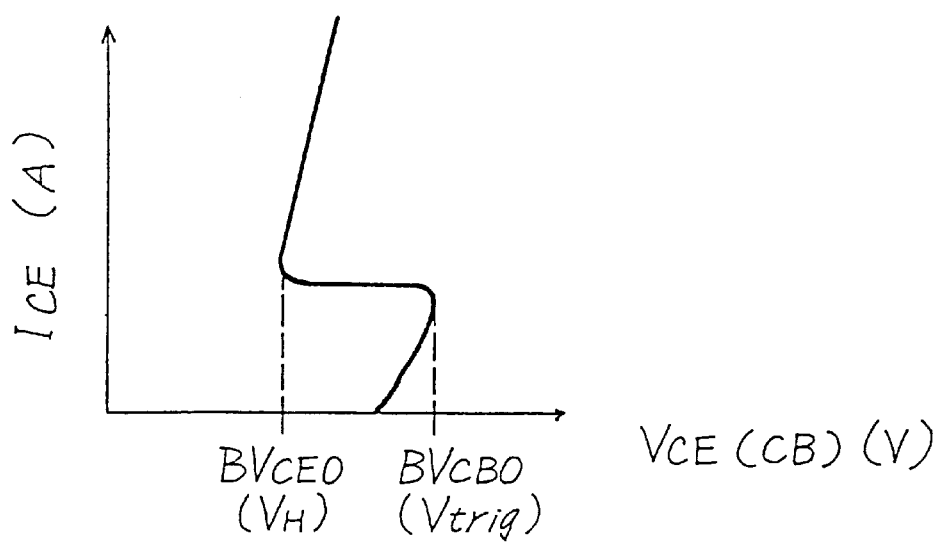
FIG. 9 is a graph showing a characteristic of a bipolar NPN transistor of the first embodiment of the present invention.

FIG. 9 is a graph showing an I-V characteristic of a bipolar NPN transistor of the first embodiment of the present invention. Assuming that $BV_{CBO}$ is a junction withstand voltage (avalanche) between collector and base when the base is earthed and that $BV_{CEO}$ is a withstand voltage between emitter and collector when the base is open and the emitter is earthed, an avalanche voltage $V_{trig}=BV_{CBO}$ and $V_H$ (Holding Voltage, Sustaining Voltage)=$BV_{CBO}$ in the bipolar.

That is, $BV_{CEO}$ is a withstand voltage in a state when the bipolar operation is most readily brought about when the substrate resistance=∞. $BV_{CBO}$ and $BV_{CEO}$ have the following relationship:

$$BV_{CEO}=BV_{CBO}(1-\alpha)^{1/n}$$

($\alpha=I_C/I_E$, $n$=const 4 to 6)

It is apparent from the above equation that $BV_{CEO}$ may be raised by raising $BV_{CBO}$ (=$V_{trig}$=surface breakdown) or by reducing $\alpha$.

Figures 10A, 10B:
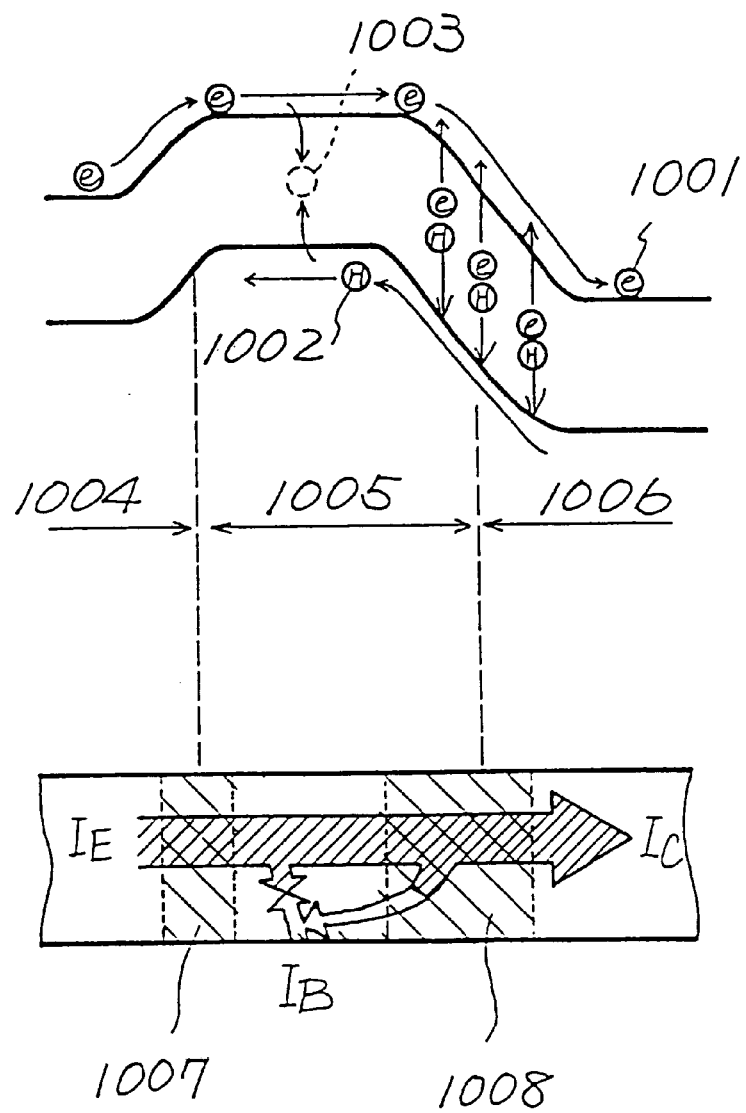
FIGS. 10A and 10B are diagrams showing the bipolar operation of the first embodiment of the present invention.

FIG. 10A is an energy band diagram showing the bipolar operation of the first embodiment of the present invention. The reference numeral (1001) denotes an electron, (1002) a positive hole, (1003) a symbol representing a recombination of electron and positive hole, (1004) the emitter area, (1005) the base area, and (1006) the collector area.

FIG. 10B is a diagram showing each current of emitter current $I_E$, base current $I_B$ and collector current $I_C$ which represent the bipolar operation of the first embodiment of the present invention. The reference numeral (1007) denotes a spatial charge layer area (depletion layer). The substrate current ($I_B$) of more than a certain value has to be supplied in order to sustain the bipolar, and it is carried out by the positive holes by pairs of electron-positive hole due to the collision and ionization of electrons entered to the depletion layer between the base (substrate) and the collector (drain). Accordingly, it is influenced by (1) how much of electrons reach from the source to the drain (i.e. $\alpha$) and by (2) a strength of the electric field between the substrate and the drain (collector) (i.e. proportional to $BV_{CBO}=V_{trig}$). Accordingly, it may be represented as $BV_{CEO}=BV_{CBO}(1-\alpha)^{1/n}$. $BV_{CBO}$ (surface breakdown) may be adjusted by adjusting the concentration of the drain or the thickness of the gate OX. $\alpha$ may be changed by the base width (=L length) and the substrate concentration. Strictly speaking, a difference of positive holes generated between the base and the collector becomes net (total) $I_B$. Furthermore, positive holes injected from the base to the emitter and electron-positive hole pairs generated between the emitter and the base have to be precisely taken into consideration.

Figure 11:
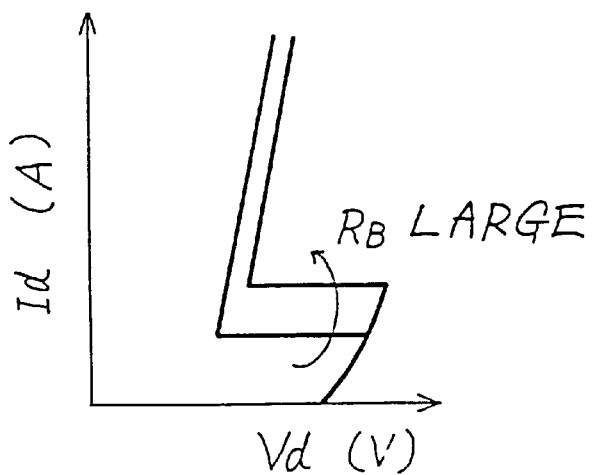
FIG. 11 is a graph showing a characteristic of the bipolar operation of the first embodiment of the present invention.

FIG. 11 is a graph of an I-V characteristic showing the bipolar operation of the first embodiment of the present invention. From the aspect of electrostatic protection, it is also effective to reduce $I_{trig}$ ($I_{BEON}$) beside lowering $V_{trig}$. This may be done by raising the substrate resistance $R_B$ in FIG. 11 (corresponds to the resistance $R_B$ in FIG. 7) since the substrate potential needs to be raised such that it generates a forward bias even if $I_B$ is small. While the substrate concentration may be changed, there is another method of separating an electrode that takes a substrate potential or a P⁺ type layer that takes a substrate electrode far from the MOS. Ultimately, a transistor which does not take the potential of the substrate is preferable (such as SOI or a floating subtrate of P-well in N-type substrate).

It should be noted that the high electric field portion which supplies $I_B$ for sustaining the bipolar operation in the off-transistor is always near the surface. It is because the gate is always fixed to GND. By the way, since $h_{FE}$ (DC current amplification factor) of the P-channel type MOS transistor is lower than that of the NMOS transistor and very few electron-positive hole pairs caused by collision and ionization are generated, it will not enter the bipolar operation.

Figure 12:
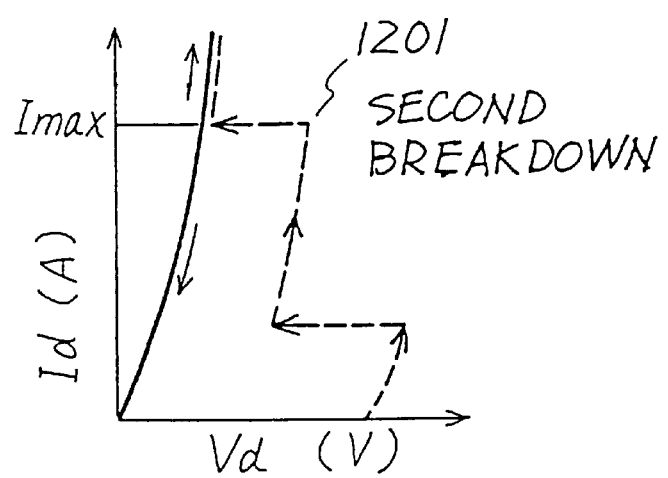
FIG. 12 is a graph showing a second breakdown of the bipolar operation of the first embodiment of the present invention.

FIG. 12 is a graph of an I-V characteristics showing a second breakdown of the bipolar operation of the first embodiment of the present invention. The reference numeral (1201) denotes a second breakdown point. When a current is increased while continuing the bipolar operation, it will soon reach to the second breakdown point and becomes low impedance. At this point of time, a junction breakdown between the drain and the substrate is brought about. That is, a part of the junction turns into a resistance and the I-V turns out to be the solid line in FIG. 12. There is a spot called a hot spot where current is concentrated where temperature exceeds a melting point (about 1,4000° C.) of Si by Joule heat and the junction melts and turns out to be a resistance. A current value $I_{max}$ just before the breakdown is correlated with an ESD immunity. $I_{max} \geq 200$ mA/transistor is a criterion for assuring the ESD immunity.

Figure 13A:
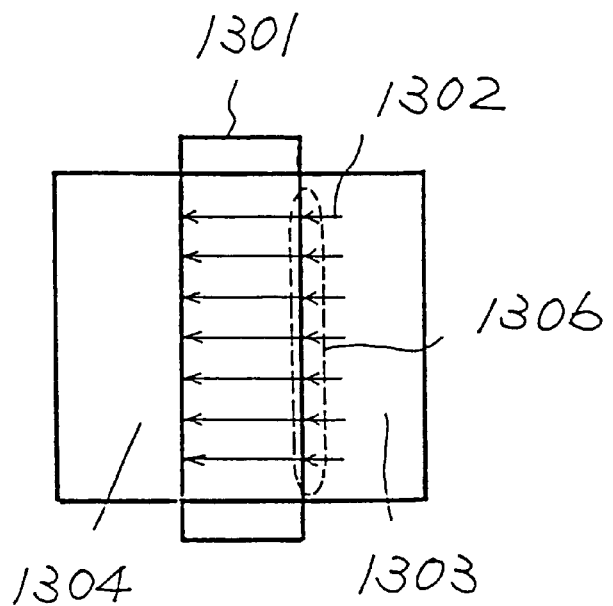
FIGS. 13A and 13B are diagrams showing currents in the bipolar operation of the first embodiment of the present invention.

FIG. 13A is a plan view showing current paths in the bipolar operation of the first embodiment of the present invention.

Figure 13B:
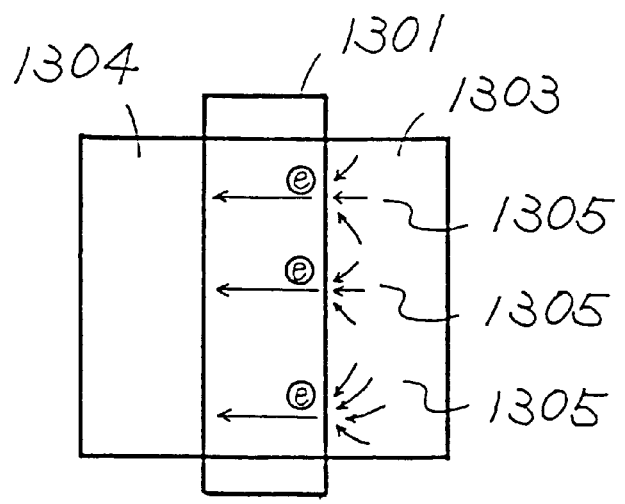

FIG. 13B is a plan view showing a concentration of currents in the bipolar operation of a second embodiment of the present invention. The reference numeral (1301) denotes an electrode, (1302) lines showing current flowing states, (1303) a drain area, (1304) a source area, (1305) a spot where currents are concentrated, and (1306) a drain edge portion of the gate electrode.

Figure 14A:
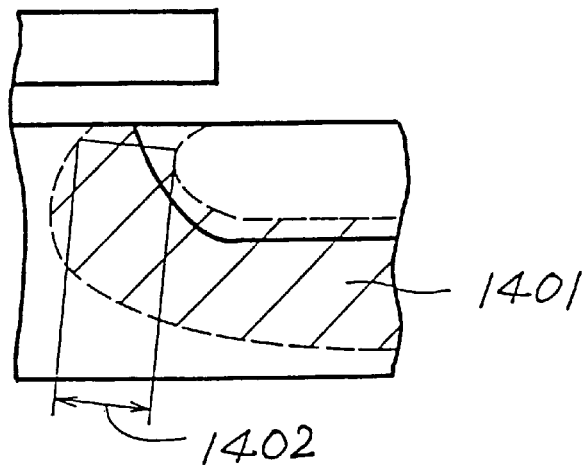
FIGS. 14A and 14B are section views of the NMOS transistor of the first embodiment of the present invention.

FIG. 14A is a first section view of the NMOS transistor for explaining the concentration of currents in the bipolar operation of the first embodiment of the present invention.

Figure 14B:
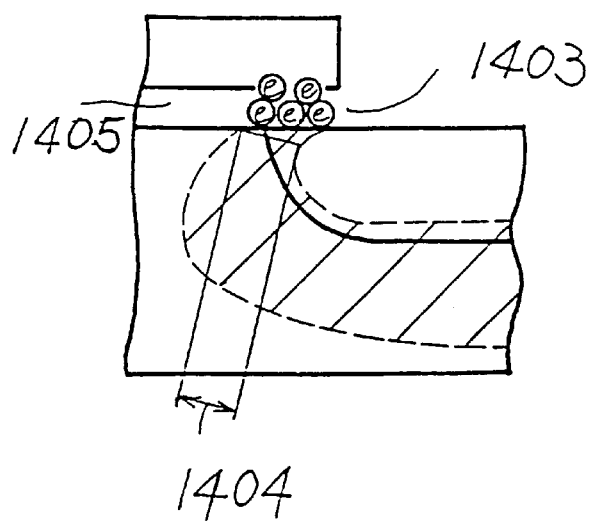

FIG. 14B is a second section view of the NMOS transistor for explaining the concentration of currents in the bipolar operation of the first embodiment of the present invention. The reference numeral (1401) denotes a depletion layer, (1402) a thickness of the depletion layer where the electric field is the strongest, (1403) trapped electrons, and (1404) a thickness of the depletion layer enhanced by the trapped electrons.

In the initial stage of bipolar operation, current flows homogeneously along the drain edge (1306 in FIG. 13) of the gate electrode (Poly Silicon) (FIG. 13A). When the current is continuously flown further, electrons are trapped within the gate insulating film $SiO_2$ 1405 by electrons which have become hot in the substrate-drain depletion layer field.

However, the way how they are trapped are not uniform and there is a localization (the spot where currents are concentrated in FIG. 13B). The electric field changes depending on the density of the trapped electrons. As shown in FIGS. 13A and 13B, the electric field is large where the density of trapped electrons is large. Then, a large number of carriers pass through because they can more readily pass through. That is, currents are concentrated. Then, the number of hot electrons there increases more, the number of trapped electrons increases, the electric field becomes stronger, the concentration of currents advances and a positive feedback is applied (FIG. 13B). As a result, the junction breakdown is brought about at the spot where the currents are concentrated (hot spot) due to the increase of temperature. Or, there is a case in which Si is cracked due to a mechanical stress caused by a large temperature gradient, leading to a breakdown.

Figure 15:
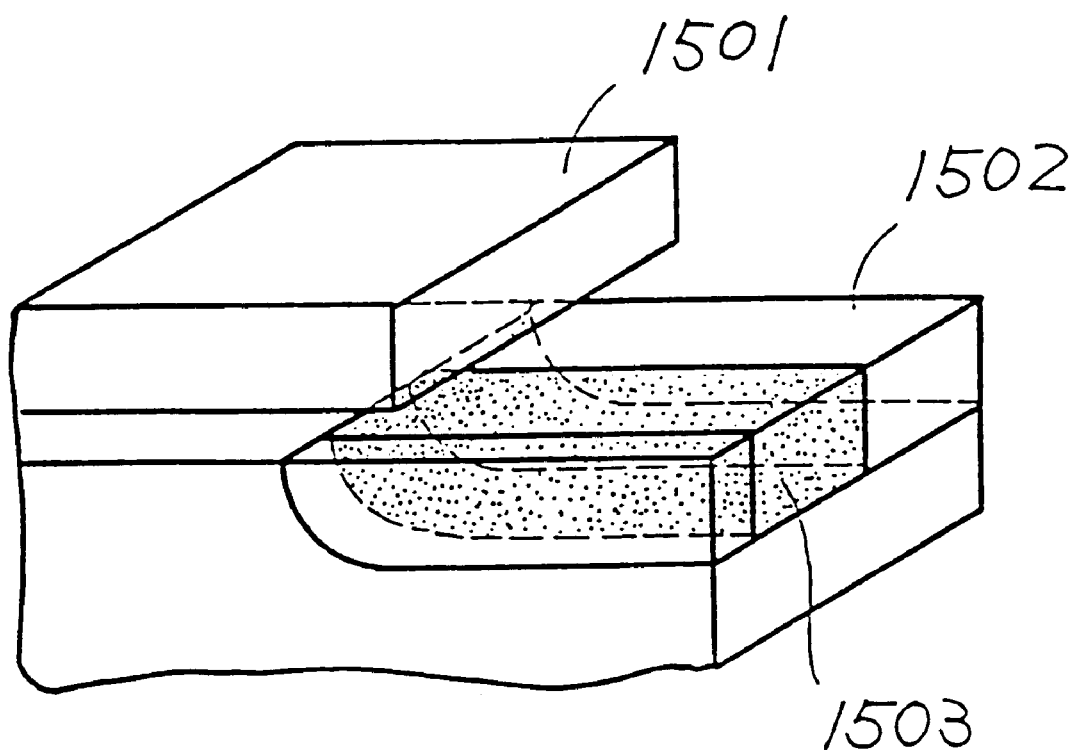
FIG. 15 is a perspective view of a MOS transistor of the first embodiment of the present invention.

FIG. 15 is a perspective view of a MOS transistor having a CONV structure for explaining Joule heat destruction of the bipolar operation of the first embodiment of the present invention. The reference numeral (1501) denotes a gate electrode, (1502) a drain area and (1503) a solid portion indicating a volume per unit transistor width (W). Wherein a reason using a description of volume instead of an area (Xj×PCS (to be described later)) is that a relation of Xj×PCS×density of an impurity becomes important. Detailed are described later.

Figure 52:
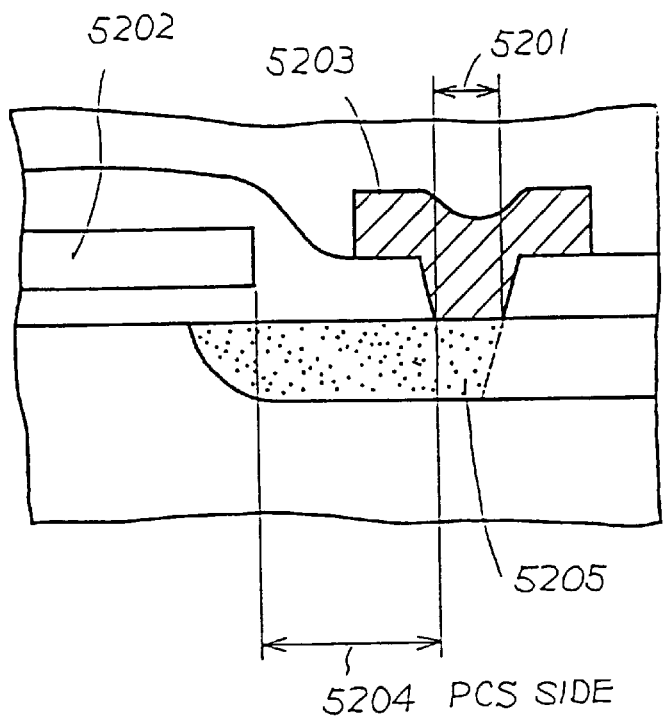
FIG. 52 is a diagrammatic drawing of a MOS transistor having a CONV structure for explaining Joule heat destruction of the bipolar operation of the first embodiment of the present invention.

FIG. 52 is a diagrammatic drawing of a MOS transistor having a normal CONV structure for explaining Joule heat destruction of the bipolar operation of the first embodiment of the present invention. A distance between an edge on the side a gate electrode of an electrode opening section (contact hole) 5201 and a Poly Si gate electrode 5202 is called as PCS 5204 (abbreviation of Poly Si gate-Contact-Space). The reference numeral (5203) is a drain electrode and (5205) is a portion indicating a volume which is equivalent to the portion 1503 in FIG. 15. ESD becomes stronger when the distance (PCS) between the edge of the gate Poly Si and the section where the drain electrode contacts. This may be explained by the volume per unit width W. When the same power is consumed, the larger the volume, the smaller the temperature rise is. Concerning to this matter, there are the theory of increased resistance or the theory of Al spike, the theory of volume of the present invention is considered to be effective from the facts that an ESD immunity will not rise even if a resistance which is equivalent to the resistance increased when the PCS is widened is added to the outside of the drain and that the ESD immunity will not rise even if a barrier metal is used. In ESD, if the breakdown is dominantly caused by the melt due to the temperature rise caused by Joule heat, the parameter of volume is important. Even if Poly Si resistance whose volume is small, though its resistance value itself is large, is added, it will be merely melt.

FIG. 16 is a graph showing a temperature and resistance value characteristic of the semiconductor for explaining the Joule heat destruction of the first embodiment of the present invention. A broken line 1601 indicates a critical temperature (Tc).

FIG. 17 is a perspective view of the MOS transistor having a thinly concentrated drain area for explaining the Joule heat destruction of the first embodiment of the present invention. The reference numeral (1701) denotes a solid portion representing a volume of an N⁻ type drain area where the concentration is low, i.e. a resistance is high, (1702) the N⁻ type drain area, and (1703) an N⁺ drain area.

While it has been explained that there are DDD and LDD structures as a structure having a low concentrated drain area as described before, changes of the surface electric field is great as compared to the CONV structure when electrons are trapped by SiO₂ in the junction of them (hereinafter called as DDD junction). The DDD junction itself is a structure which is hard to generate hot electrons. If a very few electrons are trapped, a difference of the electric field with other spots where no electrons are trapped is far greater than the CONV and as a result, a concentration of currents takes place right away. Furthermore, because the concentration is low in the DDD junction, temperatures at which resistance values drop become lower bordering Tc (FIG. 16).

Accordingly, the ESD immunity is low as compared to the CONV structure even if the size of the PCS is increased because currents concentrate on a spot and the portion 1702 breaks down concentratedly when a temperature of the spot rises and reaches to a predetermined temperature.

The impurity concentration and the critical temperature $T_c$ has a relationship represented by the following equation:

$$nd = 1.69 \times 10^{19} \exp\left[\frac{-6.4 \times 10^3}{T_c}\left(\frac{T_c}{300}\right)^{3/2}\right] \quad \text{(Equation 2)}$$

$nd$: Impurity Concentration $Tc$: Critical Temperature (°K)

The N⁻ type area where a resistance is high is small in the DDD or LDD (the area 1701 in FIG. 17). And, this portion consumes the most of power. Accordingly, a low power can readily rise the temperature, leading to the breakdown.

Figure 18:
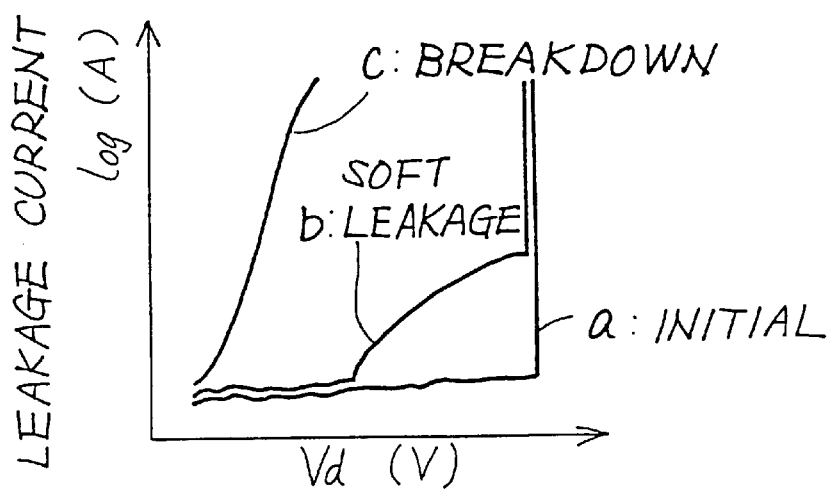
FIG. 18 is a graph showing a soft leak in the first embodiment of the present invention.

FIG. 18 is a graph showing an I-V characteristic related to a soft leak in the first embodiment of the present invention.

Figure 19:
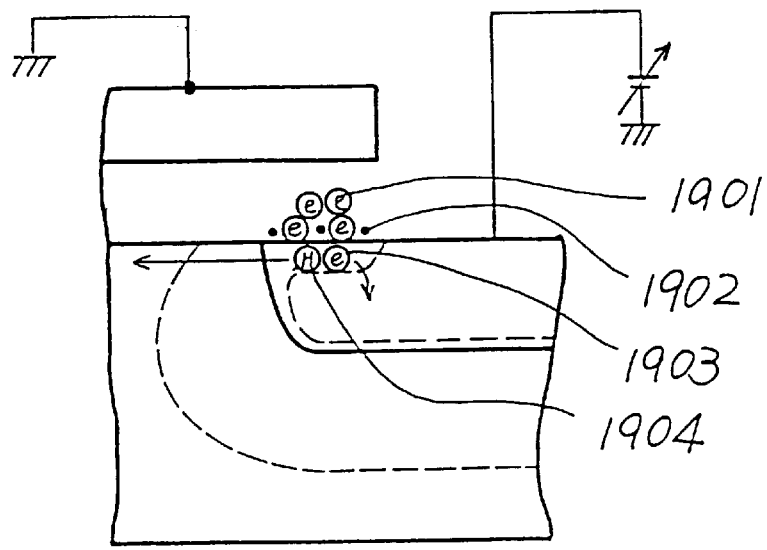
FIG. 19 is a section view of the NMOS transistor of the first embodiment of the present invention.

FIG. 19 is a section view of the NMOS transistor related to the soft leak in the first embodiment of the present invention. The reference numeral (1901) denotes symbols representing trapped electrons, (1902) symbols indicating a surface level, (1903) a symbol representing an electron in an electron-positive hole pair generated in a tunneling between bands, and (1904) a symbol representing a positive hole in the electron-positive hole pair generated in the tunneling between bands.

Figure 20:
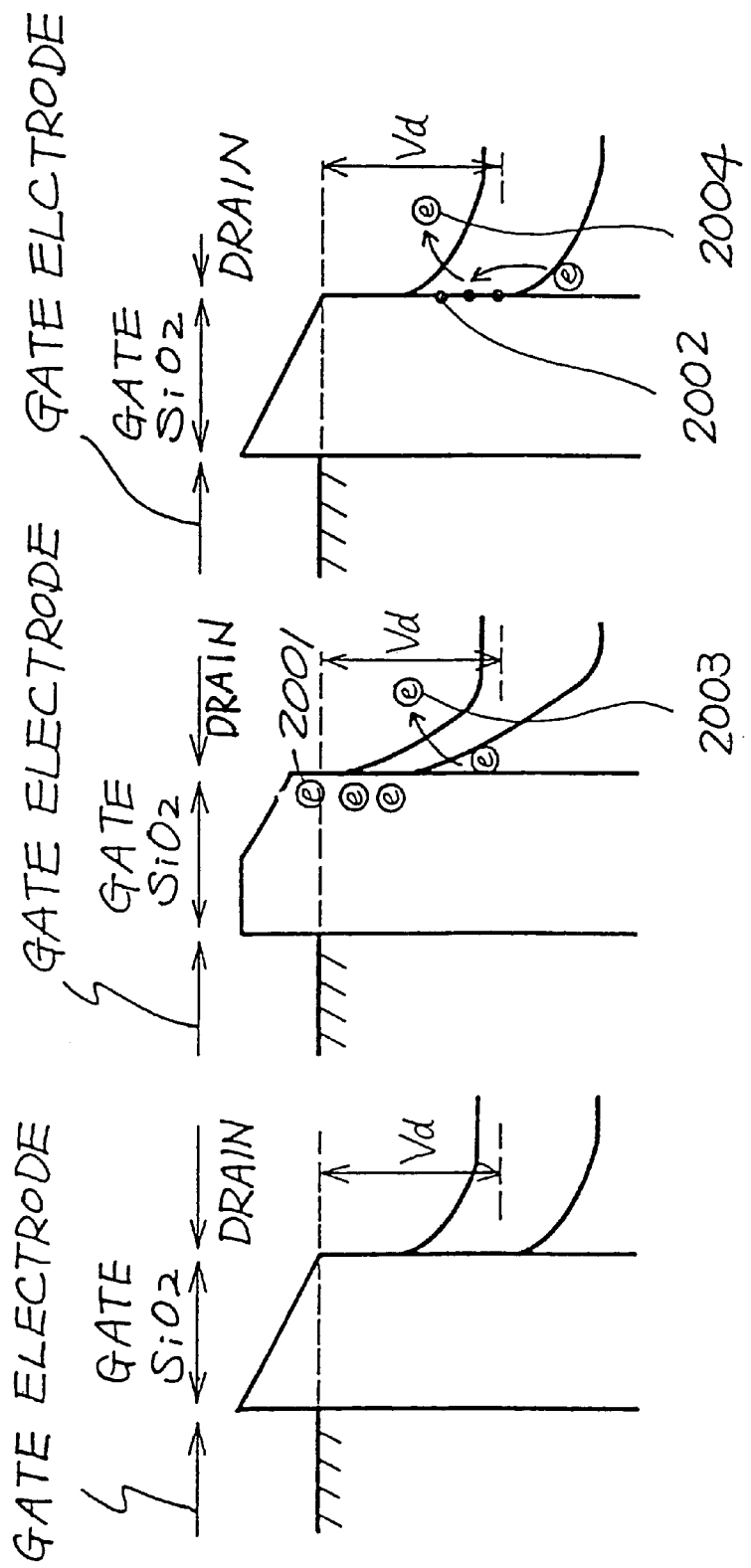
FIGS. 20A through 20C are graphs showing energy bands of the soft leak in the first embodiment of the present invention.

FIGS. 20A, 20B and 20C are energy band graphs related to the soft leak in the first embodiment of the present invention. The reference numeral (2001) denotes trapped electrons trapped by the gate insulating film, (2003 and 2004) electrons which become a current, and (2002) a surface level.

The soft leak in which a leak current of the drain increases is seen after applying a low ESD even if it does not reach to a complete junction breakdown (line b in FIG. 18). This leak is often recovered by annealing. It is considered to be caused by a tunneling current between bands (BBT) caused by the trapped electrons or a tunneling current generated via the surface level produced by the hot carriers (FIG. 20C).

FIGS. 20A, 20B and 20C are energy band diagrams directly under the overlap area of the gate and drain, wherein FIG. 20A shows the initial state, FIG. 20B shows a state in which band bending on the surface of the drain has become sharp by the electrostatic field caused by the trapped electrons and BBT current has been generated. In this state, the leak is recovered when the trapped electrons are de-trapped by annealing. FIG. 20C shows the BBT via the surface level. In either case, they are caused by the hot carriers during bipolar operation. Then, the off-transistor for protection has to be devised and process design has to be made taking also the hot carrier during ESD into consideration (low $V_{H}$, profile of drain impurities, good quality gate SiO₂, etc.).

Figure 21:
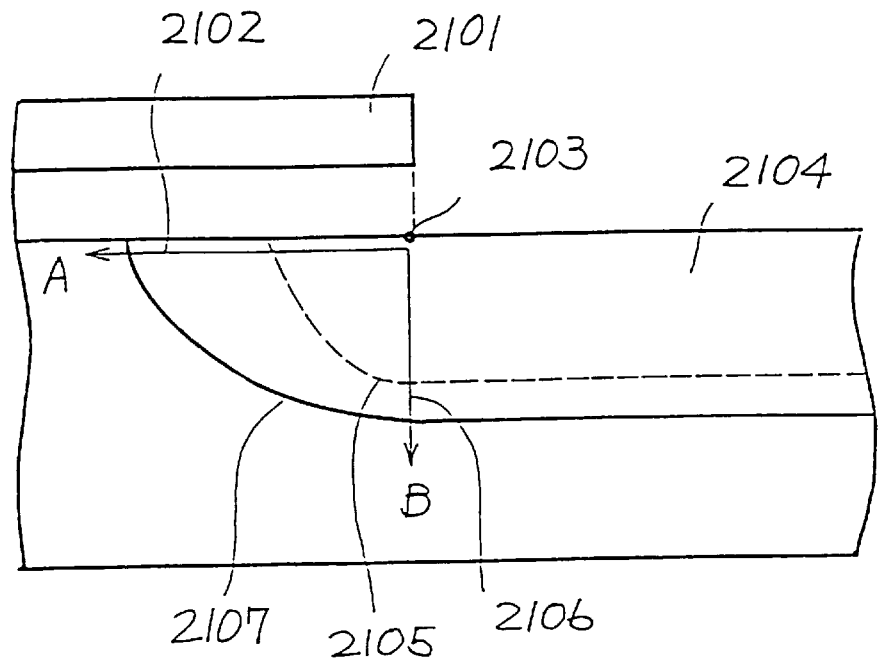
FIG. 21 is a section view of the NMOS transistor of the first embodiment of the present invention.

FIG. 21 is a section view of the NMOS transistor of the first embodiment of the present invention. The reference numeral (2101) denotes the gate electrode, (2103) a point a, (2102) an arrow indicating a direction A (surface direction), (2104) the drain area, (2105) double diffused impurity area such as the DDD and LDD (ESD is weak with this junction), (2106) an arrow indicating a direction B, and (2107) a drain impurity area of the NMOS transistor of the present invention. For convenience, it will be named as a graded junction structure.

Figure 22:
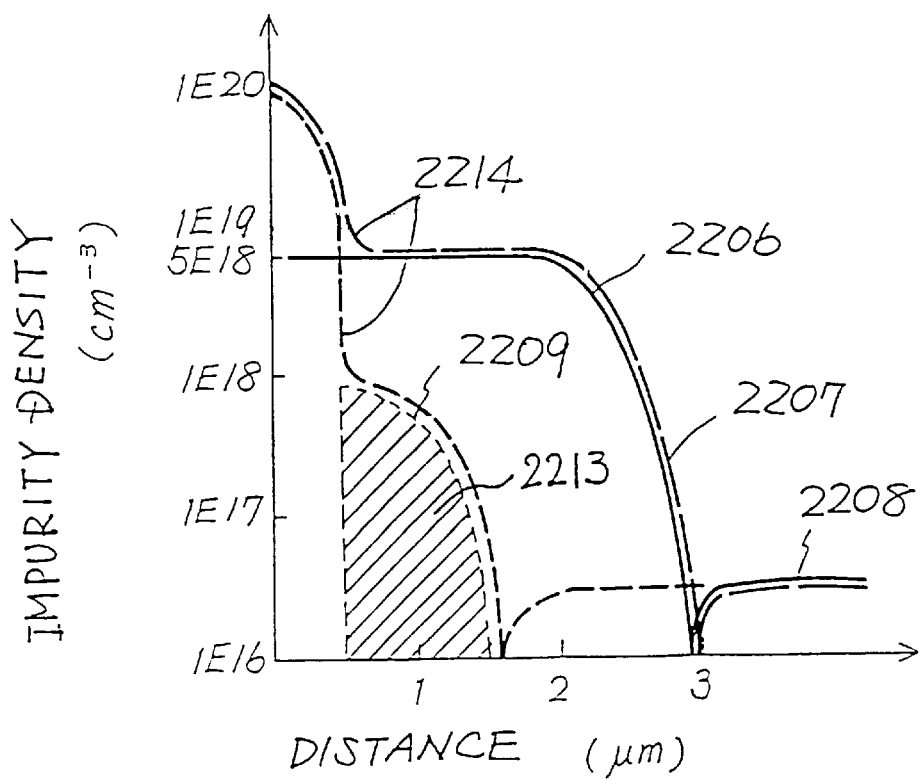
FIG. 22 is a graph showing an impurity concentration profile of the NMOS transistor of the first embodiment of the present invention.

FIG. 22 is a graph showing an impurity concentration profile of the NMOS transistor of the first embodiment of the present invention from the point a 2103 in the direction A in FIG. 21. A portion of a profile of one impurity having a kink, not monotonous change such as single Gaussian distribution or complementary error distribution, is called a kink 2214. A short broken line 2209 indicates a profile of the conventional DDD structure. The line 2209 has the kink 2214 and a portion 2213 ahead of that corresponds three-dimensionally to the portion 1701 in FIG. 17 described before. This portion is weak from the ESD. A solid line portion 2206 to ESD represents the graded structure of the first embodiment of the present invention. A long broken line 2207 represents a structure having an $N^+$ type layer (called NROM structure, described later in detail) on the surface in addition to the graded structure of the first embodiment of the present invention. The reference numeral (2208) indicates a concentration in the $P^-$ substrate (although the long broken line 2207 and the solid line 2206 are drawn separately for convenience at the portion where they are drawn very closely, they lie actually on the same line).

Figure 23:
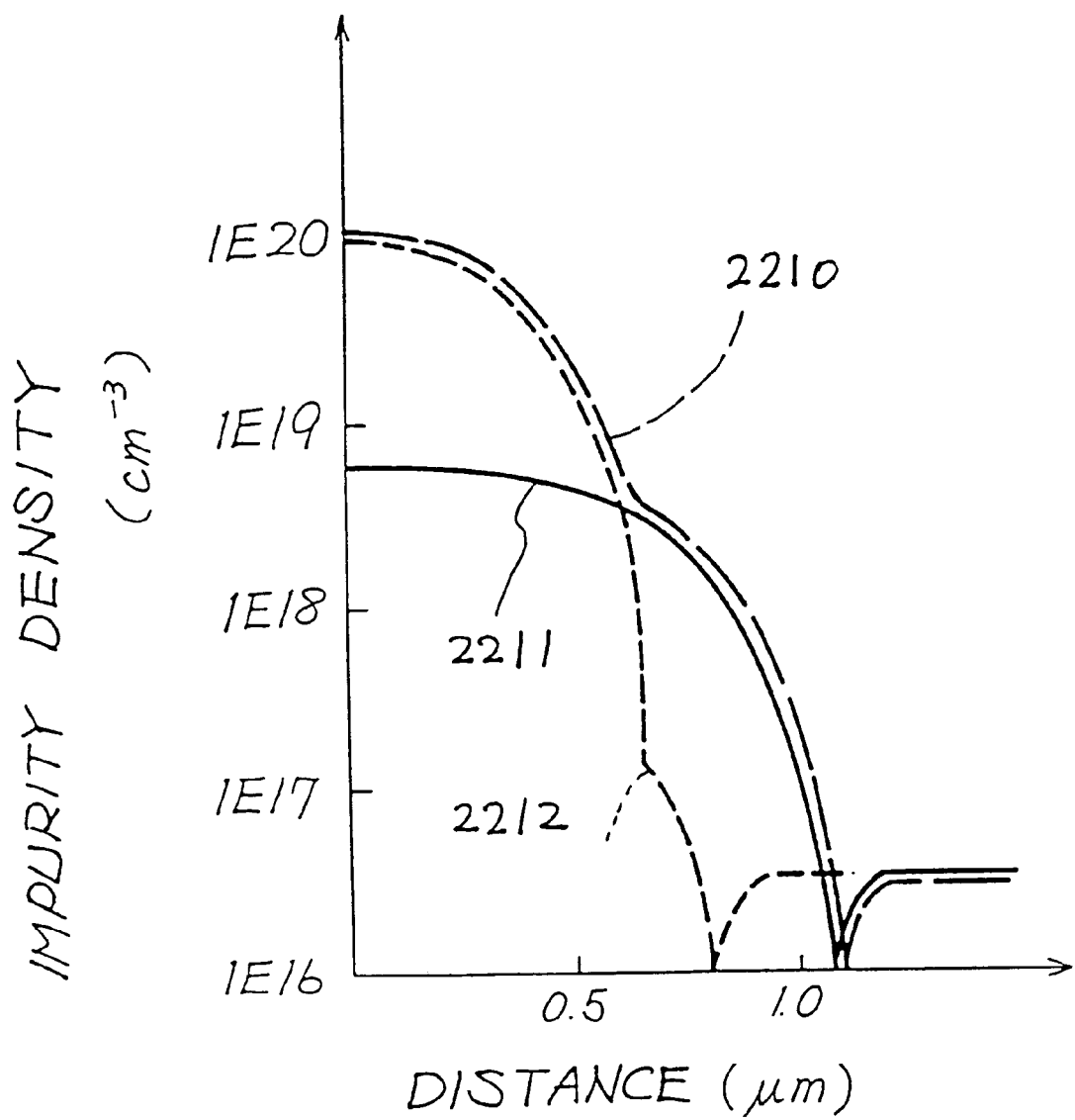
FIG. 23 is a graph showing an impurity concentration profile of the NMOS transistor of the first embodiment of the present invention.

FIG. 23 is a graph showing an impurity concentration profile of the NMOS transistor of the first embodiment of the present invention from the point a to the direction B in FIG. 21. A short broken line 2212 indicates a drain profile of the conventional DDD structure, a long broken line 2210 indicates a profile of the NROM structure of the first embodiment of the present invention and a solid line 2212 indicates a profile of the drain in the graded structure of the first embodiment of the present invention.

In order to obtain the structure shown in FIGS. 21 through 23 described above, the following manufacturing process was adopted. FIGS. 24A through 24E are section views showing the manufacturing process of the NROM transistor of the first embodiment of the present invention.

Figure 24A:
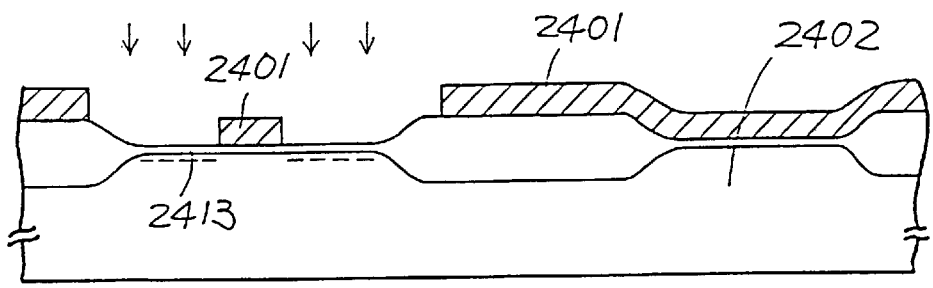
FIGS. 24A through 24E are section views showing a manufacturing process of an NROM transistor of the first embodiment of the present invention.

Ion implantation of phosphorus of 40 keV and $7 \times 14/cm^2$ of dosage is implemented on the $P^-$ type substrate 2402 (2.5 $\Omega \cdot cm$) through $SiO_2$ 2413 (350 Å). (2401) is a patterned photoresist. This phosphorus ion implantation is originally an ion implantation process for forming a relatively high dosage N type area used for forming a capacitor component created within N-well as another element on the IC. Because such process may be used in combination, the area may be formed without increasing processing steps. According to custom, the process is called as an NROM ion implantation taking the name of the process and the NMOS transistor of the first embodiment of the present invention formed thereby is called as an NROM transistor within the present invention. An NROM capacitor is omitted in FIG. 24 (FIG. 24A).

Figure 24B:
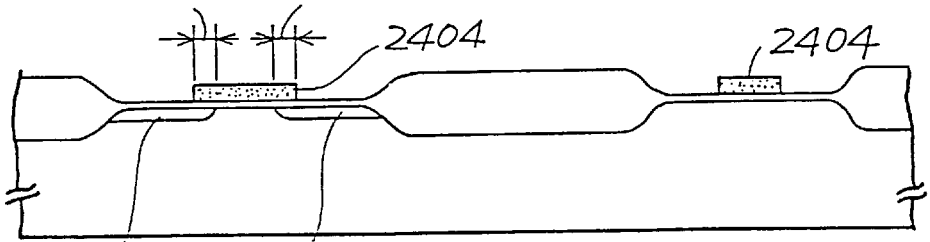

After that, a section structure as shown in FIG. 24B is obtained after annealing for 30 minutes in $N_2$ at 900° C. through a process for forming the gate $SiO_2$. It is also effective to implement a speed up oxidation in thickening the NROM transistor than the internal transistor by gate Tox as described before, though it depends on the NROM ion implantation dosage, depending on the annealing at 900° C. and gate oxidation condition. Off course, it is carried out corresponding to a processability in the combination of $V_{trig}$ and $V_{ddmax}$. A DAA structure is favorable for the NROM transistor when the speed up oxidation is implemented.

Thinning at the LOCOS edge will be now explained.

Figure 53:
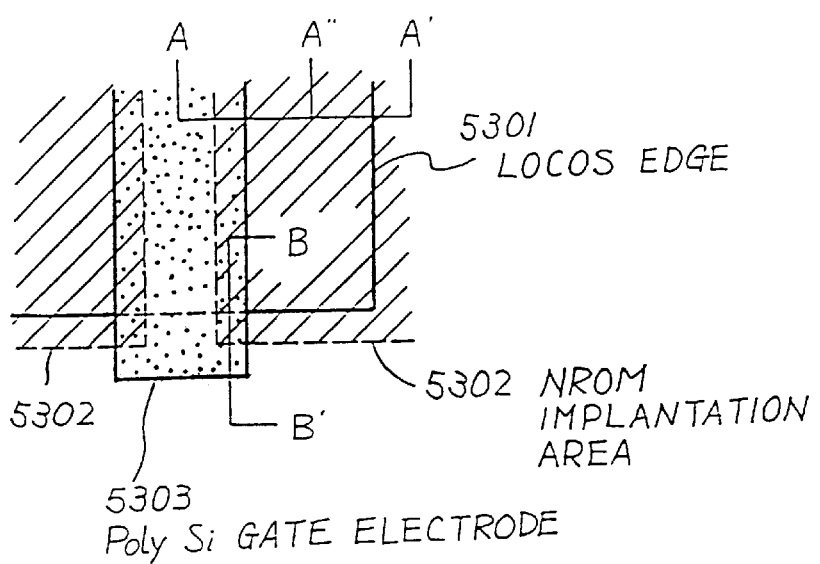
FIG. 53 is a diagrammatic drawing showing a flat portion of the NROM transistor of the first embodiment of the present invention.

FIG. 53 is a diagrammatic drawing showing a flat portion of the NROM transistor of the first embodiment of the present invention. The reference numeral (5303) denotes the poly Si gate electrode and a hatched portion 5302 is a resist mask opening section when NROM ion is doped. No ion is doped to the outside of the LOCOS edge 5301 (on the side of a thick LOCOS oxide film 5314).

Figure 54A:
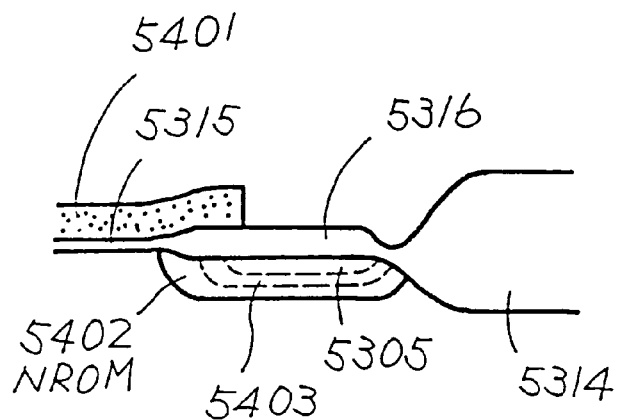
FIG. 54a is a diagrammatic drawing showing a section along a line A-A' in FIG. 53.
Figure 54B:
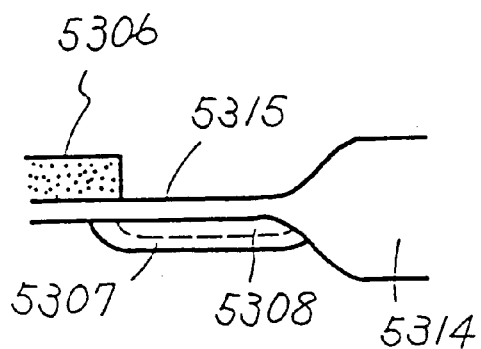
Figure 54C:
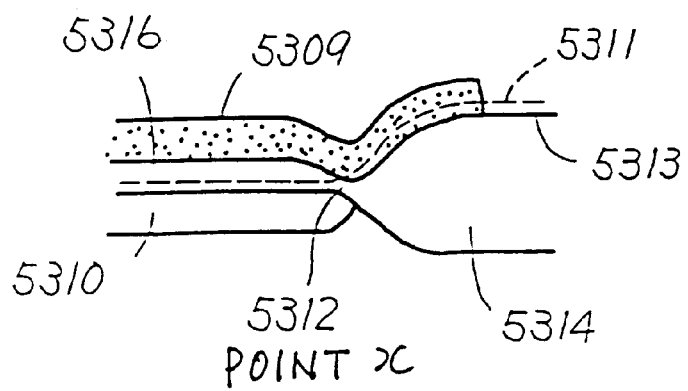

Section views along lines A-A"-A' and B-B' in FIG. 53 are shown in FIGS. 54A, 54B and 54C.

FIG. 54A is a diagrammatic drawing showing the section along the line A-A' in FIG. 53 and FIG. 54B is a diagrammatic drawing showing the section of the similar portion of the NMOS transistor in which no NROM ion is doped. While ion is doped through 350 Å of $SiO2$ (oxide film) as described before when phosphorus ion is doped to form an NROM layer, this $SiO_2$ is called as a light oxide film etc. and is once removed before the gate is oxidized. In the case of process of ion implantation, annealing at 900° C. in $N_2$, removal of the light $SiO_2$ and oxidation of the gate like the present embodiment, almost no speed up oxidation (oxide film on the Si surface in which high concentration phosphorus is doped is formed to be thicker than the portion not doped) is implemented. It is because the impurity concentration on the surface is once diffused by the $N_2$ annealing and is reduced less than the impurity concentration that brings about the speed up oxidation.

However, when a process of ion implantation, removal of light $SiO_2$ and oxidation of the gate is adopted, $SiO_2$ 5316 on the area where an NROM diffusion layer 5402 is formed becomes thicker than a gate oxide film 5315 at the gate area where no ion is doped. Thereby, the gate oxide film at the edge of the drain area of a Poly Si gate electrode 5401 becomes thick and is effective in raising $V_{trig}$=BVs (surface breakdown). However, in the case when the transistor is used as a protection element and when an element to be protected is a similar NMOS transistor like the present embodiment, it is needless to say that it is set so that it will not exceed $V_{trig}$ of that NMOS transistor. When it is not necessary to implement to that extent like the present embodiment, no speed up oxidation is implemented, so that annealing at 900° C. in $N_2$ (non-oxidant) may be included as described before. Furthermore, when it is desired to raise $V_{trig}$ as described before (when it is desired to raise the ESD immunity at any rate not from the combination with the element which should protect the NROM transistor), the B-B' structure in FIG. 53 has to be noticed beside the A-A' section above.

FIG. 54C is a diagrammatic drawing showing the section along the line B-B' in FIG. 53. The surface of $SiO_2$ when NROM ion is doped is shown by a broken line 5311 in FIG. 54C. Gate oxidation is implemented after removing the light $SiO_2$ (350 Å+$\alpha$) once to obtain a $SiO_2$ surface 5313 after the gate oxidation. A point x 5312 corresponds to a tail portion (bird beak) of a thick oxide film 5314 which is LOCOS when NROM ion is doped and is a area where no NROM ion is doped. Accordingly, no speed up oxidation is implemented at this portion and it does not become thick (same thickness with normal gate oxide film). However, an NROM diffusion layer 5310 extends under the point x 5312 through annealing and others for forming an $N^-$ type layer 5403 and a Poly Si gate electrode 5309 comes to face the drain area. This is called the thinning at the LOCOS edge. The speed up oxidation becomes meaningless if a portion which is partially thin is produced as such. Then, when the speed up oxidation is implemented, it is advantageous to adopt, together, the DAA structure in which a drain 2911 is continuously surrounded by a gate 2910. Thereby, the drain area is structured all by the section A-A", allowing to eliminate such thin portion as the point x and to solve the problem.

The reference numeral (5306) denotes the Poly Si gate electrode, (5305) an N⁺ type layer, (5307) an N⁻ type layer, and (5308) an N⁺ type layer.

Figure 24C:
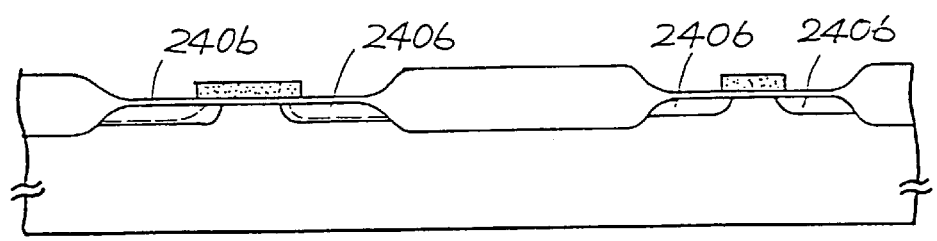

Thus, thinning at the LOCOS edge is not generated in the DAA structure. The reference numeral (2405) denotes an NROM layer extended by the annealing at 900° C. and a size 2403 between the gate Poly Si 2404 and an NROM mask is 2 μm (not taking a portion extended by diffusion into consideration). After that, one in FIG. 24C is obtained through a step of introducing 80 keV and 1E14/cm² of phosphorus for N⁻ type drain for DDD and an annealing step within N₂ for 75 minutes. (2406) is an N⁻ type drain area of DDD type.

Figure 24D:
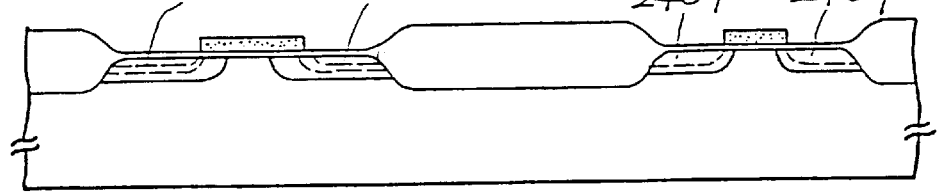
Figure 24E:
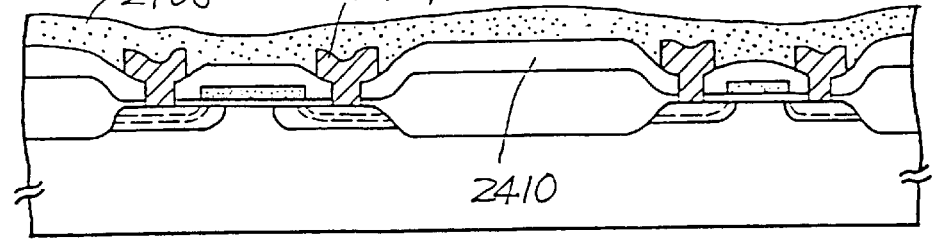

After that, one in FIG. 24D is obtained through a step of introducing 80 keV and 5 E 15/cm² of As (arsenic) for the N⁺ type drain area (a dosage of more than 1 E 15/cm² is adequate as the N⁺ type layer as the source and drain area) and an annealing step at 950° C. for 45 minutes. (2407) is the drain N⁺ type layer. After that, one in FIG. 24E is obtained through steps of forming P⁺ type layer, intermediate insulating film 2410, electrode 2409 and protection film 2408, etc. (not shown). The reference numeral (2411) denotes the NROM transistor for protection of the first embodiment of the present invention and (2412) denotes a DDD type NMOS transistor for the internal circuit.

Figure 25:
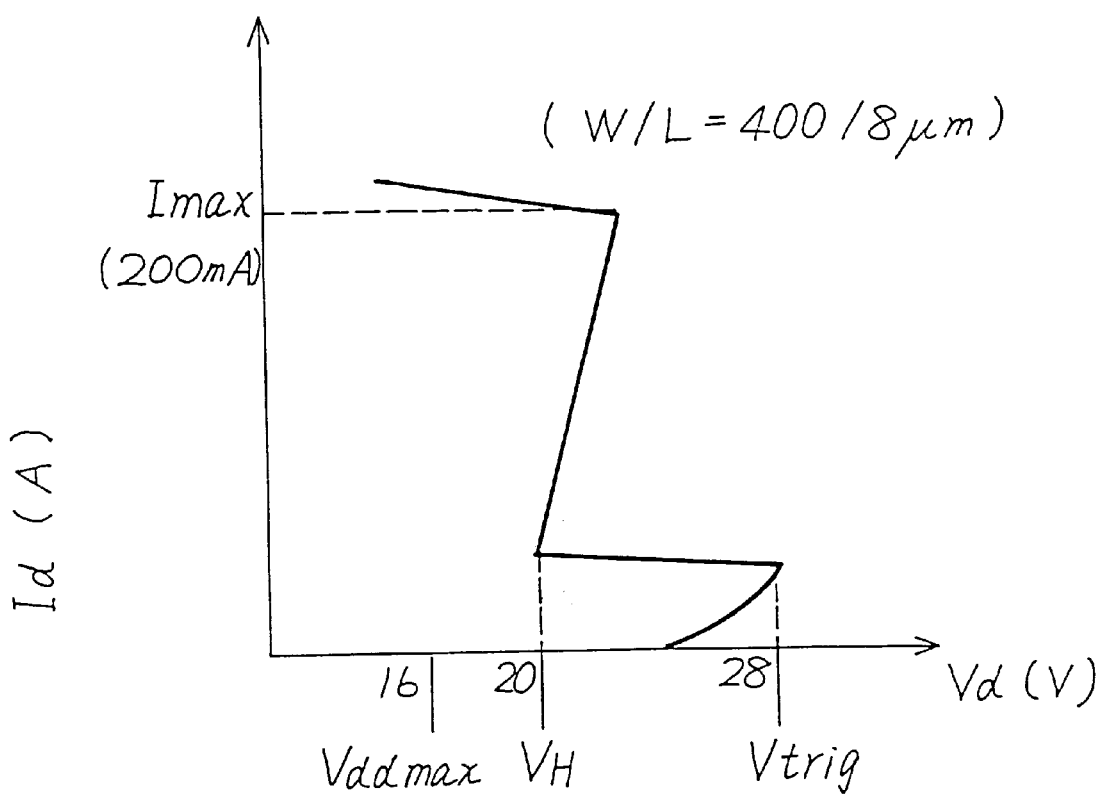
FIG. 25 is a graph showing a characteristic of the NROM transistor of the first embodiment of the present invention.

FIG. 25 is a graph showing an I-V characteristic of an off-transistor of the NROM transistor of the first embodiment of the present invention. It is the I-V characteristic obtained by the manufacturing process explained in FIG. 24. Although $V_{trig}$ is slightly high from the aspect of protection, it is good since $V_H > V_{ddmax}$ (this case will be explained continuously with a device of 16 V of $V_{ddmax}$). The junction is fully deep since the dosage of NROM is so high as 7 E 14/cm² and heat treatment is significant. Furthermore, since it is backed by N⁻ and N⁺, it may be said that it has turned out to be a fine graded junction (FIGS. 22 and 23). Such NROM transistor may be employed as all of NMOSs within an IC as a matter of course. FIG. 26 is a graph showing $V_{trig}$ and $I_{max}$ to L length of the NROM transistor of the first embodiment of the present invention. Similarly to FIG. 25, it is data per L length of the transistor obtained by the process shown in FIG. 24. It is seen that there is a solution as the IC of 16 V of $V_{ddmax}$ at L=8 μm.

ESD immunity was measured by using the NROM transistor thus obtained as a protection element. It will be explained below.

Figure 27:
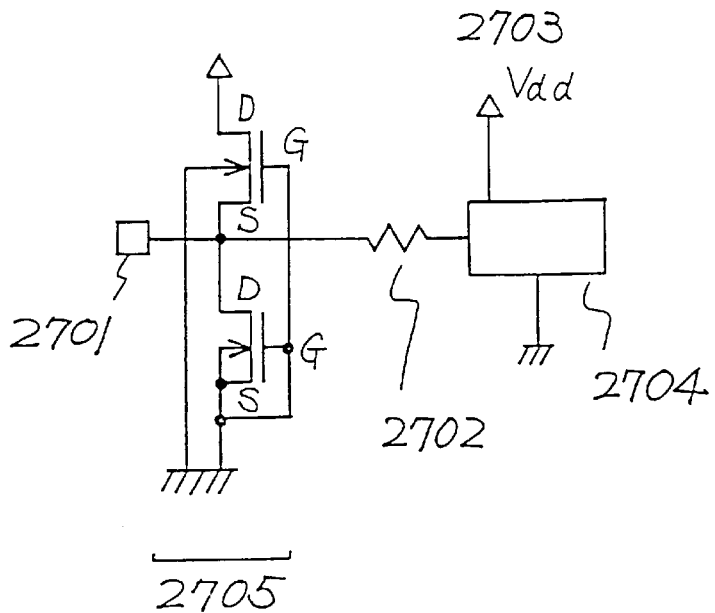
FIG. 27 is a block diagram showing a circuit of the NROM transistor of the first embodiment of the present invention.

FIG. 27 is a block diagram showing a circuit using the NROM transistor of the first embodiment of the present invention as the protection element. The reference numeral (2701) denotes a terminal, (2702) a series resistance using the Poly Si (studied with and without it), (2703) $V_{dd}$, (2704) a circuit to be protected, and (2705) an off-transistor which is the off-connected NROM transistor (double source type as shown in FIGS. 28 and 29) of the first embodiment of the present invention.

Figure 28:
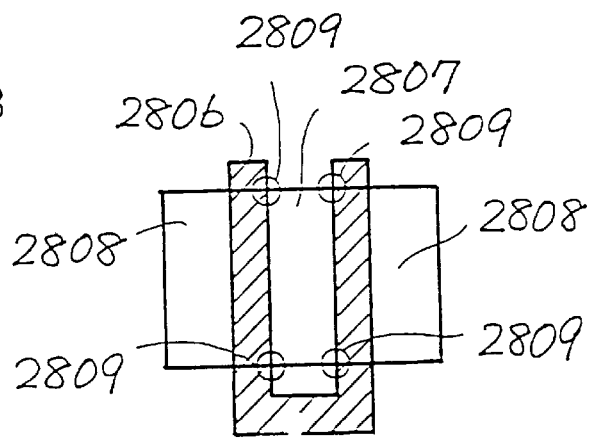
FIG. 28 is a plan view of the NROM transistor of the first embodiment of the present invention.
Figure 29:
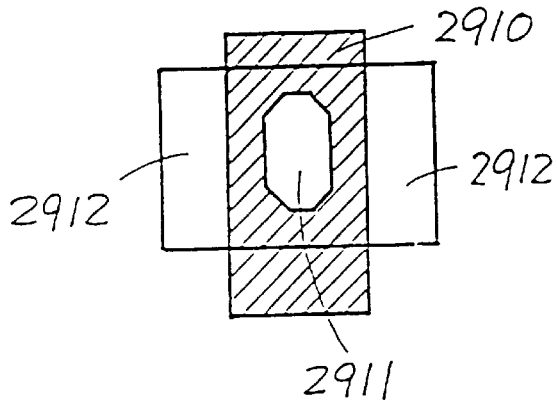
FIG. 29 is a plan view of the NROM transistor of the first embodiment of the present invention.

FIGS. 28 and 29 are plan views showing the gate electrode and the source and drain areas of the NROM transistor of the first embodiment of the present invention. FIG. 28 shows a cross type which includes a gate Poly Si 2806, drain areas 2808 and points 2809 which cross with a boundary of a field area (boundary is concentrated here) and FIG. 29 shows a type (called as Drain All Around (DAA) type) which has no point which crosses. The reference numeral (2911) denotes the gate Poly Si and (2912) the drain area.

Figure 30:
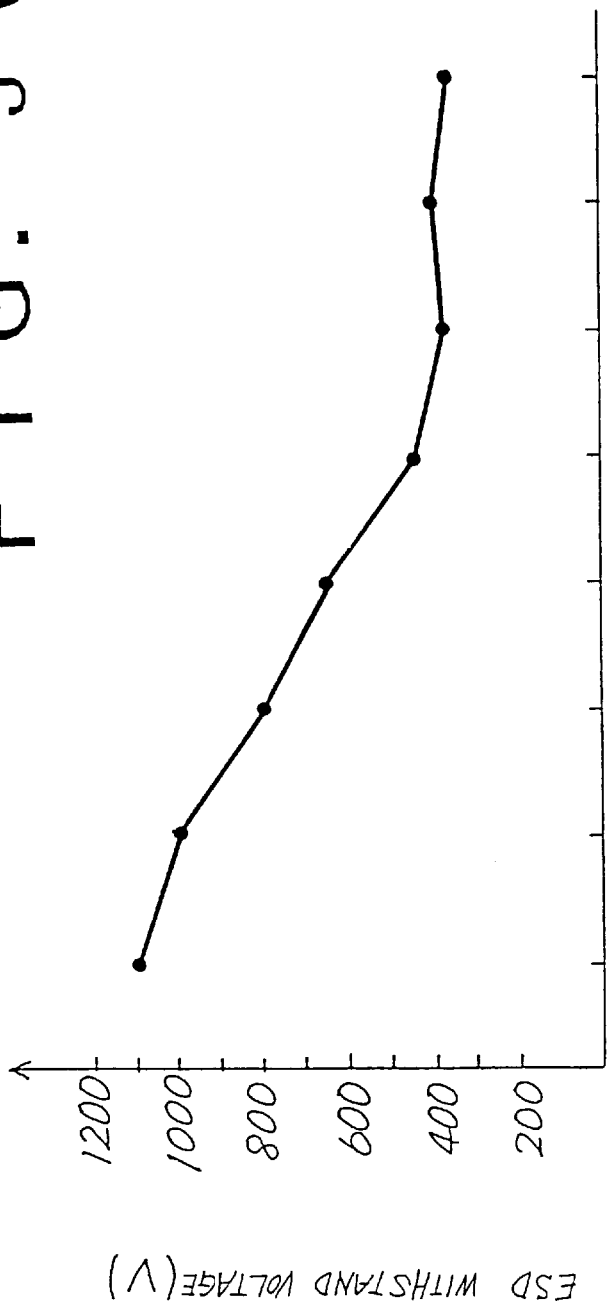
FIG. 30 is a graph showing a characteristic of the NROM transistor of the first embodiment of the present invention.

FIG. 30 is a graph and table showing the results of measurement of the ESD immunity carried out using the NROM transistor of the first embodiment of the present invention as the protection element. It is strongest in the cross type with 800 Ω of Poly resistance when L=8 μm and there is 1100 V of ESD immunity in a machine model. However, even one which has no Poly resistance (0 Ω), in the DAA type and L=10 μm is about 400 V which is in a level which presents no problem at all as the general specification. It shows how the NROM type is effective (it is often several tens V in the DDD type). While it seems that the results of the DAA type are weaker more or less, it changes depending on a device to be protected (mutual relationship of $V_{trig}$). It is because the ESD immunity of the NROM itself is stronger in the DAA type.

Figure 31:
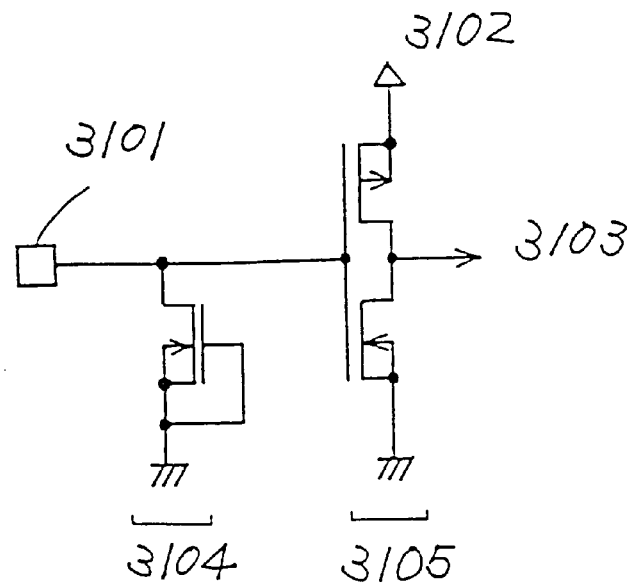
FIG. 31 is a circuit diagram for measuring a characteristic of the NROM transistor of the first embodiment of the present invention.

FIG. 31 is a block diagram of a circuit for explaining the results of measurement of the ESD immunity carried out using the NROM transistor of the first embodiment of the present invention as the protection element. The reference numeral (3101) denotes an input terminal, (3104) an NROM off-transistor of the first embodiment of the present invention, (3102) $V_{dd}$, (3103) a state connected further to an internal circuit, and (3105) a CMOS inverter in the initial sate of the internal circuit.

Figure 32:
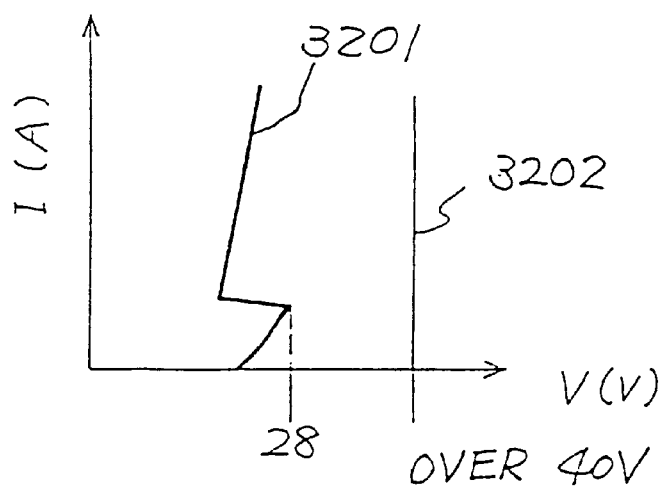
FIG. 32 is a graph showing a characteristic of the NROM transistor of the first embodiment of the present invention.

FIG. 32 is a graph showing an I-V characteristic of the NROM transistor for explaining the results of measurement of the ESD immunity carried out using the NROM transistor of the first embodiment of the present invention as the protection element. The reference numeral (3201) denotes I-V of the NROM off-transistor and (3202) I-V of the gate SiO₂. This time, gate $T_{OX}$=500 Å and when 8 MV/cm is $BV_{OX}$, $BV_{OX}$=40 V. $V_{trig}$ of the NROM drain off-transistor is is 28 V and all pass through the NROM during surge (FIGS. 31 and 32). Accordingly, there is no problem at all if the off-transistor is strong against ESD. While (+) in $V_{ss}$ standard is applied in the above case, the off-transistor takes a forward direction when (−) in $V_{ss}$ standard is applied, so that there is also no problem. Generally, since the input protection by the protection of the off-transistor is:

$$BV_{OX}=0.8(3\times V_{ddmax})$$

[$BV_{OX}$ takes three times of margin of $V_{ddmax}$]

$$V_{trig}=V_{dd}+4 \text{ to } 10 \text{ V,}$$

although it may be dangerous when $$BV_{OX} \leq 0.8\ V_{trig}-5.6\text{ V,}$$

supposing that $$V_{trig}=V_{dd}+10 \text{ V,}$$

such relation is practically impossible. Hence, it presents no problem in terms of the protection. It is then sufficient if the off-transistor itself is resistant to ESD and $V_H$ is more than $V_{ddmax}$.

FIGS. 55A through 55E are section views showing manufacturing processes of the NROM transistor, in the processing order, which is one application example of the first embodiment of the present invention.

Figure 55A:
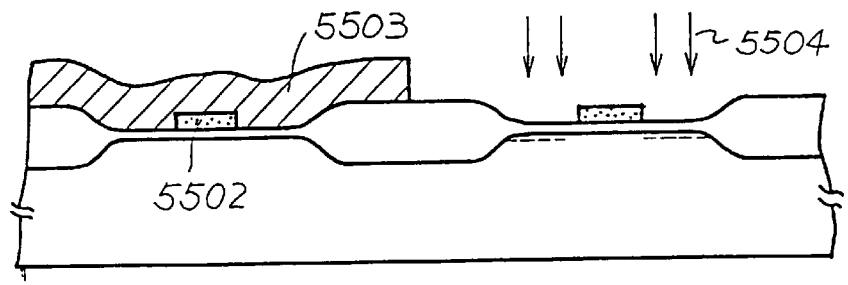
FIGS. 55A through 55E are section views showing a manufacturing process of the NROM transistor, in the processing order, which is one application example of the first embodiment of the present invention.
Figure 55B:
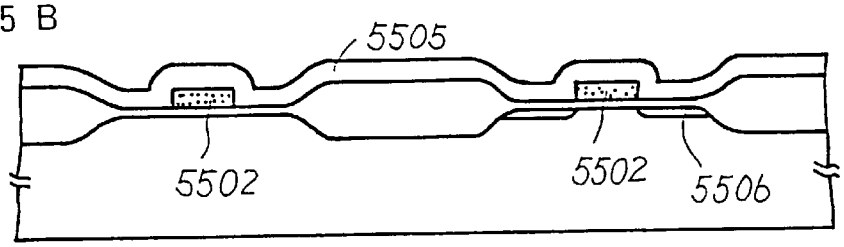

It shows a part of the process for manufacturing a spacer type LDD type NMOS transistor 5502 and an NROM transistor 5501 which is an application example of the present invention on the same substrate. While covering an NROM transistor section by a photoresist 5503, ion implantation 5504 of 1 E 14/cm² of phosphorus for forming a LDD N⁻ type layer is implemented above a Poly Si gate electrode already formed by pattering (FIG. 55A). At this time, As (arsenic) may be used instead of phosphorus. The description of acceleration energy of the ion implantation is omitted to simplify it in the present application example. It is because the essential part illustrated in the present application example is common to so-called highly integrated refined products whose gate $T_{OX}$ is less than 200 Å for example (ICs called as VLSI and ULSI and functionally logical processors such as CPU and MPU, memories such as DRAM and SRAM and logical ICS such as ASIC and gate array for various uses. Those in which the reduction of line width in the lateral direction, i.e. scaling, significantly contributes to the integration thereof are called as refined products. Contrary to that, those such as a power supply IC and driver IC in which scaling does not contribute so much are called high withstanding products for convenience as described later) and to ICs (power supply IC and driver IC) in the class in which $T_{OX}$ is more than 500 Å and $V_{ddmax}$ is more than 12 V or more than 18 V or 24 V (they are called as the high withstanding products discriminating from the refined products [$V_{ddmax}$ is less than 5 V, 3V or 1.5 V] for the convenience in the present invention). That is, the ion implantation energy may be set in accordance to a thickness of the gate film, so that $SiO_2$ (NSG: Non-doped Silicated Glass) 5505 is formed to about 4000 Å by CVD (chemical vapor deposition method) after that (FIG. 55B).

Annealing for activating ion injected phosphorus (or As) to form an N⁻ type layer 5506 may be implemented before forming NSG or after depositing the NSG combining with densification. While the annealing is implemented at a temperature of 1,000° C. or 1,100° C., it may be adequately set as necessary in the end since the diffusion depth (Xj) to be extended is different with the refined products and the high withstanding products as described before.

Here, notations such as N⁺ (plus), N± (plus minus) and N⁻ (minus) (or P⁺, P±, P⁻) noted in the present invention will be explained. Plus and minus here represent a degree of impurity concentration and are used to specify a difference when there is a plurality of types of concentration areas having the same conductive type within one semiconductor (including which is dense and which is thin). However, there is a criterion of approximate concentration (not strict).

The same applies also to P and N. N⁻ (minus) specifies a range from about $1.45 \times 10^{10}$ (intrinsic) to $1 \times 10^{16}$ cm⁻³, N± (plus minus) specifies a range from about $1 \times 10^{16}$ to $1 \times 10^{18}$ cm⁻³ (when N± does not appear in the explanation like the present invention, N± may be expressed as N⁻. It is sufficient if it merely indicates a difference of concentrations of a plurality of areas) and N+specifies a range from about $1 \times 10^{18}$ to $1 \times 10^{21}$ cm⁻³ (there is a case when it is more than that. In such a case, it is often represented as N⁺⁺. Similarly to that, there is N⁻⁻ when a well and a substrate is discriminated). Further, when a solid line and a broken line are used in indicating a boundary between areas within those impurities in section views, the broken line will be used when the conductive type is the same and the concentration is different and the solid line will be used when the conductive types are different (i.e. it indicates a PN junction interface).

Figure 55C:
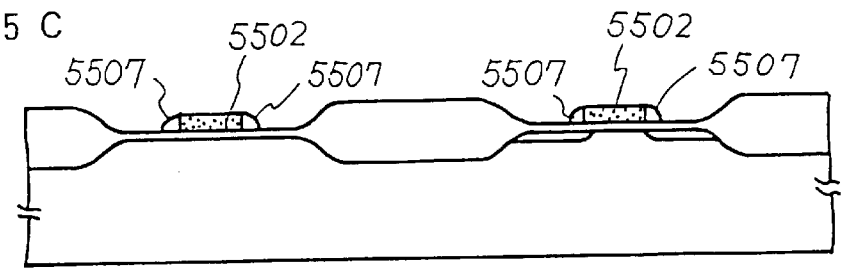
Figure 55D:
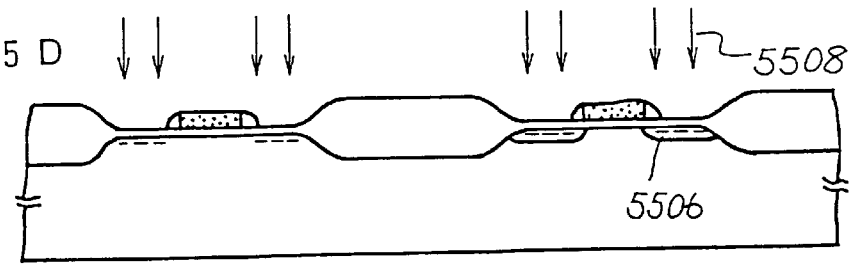

Then, an NSG spacer 5507 may be formed on the side wall of the Poly Si gate electrode 5503 by etching the whole surface of the NSG by anisotropic etching such as RIE (Reactive Ion Etching) (FIG. 55C). After that, ion implantation 5508 (phosphorus or As, about 5 E 15 cm⁻²) for forming an N⁺ type layer of the drain is implemented. At this time, it is implemented so that it also enters the NROM transistor of the present application example (FIG. 55D).

Figure 55E:
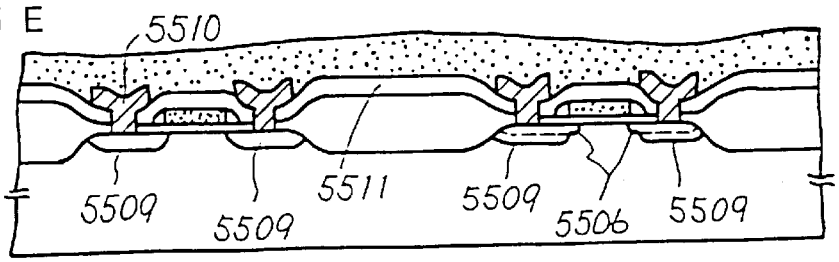

After that, the IC is completed going through steps of annealing for forming an N⁺ type layer 5509, forming an intermediate insulating layer 5511, forming an electrode 5510 and forming a surface protection film 5512 (FIG. 55E).

The structure of the NROM transistor prepared as described above and its ESD immunity will be explained below. (Although the NMOS transistor of the present invention is called generically as "NROM transistor of the present invention" and the transistor in the first embodiment may be called as the NROM transistor since it has a process of introducing phosphorus in the same time with the NROM process in the strict sense, the NSG spacer type which is an application example thereof is called as "offset CONV" when it is discriminated from the NROM transistor in the first embodiment since there is no NROM process for it as described before. However, when the "NROM transistor of the present invention" is simply used hereinafter, it is the generic name. It is because ion is doped separating (offsetting) a predetermined distance (about a thickness of NSG) from the Poly Si gate electrode because it is implemented in the state in which the NSG spacer is attached when ion is doped to the N⁺ type layer.)

Figure 56:
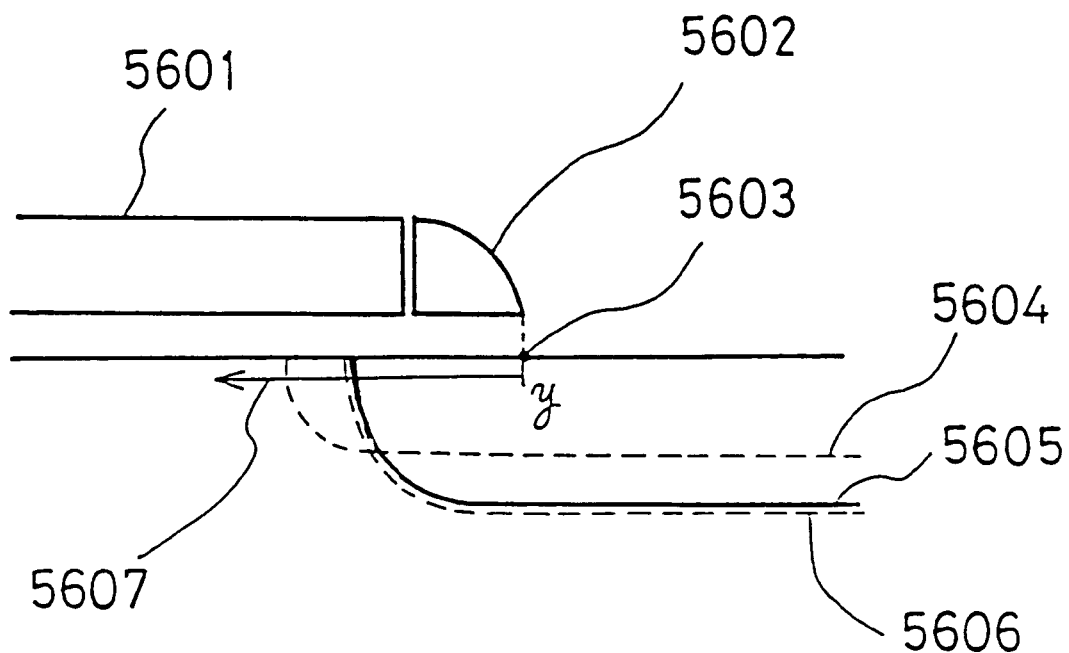
FIG. 56 is a section view showing the NROM transistor (offset CONV) which is an application example of the first embodiment of the present invention.

FIG. 56 is a section view showing the NROM transistor (offset CONV) which is an application example of the first embodiment of the present invention. The reference numeral (5601) denotes a Poly Si gate electrode, and (5602) an NSG spacer. An arrow 5607 indicates an orientation from a portion y 5603 directly under the NSG spacer to the direction A, A solid line 5605 indicates a drain area of an N⁺ type layer of the offset CONV of the present invention, A short broken line 5604 indicates a drain area of N⁻ type layer of a LDD transistor. A long broken line 5606 indicates a drain area of N⁺ type layer of the LDD transistor.

Figure 57:
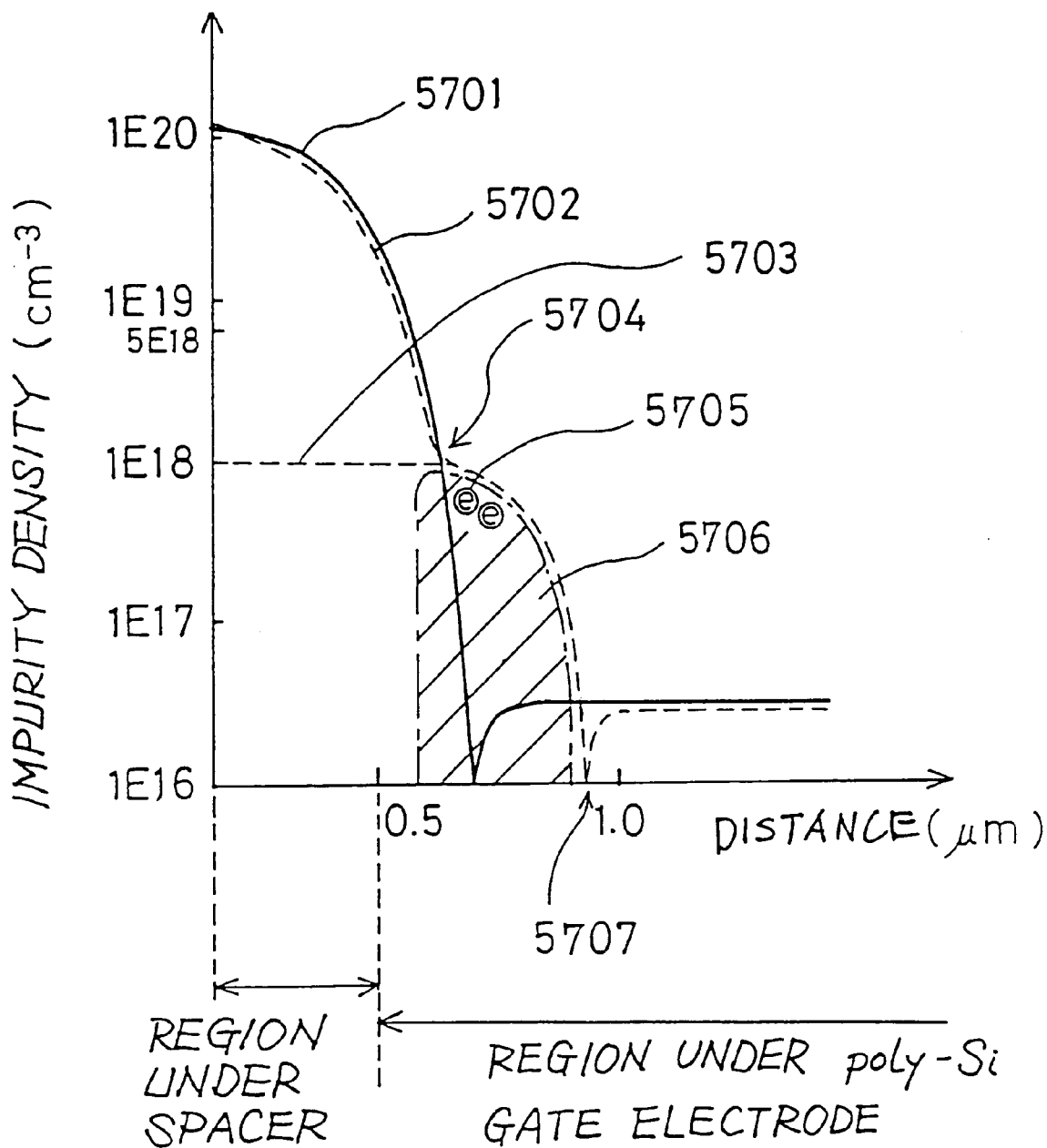
FIG. 57 is a graph showing an impurity profile of the offset CONV transistor from a point y in the direction A in FIG. 56, which is the application example of the first embodiment of the present invention.

FIG. 57 is a graph showing an impurity profile of the offset CONV transistor from a point y to the direction A in FIG. 56, which is the application example of the first embodiment of the present invention. A solid line 5701 indicates a concentration profile of the drain area of the offset CONV transistor of the present invention. A long broken line 5702 indicates a concentration profile of the drain area of the LDD transistor. Although an N⁻ type area of the LDD transistor which is formed when there is no NSG spacer of a short broken line 5703 is contained in the N⁺ type layer in the end up to about 0.6 μm, it shows a head from the points of about 0.6 μm to 0.9 μm as shown in the figure and brings about a kink 5704 and an area 5706 (portion shown by a dashed line and slant lines). This area is weak to ESD.

Although no electron is trapped to the side of the N⁻ type layer (Si), symbols of electrons 5705 have been drawn in the graph to show that hot electron trap is brought about within the gate $SiO_2$ right above that. The reason why this area is weak is that discontinuous points are created on the drain side in the field strength (potential) distribution when an inverse bias centering on a PN junction 5707 of the LDD transistor is added (not shown intentionally since it is obvious). The next graph proves that.

Figure 58:
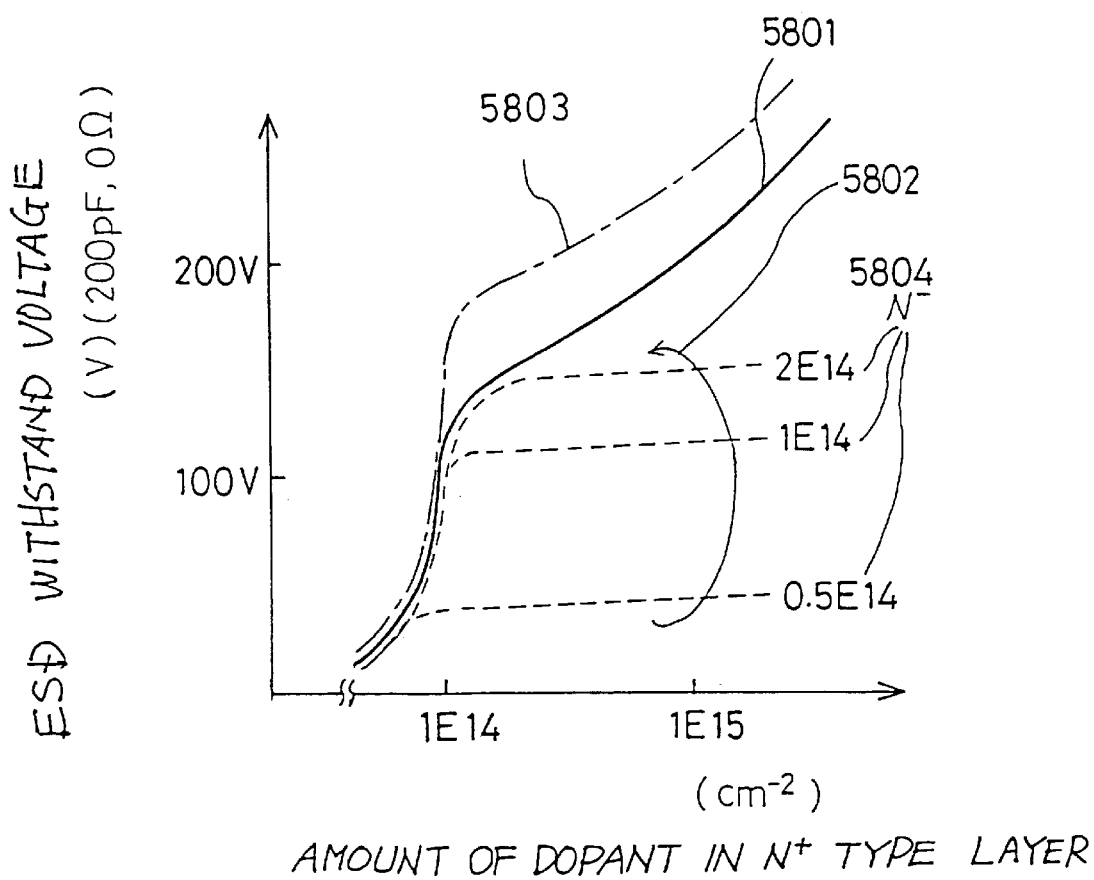
FIG. 58 is a graph showing ESD immunity of the offset CONV transistor itself which is the application example of the first embodiment of the present invention.

FIG. 58 is a graph showing ESD immunity of the offset CONV transistor itself which is the application example of the first embodiment of the present invention. The LDD transistor is also described together. The horizontal axis represents dosage of the N⁺ type layer and the vertical axis represents ESD immunity (V) in a case of EIAJ machine model 200 pF and 0 Ω, A solid line 5801 indicates the offset CONV transistor of the present invention. The graph clearly shows the dependency on N+type layer dosage and it can be said that it is fully in the practical range if more than 3 E 15 cm⁻² is injected, exceeding 300 V of ESD immunity. The ESD immunity sharply drops from around less than 1 E 14 $cm^{-2}$. It is because a current concentrated spot is started to be generated in the hot electron trap due to the drop of the surface concentration (around less than 2 E 18 $cm^{-2}$).

On the other hand, the LDD transistor 5802 barely shows the dependency on $N^+$ type layer dosage, though it is drawn per $N^-$ type layer dosages (5804), and almost no improvement is seen even if more than fifteenth power is injected. Rather, it clearly shows a dependency on $N^+$ type layer dosage. It is because an area 5706 after the kink as shown in FIG. 57 is contributing as the hot electron trap generating area. (As for the $N^-$ type layer dosage, a slightly better characteristic is shown when As is used instead of phosphorus. It is because a diffusion coefficient of As is smaller than that of phosphorus and the surface concentration Cs becomes slightly higher.)

From above, two essential points of the present invention become clear.

One is that more than 5 E 18 $cm^{-2}$ of drain surface concentration is effective and that there should be no kink. The other one is a creep amount (overlap) of the drain area under the gate electrode like the NROM transistor in the first embodiment. A long broken line 5803 shows data of a transistor in which an $N^+$ type layer is formed without forming a spacer in trial. As seen from FIG. 57, although the area creeping under the Poly Si gate electrode is longer than that of the offset CONV in the direction A by about 0.6 $\mu$m since there is no spacer, it is still strong. Accordingly, it shows how the NROM type transistor of the first embodiment into which this overlap amount (a remarkable difference is brought about if it is more than 0.5 $\mu$m) is added as the third point is excellent in terms of ESD immunity. The spacer type process requires to well take the process controllability and dispersion of ESD immunity, such as dispersion of thickness of CVDNSG film and dispersion of RIE etching, into account.

Furthermore, if the transistor in which the $N^+$ type layer is formed without spacer is formed together with the spacer type LDD transistor, one process of masking process is added. A type of $N^+$ type layer without spacer (CONV without spacer) also has a problem that withstand voltage (BVs) drops, so that the offset CONV transistor and internal LDD transistor as a protection element are fairly good solution for ICs for power of 12 V or 24 V $V_{ddmax}$. They may be determined as necessary from judgment whether ESD, performance or process cost should be take into account, after all.

Although the drain area may not reach under the Poly Si gate electrode and a real offset may be brought about (bringing about a rise of $V_{TH}$, etc.) depending on the case of Xj of the offset CONV and on the thickness of the spacer NSG, it presents no problem when it is used as an off-transistor for protection. The important question is the ESD immunity of it and setting of $V_H$ and $V_{trig}$.

Three important points have become clear from the above description. Although it is considered that other various proposals have been made concerning to the improvement of ESD immunity, they are all individual symptomatic treatments. The excellence of the present invention lies in that it systematized the matter in detail and precisely and devised designing guidelines (designing guideline of semiconductor device for improving ESD immunity). This point will be explained further below.

Figure 59:
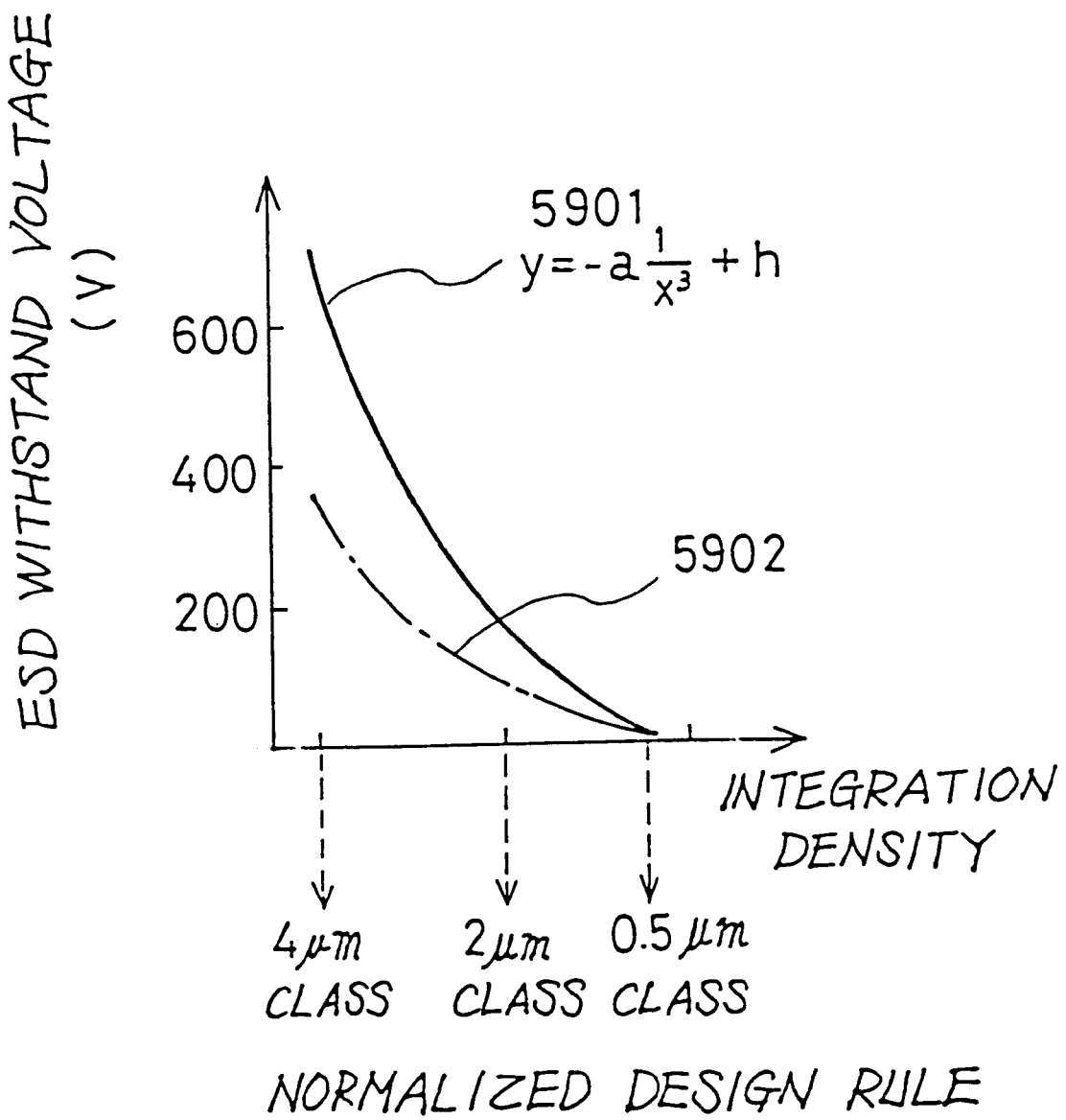
FIG. 59 is a graph indicating ESD immunity to the integration of IC for technologically explaining the present invention.

FIG. 59 is a graph indicating ESD immunity to the integration of IC for technologically explaining the present invention.

In the process of increasing integration, elemental devices of semiconductor integrated circuit devices, i.e. so-called ICs, have been scaled down approximately along the scaling rule (rule of proportional scale-down) lately. For example, the design rule (line and space: minimum unit dimensions such as L/S) of wiring Al, etc. have been scaled down from 4 $\mu$m to 3 $\mu$m, 2 $\mu$m, 1 $\mu$m and 0.5 $\mu$m and in order to scale down devices (transistors), gate L length is scaled down similarly from 4 $\mu$m to 3 $\mu$m, 2 $\mu$m, 1 $\mu$m and 0.5 $\mu$m. At that time, in order to assure $g_m$ (for proportional scale-down), gate $T_{OX}$ is also thinned from around 800 Å to 150 Å (the reason why it is described as "approximately" above is that the gate $T_{OX}$ has not been strictly proportionally scaled down to the L length).

Accordingly, although there may have been some extent of recognition that the ESD immunity drops unconsciously (it is a common case of this field that this sort of technological problem is left until a problem occurs), it cannot but be said that it has been a vague recognition, such as, "because the gate $T_{OX}$ has become thin, the ESD immunity has dropped in proportion to that" or "because $x_j$ of the $N^-$ type layer of the LDD structure has become thin, the ESD immunity has dropped in proportion to that". One important measure and guideline which the inventors of the present invention has disclosed is volume (of drain) described above. According to the scaling rule, the volume is scaled down three-dimensionally along the scale-down of design rule, not in the scale of the proportional scale-down of the gate $T_{OX}$. However, energy of ESD to be withstood is not scaled down, through it is a matter of course.

If FIG. 59 in which the integration is represented by the horizontal axis (corresponding design rule dimensions are described together below) and the ESD immunity is represented by the vertical axis, it may be recognized actually by the tendency (y=$-ax^{-3}$+b) shown by a plot line 5901. A plot line 5902 indicates a sample having Vddmax over 12 volts or having Vddmin under 1.5 volts. When a strength of ESD in the 4 $\mu$m class is assumed to be one for example, it becomes about $\frac{1}{16}$ in the 1 $\mu$m class. Considering 0.5 $\mu$m class in the future, it is expected to become about $\frac{1}{64}$. The plot line 5902 represents an IC having Vddmax over 12 V or having Vddmin under 1.5 V, which are more weak from ESD immunity. The reason why these problems did not surface or could not be scientifically understood is that it has been common to deal with ESD after causing a problem as described before. Even for 3 $\mu$m or 4 $\mu$m class ICs for example, no test has been carried out to check their real ability since it is enough in terms of quality if they clear a standard (e.g. 20 V) in ESD test. Therefore, there has been no data and those problems which would arise when the refinement is advanced have not been considered.

Hence, the description made so far and the guideline devised by the inventors of the present invention will contribute significantly for the measure to counter ESD in the advancement of refinement (advancement of scaling) and the increase of withstand voltage of the future, as explained with reference to FIG. 60.

Figure 60:
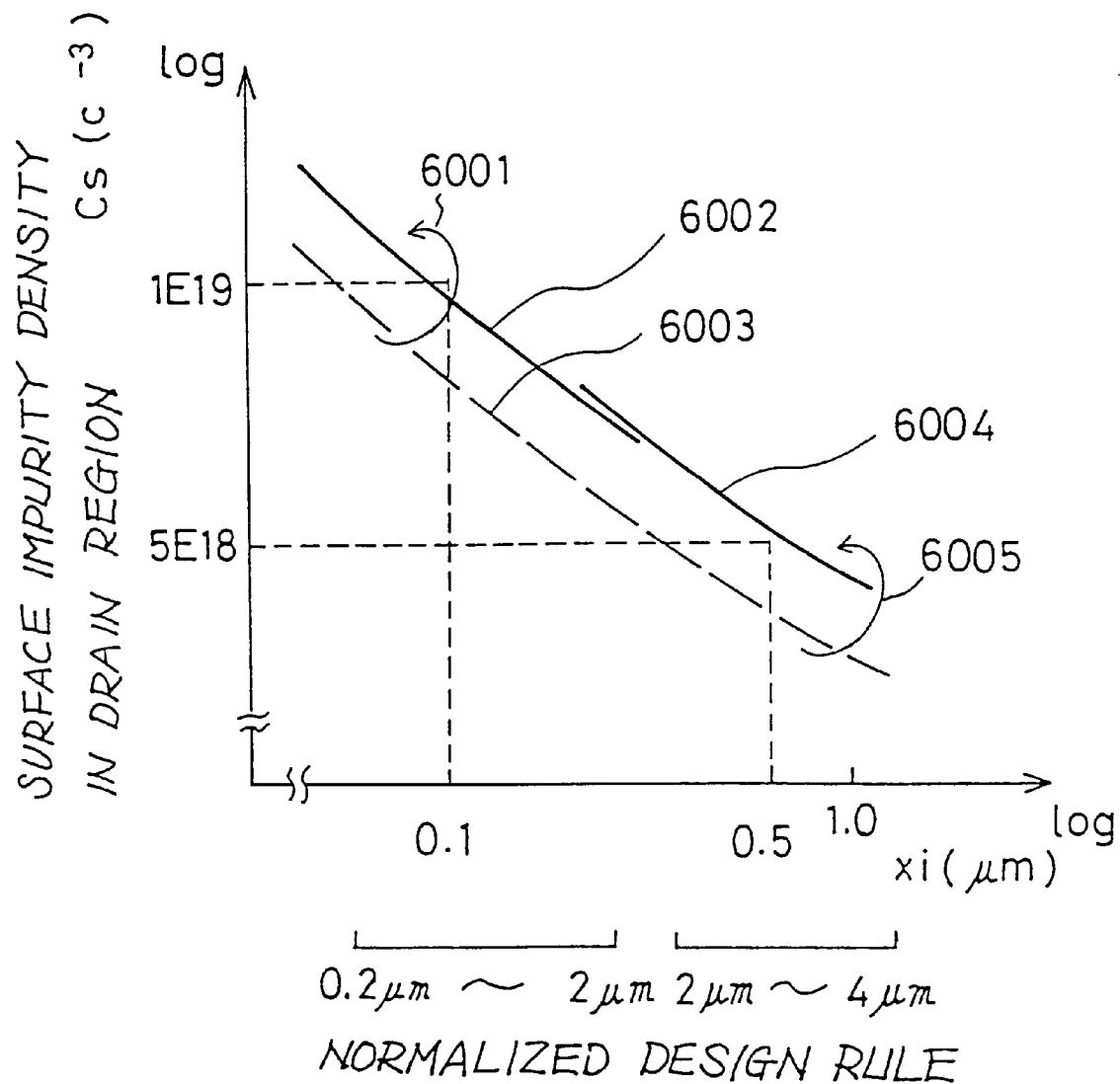
FIG. 60 is a graph showing a relationship between a depth of diffusion layer ($x_j$) and a surface impurity concentration (Cs), which shows a guideline for designing the drain structure of the NMOS transistor of the present invention.

FIG. 60 is a graph showing a relationship between a depth of diffusion layer ($x_j$) and a surface impurity concentration (Cs), which shows the guideline for designing the drain structure of the NMOS transistor of the present invention. It shows that the drain structure should be set above plot lines drawn in the graph. For example, a plot line 6004 shows that in a high withstanding product (those whose $V_{ddmax}$ is not 5 V but 12 V or 24 V. Here, those of more than 12 V to around 200 V are covered. However, $x_j$ also has to be deepened to 2 or 3 $\mu$m in the case of 150 V or 200 V), the maximum (peak) concentration of the drain has to be more than 5 E 18 $cm^{-3}$ in the direction of the portion below the gate electrode (direction A) as described before when $x_j$ is 0.5 μm (not necessarily at the portion where it overlaps with the Poly Si gate electrode, though it is of course desirable to be the overlap). Although it is needless to say that there should be no kink, the description of this graph will be advanced focusing on $x_j$ and Cs. While a long broken line 6003 shows a guideline for general ICs such as those of 5 V of $V_{ddmax}$, a plot line 6002 becomes a guideline for refined products by lowering voltage (indicated by an arrow 6001, $V_{ddmin}$ is 1.5 V) (meaning that more than 1 E 19 cm$^{-3}$ of Cs is necessary if $x_j$ is 0.1 μm), resulting in overlapping with the plot line in the process of increasing withstand voltage 6005. The above guidelines have been devised comprehensively by implementing a large number of experiments and calculations and set the plot lines as practical solutions in a manner covering a certain degree of fluctuation.

The depth of the drain diffusion layer $x_j$ on the horizontal axis is a log (logarithmic) scale and below that, ranges of design rule dimension which correspond to the $x_j$ are written together. The vertical axis shows the surface concentration of the drain area in a log scale. While the aspect of volume has been stress so far, it may be specifically said as a total amount of impurities from a contact to a drain edge (on the side of gate electrode), so that the following equation (cubic rule which is physically meaningful) is established for ESD immunity (here, Cs denotes a surface impurity concentration (/cm$^3$)):

$$\text{ESD immunity} \propto PCS \cdot \int_{surface}^{x_j} Cs\, dx \approx PCS\, Cs\, Xj/2 \quad \text{(Equation 3)}$$

However, since Cs·$x_j$/2≈ dosage, it does not match with the reality more or less. Actually, a relationship of ESD Cs$^2$·$x_j$ well matches since Cs contributes more (if PCS is also removed from parameters here because a contribution ahead of a kink may become dominant rather than PCS as described before when there is the kink).

Then, in light of numbers of experiments heretofore, an ESD immunity of more than a certain amount (300V) may be maintained by setting Cs so that a relationship of equation 4 is established when it is expressed by a qualitative equation within a certain range (Cs is x 10$^9$ cm$^{-3}$, $x_j$ is in unit of μm):

$$Cs > \frac{1}{5}\left(\sqrt{\frac{1}{x_j}} + 1\right) \quad \text{(Equation 4)}$$

Of course, it may be set by $x_j$ so that it enters within the range as necessary. This represents the plot lines 6002 and 6004 in FIG. 60 and is one of essential points of the present invention.

The points of the design parameters summarized from the above result may be listed as follows:

(1) More than 5 E 18/cm$^3$ is necessary as the surface concentration of the drain (for many present semiconductor device) and it may be set more precisely by using the relationship in FIG. 60. The overlap of the drain area with the gate electrode is more desirable to be more than 0.5 μm. Further, it is necessary to cause the concentration profile toward the portion blow the gate electrode to have no kink in a portion less than 5 E 18/cm$^3$.

(2) The gate $T_{OX}$ (thickness) is employed as a parameter to adjust $V_{trig}$ in the drain having a high concentration as described before. Because the surface breakdown should not be less than $V_{ddmax}$ when the concentration is raised, a gate $T_{OX}$ thicker than an internal transistor may be used.

(3) The diffusion depth ($x_j$) is desirable to be more than 0.5 μm. For the refined products whose $x_j$ is less than 0.5 μm, Cs may be set by the relationship shown in FIG. 60. While $x_j$ may be used for the adjustment of $V_{trig}$ beside the gate $T_{OX}$, it is effective in the aspect of increasing the volume described before beside that.

(4) $V_H$ should be as low as possible in a range not less than $V_{ddmax}$. Power should be caused to be able to readily escape (to be readily released; called also as power dissipation). Adjust by L length (described later).

(5) Graphically, the electrode for substrate potential should be separated as much as possible. The NMOS transistor of the present invention fabricated under such guidelines will be called in general as the NROM transistor of the present invention.

Figure 33:
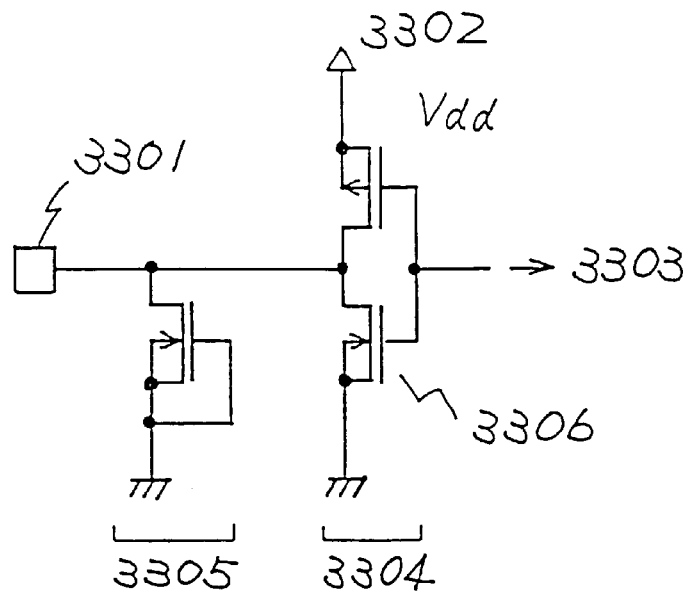
FIG. 33 is a block diagram showing a circuit using an NROM transistor of a second embodiment of the present invention.

FIG. 33 is a block diagram of a circuit using an NROM off-transistor of a second embodiment of the present invention to protect outputs. The reference numeral (3301) denotes an output terminal, (3302) $V_{dd}$, and (3303) a state connected further with an internal circuit, (3305) an NROM off-transistor of the second embodiment of the present invention, which is preferable to be a cross type in terms of plane structure, and (3306) an NMOS driver of an output CMOS inverter 3304 and its drain structure is DDD. It is more effective if its plane structure is DAA.

Figure 34:
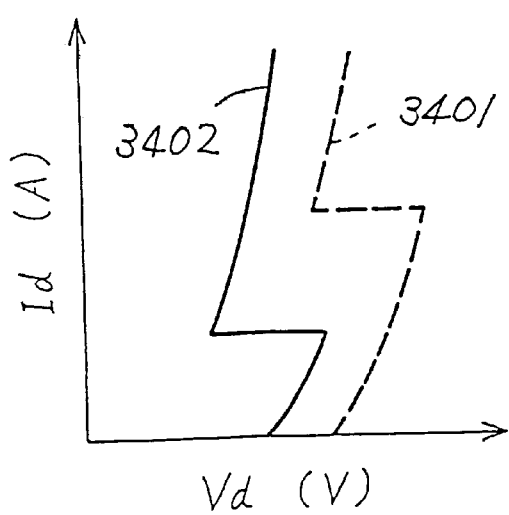
FIG. 34 is a graph showing a characteristic of the second embodiment of the present invention.

FIG. 34 is a first graph showing an I-V characteristic of the off-transistor for protection and the NROM driver of the second embodiment of the present invention.

Figure 35:
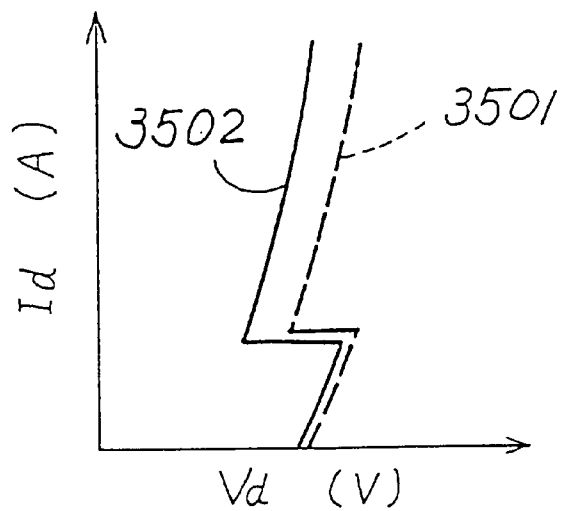
FIG. 35 is a graph showing a characteristic of the second embodiment of the present invention.

FIG. 35 is a second graph showing the I-V characteristic of the off-transistor for protection and the NROM driver of the second embodiment of the present invention.

Figure 36:
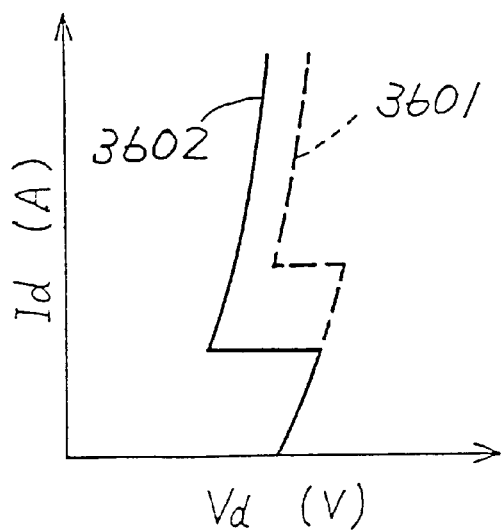
FIG. 36 is a graph showing a characteristic of the second embodiment of the present invention.

FIG. 36 is a third graph showing the I-V characteristic of the off-transistor for protection and the NROM driver of the second embodiment of the present invention.

Figure 37:
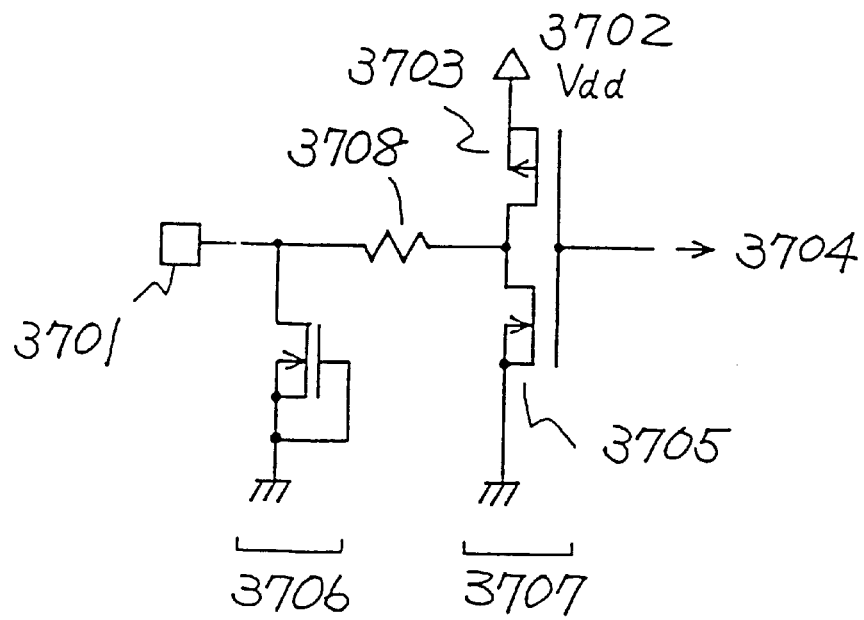
FIG. 37 is a block diagram showing a circuit related to an NROM off-transistor of the second embodiment of the present invention.

FIG. 37 is a block diagram showing a circuit in which the NROM off-transistor of the second embodiment of the present invention is used for protection of outputs and a series resistor is added. The reference numeral (3401) denotes the I-V of the NMOS driver, (3402) the I-V of the off-transistor for protection, (3501) the I-V of the NMOS driver, (3502) the I-V of the off-transistor for protection, (3601) the I-V of the NMOS driver, (3602) the I-V of the off-transistor for protection, (3701) an output terminal, (3706) the off-transistor for protection, (3708) the series resistor, (3707) a CMOS inverter for output, (3703) a PMOS driver, (3704) the NMOS driver, (3702) $V_{dd}$, (3704) a state connected further with an internal circuit.

Assuming a protection circuit, although there is no problem when the I-V characteristics of the NMOS driver and the off-transistor are as shown in FIGS. 34 through 36, the following measures are necessary when the withstand voltages of the both are almost equal. That is, when there is the relationship of the NROM drain off-transistor and the DDD type NROM driver like the present embodiment:

(1) Increase L of the NMOS driver or shorten L of the off-transistor. That is, widen a difference between $V_{trig}$ and $I_{trig}$ (see FIGS. 34 and 35);

(2) Insert the resistor between the off-transistor and the driver as shown in FIG. 37 to obtain the relationships shown in FIGS. 34 and 35. At this time, it is effective to insert the resistor between the off-transistor and the drive and it should not be inserted between the output terminal and the off-transistor.

(3) Adopt the cross type off-transistor and the DAA type NMOS driver. It allows to obtain the relationship shown in FIG. 35. (4) Separate P$^+$ $V_{ss}$ contact of the off-transistor as far as possible. It allows to obtain the relationship in FIGS. 34 and 35.

Figure 38:
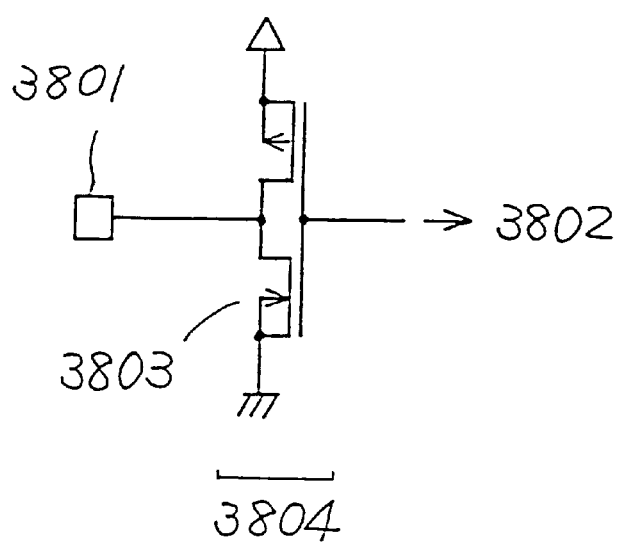
FIG. 38 is a block diagram showing a circuit related to the NROM transistor of the second embodiment of the present invention.

FIG. 38 is a block diagram showing a circuit in which the transistor in the NROM drain structure of the second embodiment of the present invention itself is used for the NMOS driver of an output inverter. The reference numeral (3801) denotes an output terminal, (3803) the NMOS driver transistor in the NROM drain structure, (3804) a CMOS inverter for output, and (3802) a state that the line is connected further with an internal circuit. In this case, the NROM transistor may be the cross type or the DAA type. Although the DAA type is better since its ESD immunity itself is strong, it should be determined generally including the aspect of cost since the area becomes large.

Figure 39:
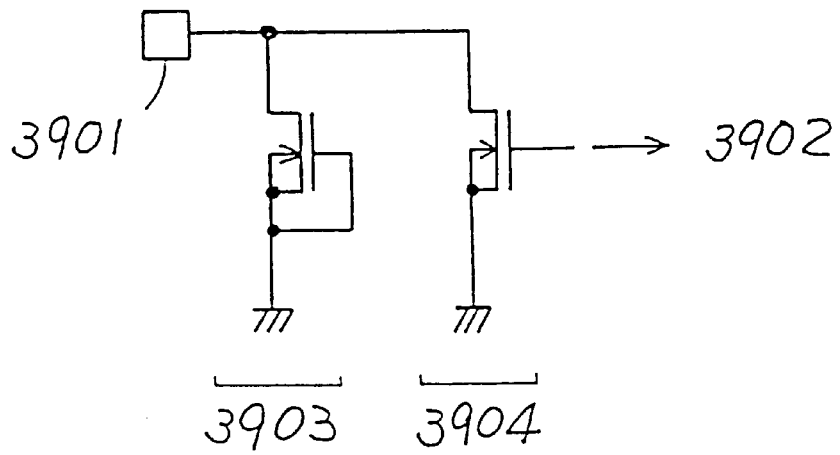
FIG. 39 is a block diagram showing a circuit related to the NROM off-transistor of the second embodiment of the present invention.

FIG. 39 is a block diagram showing a circuit in which the NROM off-transistor of the second embodiment of the present invention is added to an output of the NMOS open drain.

Figure 40:
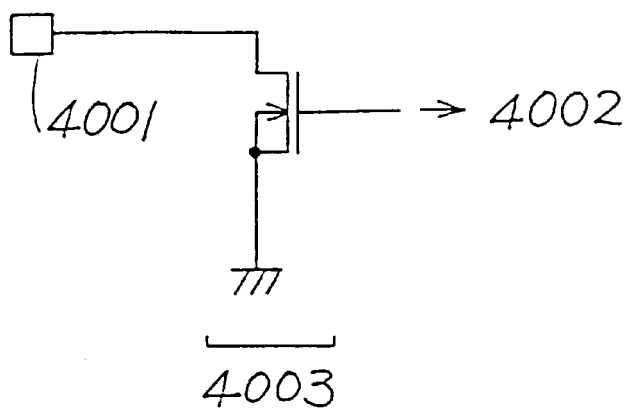
FIG. 40 is a block diagram showing a circuit related to the NROM transistor of the second embodiment of the present invention.

FIG. 40 is a block diagram showing a circuit in which the transistor in the NROM drain structure of the second embodiment of the present invention itself is used for the output of the NMOS open drain.

Figure 41:
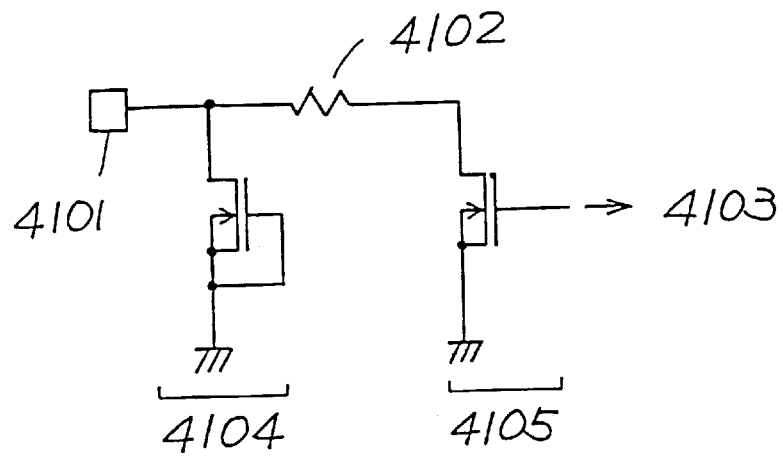
FIG. 41 is a block diagram showing a circuit related to the NROM off-transistor of the second embodiment of the present invention.

FIG. 41 is a block diagram showing a circuit in which the NROM off-transistor of the second embodiment of the present invention is added to the output of the NMOS open drain and the series resistor is added. In FIG. 39, the reference numeral (3901) denotes an output terminal, (3903) an NROM off-transistor for protection, (3904) an NMOS open drain transistor for output, and (3902) a state that the line is connected further with an internal circuit. In FIG. 40, the reference numeral (4001) denotes an output terminal, (4003) a transistor in the NROM drain structure for the output NMOS open drain, and (4002) a state that the line is connected further with an internal circuit. In FIG. 41, the reference numeral (4101) denotes an output terminal, (4104) an NROM off-transistor, (4102) an added series resistance Poly Si (W/L=20/500 µm), (4105) an NMOS open drain transistor (DDD drain structure, W/L=50/10 µm), and (4103) a state that the line is connected further with an internal circuit. The structure of each transistor and the explanation on L length and on whether cross type or DAA type are basically the same with those explained in the CMOS output.

Figure 42:
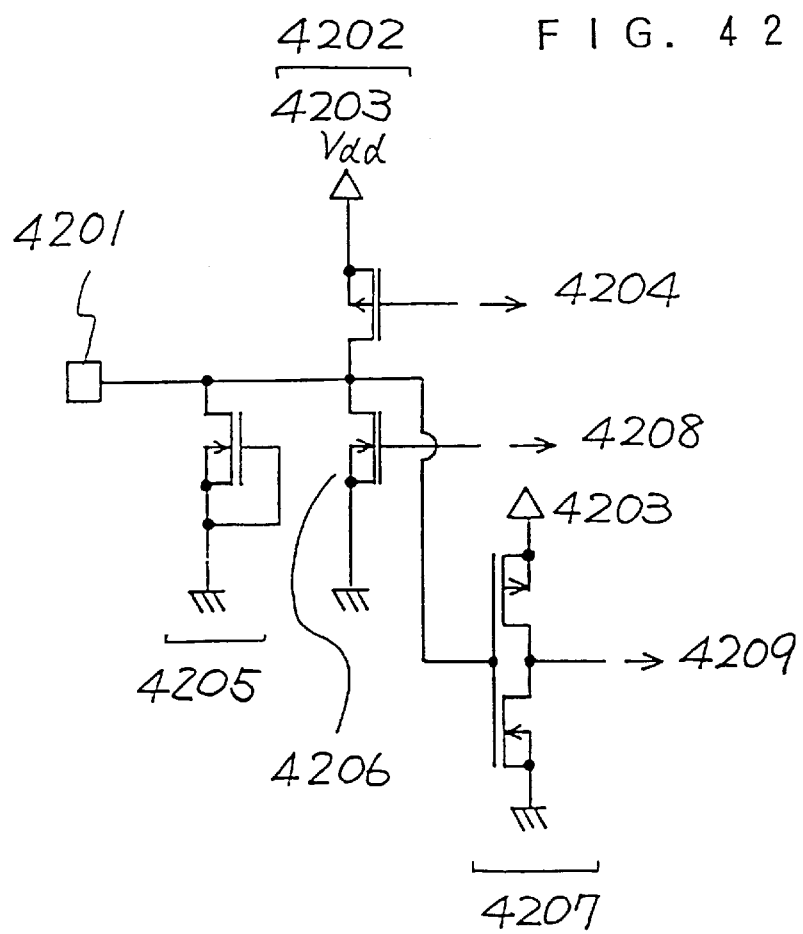
FIG. 42 is a block diagram showing a circuit related to an NROM off-transistor of a third embodiment of the present invention.

FIG. 42 is a block diagram showing a circuit in which an NROM off-transistor of a third embodiment of the present invention is used as a protection element of an input/output terminal. The reference numeral (4201) denotes the input/output terminal, (4205) the NROM off-transistor for protection of the third embodiment of the present invention, (4202) a CMOS inverter for output, (4206) an NMOS driver transistor of the inverter for output, (4203) $V_{dd}$, (4204, 4208, 4209) states that the lines are connected further with an internal circuit (they may be connected to circuits having different functions), and (4207) a CMOS inverter for input. The structure, function and operation of each are the same with those explained in the first and second embodiments. It is also the same that the structure in which the NMOS driver transistor 4206 of the inverter for output itself is the NROM structure drain type transistor and is used also for protection is of course effective.

Figure 43A:
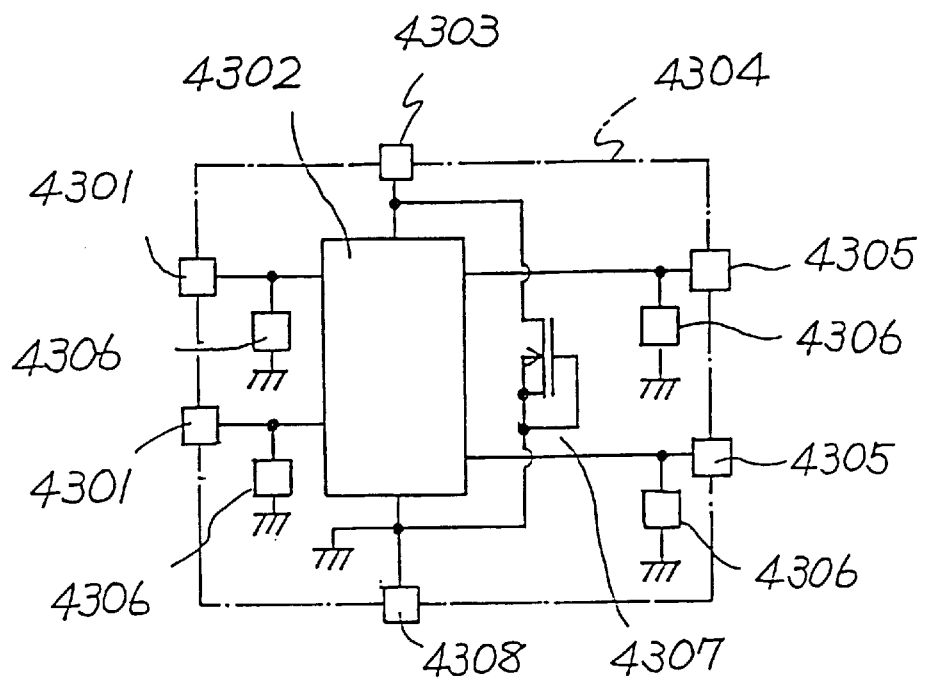
FIGS. 43A and 43B are block diagrams showing circuits related to an NROM off-transistor of a fourth embodiment of the present invention.
Figure 43B:
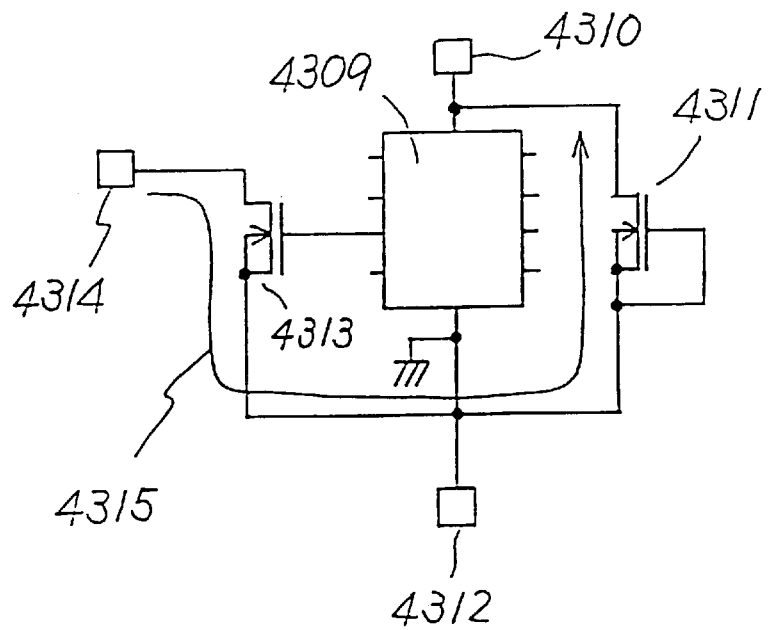

FIGS. 43A and 43B are block diagrams showing circuits in which an NROM off-transistor of a fourth embodiment of the present invention is used as a protection element of a power system. The reference numeral (4301) denotes an input terminal, (4302) an internal circuit, (4303) a $V_{dd}$ terminal, (4304) a semiconductor integrated circuit (IC), (4305) an output terminal, (4306) the NROM protection element of the present invention, (4307) the NROM off-transistor of the fourth embodiment of the present invention, (4308) a GND ($V_{ss}$) terminal, (4314) an output terminal, (4309) an internal circuit, (4310) a $V_{dd}$ terminal, (4313) an NMOS open drain output transistor, (4312) a GND ($V_{ss}$) terminal, (4311) the NROM off-transistor of the fourth embodiment of the present invention, and (4315) an arrow indicating a path of minus surge.

As shown in FIG. 43A, it is needless to explain that it is very effective to add the NROM off-transistor of the present invention to the $V_{dd}$ 4303 and GND 4308 as a protection element to ESD surge added to the power system (between $V_{dd}$ and GND)

It should be noted that there is a case when no protection element can be provided on the side of $V_{dd}$ even in a normal case depending on an IC, like the NMOS open drain output terminal. At this time, a very low ESD immunity may be seen when ESD surge is added to $V_{dd}$ standard. It is effective to insert the NROM off-transistor of the present invention between the power supplies in parallel.

That process will be explained below:
(1) Apply plus at the $V_{dd}$ standard;
(2) A plus voltage is generated at the output terminal;
(3) The NMOS open drain breaks down (assume that this NMOS has the protection of the NROM off-transistor or it is a NROM type transistor and is fully strong against ESD. Just before ESD, it approaches to GND potential, though $V_{ss}$ floats);
(4) $V_{ss}$ potential rises to plus side;
(5) Off-transistor 4311 is in the forward direction; and
(6) Surge escapes to $V_{dd}$ without any trouble.

Succeedingly, a case when a minus voltage is applied will be explained.
(1) Apply minus at the $V_{dd}$ standard;
(2) A minus voltage is generated at the output terminal;
(3) The NMOS open drain is in the forward direction;
(4) $V_{ss}$ potential drops further to the minus side;
(5) The off-transistor 4311 breaks down in the reverse direction; and
(6) Accordingly, the surge escapes to $V_{dd}$ without any trouble since the off-transistor 4311 is the off-transistor of the present invention which is strong against ESD.

When $V_{dd}$ is minus in the above case and if there is one whose withstand voltage is lower than $V_{trig}$ somewhere in the internal circuit, all surge passes through there, destroying there.

However, there is nothing to worry about since this withstand voltage is set lower than $V_{trig}$ of the protection off-transistor as described above because generally one whose withstand voltage is the lowest is the surface breakdown of the NMOS transistor.

Figure 61:
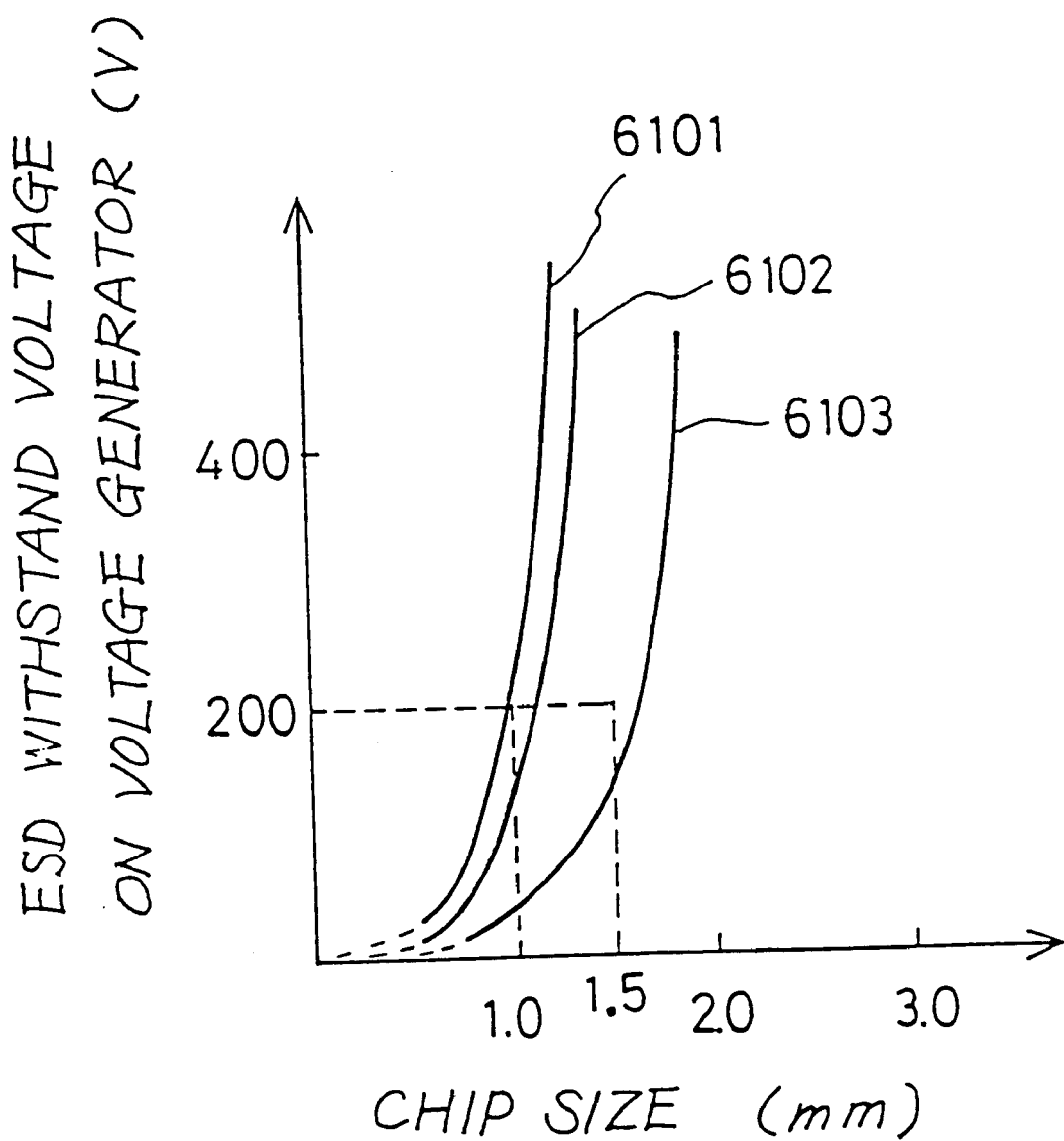
FIG. 61 is a graph showing a relationship between a chip size and ESD immunity between power sources for explaining the fourth embodiment of the present invention in more detail.

FIG. 61 is a graph showing a relationship between a chip size and ESD immunity between power sources for explaining the fourth embodiment of the present invention in more detail.

Normally the ESD immunity between the power supplies is not questioned so much when $V_{dd}$ plus is applied in the $V_{ss}$ standard in the ICs in which there is no turning path as described before. However, the things change completely when the chip size is small. As shown in the IC whose $V_{ddmax}$ is 5 V, the ESD immunity sharply drops and falls into the level causing a trouble when the size of one side of the chip becomes less than about 1.0 mm as shown by a plot line 6101. This is related to the protection (power dissipation) at the PN junction described before. It is because ICs are structured basically by PN junction of N-well and P type substrate (or P-well and N type substrate) and the PN junction corresponds to $V_{dd}$-$V_{ss}$.

That is, the ESD immunity is scaled down again according to the third power of a chip size (length of one side) (It is not too much to say as the third power rule since well $x_j$ is also shallow in the case of refined products). Accordingly, power applied is not allowed to escape (dissipate) at the PN junction.

The drop of the resistance of the products whose operation rating $V_{ddmax}$ is 12 V is more sharp (plot line 6102, a sample having Vddmin under 1.5V is on this plot line) and it can be said that the ESD immunity of the products whose $V_{ddmax}$ is 24 V (plot line 6103) is already below the necessary ESD immunity when the size of one side is less than 1.5 mm. As the withstand volgae becomes to be higher, a reverse withstand voltage of the PN-junction must be set high voltage, so that the $BV_{OX}$ becomes low in a low voltage range. Then, it is essential to dispose the NROM transistor of the present invention to the power supply in the manner shown in FIG. 43A.

Figure 44:
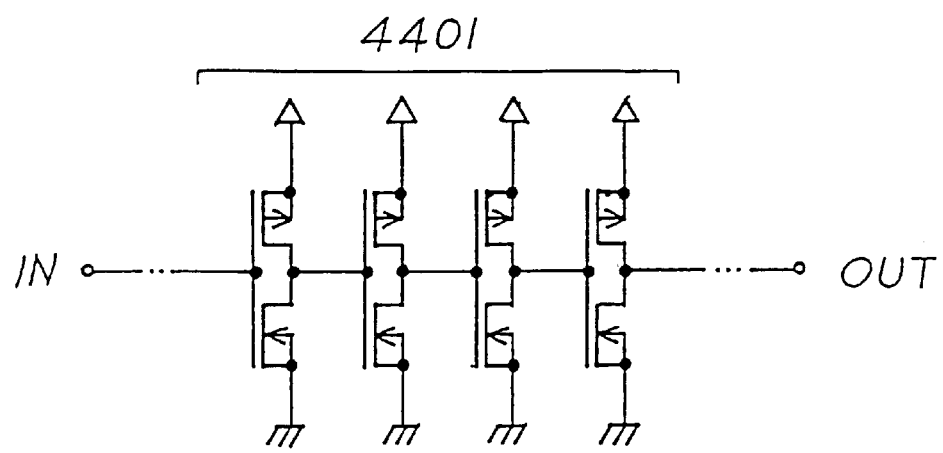
FIG. 44 is a block diagram showing a circuit of a ring oscillator of the fourth embodiment of the present invention.

FIG. 44 is a block diagram showing a circuit in which a plurality of CMOS inverters of the fourth embodiment of the present invention are arranged to compose a ring oscillator. The reference numeral (4401) shows the state in which the CMOS inverters are arranged.

Figure 45:
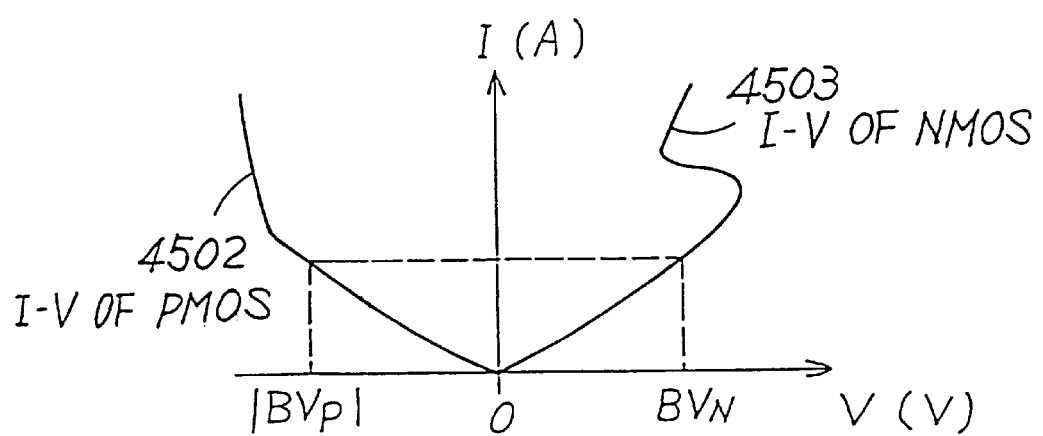
FIG. 45 is a graph showing a characteristic of the fourth embodiment of the present invention.

FIG. 45 is a graph showing both I-V characteristics of the PMOS transistor and of the NMOS transistor of the fourth embodiment of the present invention. The reference numeral (4502) denotes the I-V characteristic of the PMOS transistor and (4503) the I-V characteristic of the NMOS transistor.

Considering the ring oscillator as shown in FIG. 44, each gate is in the intermediate potential or either potential close to $V_{ss}$ or $V_{dd}$ since it is floating in the initial state. When $V_{dd}$ is raised from this state, a current flows a CMOS in which a gate having the lowest impedance is in the intermediate potential (both the PMOS transistor and NMOS transistor are ON). Then, the output of the CMOS assumes the intermediate potential and the next gate also assumes the intermediate potential, causing a state in which gates of a large number of CMOSs are ON in the intermediate potential.

While FIG. 45 shows the I-V characteristics of the NMOS transistor and the PMOS transistor, the off-transistor is switched if:

$$V_{trig}(\text{off-transistor}) < BV_N + |BV_p|$$

Accordingly, in the case of such circuit, $V_{trig}$ is not always necessary to set lower than the NMOS surface breakdown. There is no problem so long as the off-transistor for protecting NROM is strong against ESD.

Figure 46:
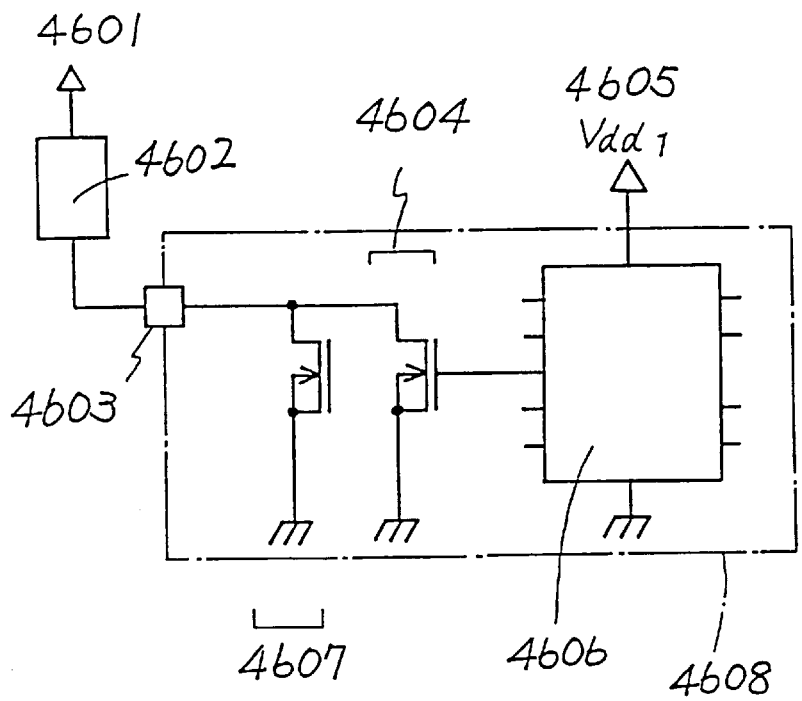
FIG. 46 is a block diagram showing a circuit of a semiconductor device according to a fifth embodiment of the present invention.

FIG. 46 is a block diagram showing a circuit of a semiconductor device according to a fifth embodiment of the present invention. The reference numeral (4608) denotes a semiconductor integrated circuit device having a high withstanding terminal (more than 16 V) of the present embodiment, (4601) $V_{dd2}$ (more than 16 V), (4602) an external load, (4603) an output terminal, (4607) an NROM off-transistor of the fifth embodiment of the present invention, (4604) an NMOS open drain output transistor, (4605) $V_{dd1}$ (5 V), and (4606) an internal circuit, respectively. This is a case of an IC in which the internal circuit generally operates with 5 V or 3 V of power voltage and the external load connected to an outside power system of more than 16 V is driven by the NMOS open drain. Although the NMOS open drain transistor has to have a high withstanding structure which allows to withstand more than 16 V, the gate $T_{OX}$ of the internal circuit cannot be thicken since $V_{ddmin}$ of the internal circuit is low. Since the NMOS open drain transistor is open drain, the gate $T_{OX}$ is not necessary to maintain an electric field of less than 3 MV/cm and is hence structured with the same thickness with the internal transistor, its ESD immunity is weak. Then, the addition of the NROM off-transistor 4607 will become a very effective measure. That itself may be a transistor in the NROM drain structure, of course. It is the same also when $V_{ss}$ has a power system of a plurality of high minus voltages at the $V_{dd}$ standard. It is also effective when a level shifter is inserted before the NMOS open drain transistor.

Figure 47:
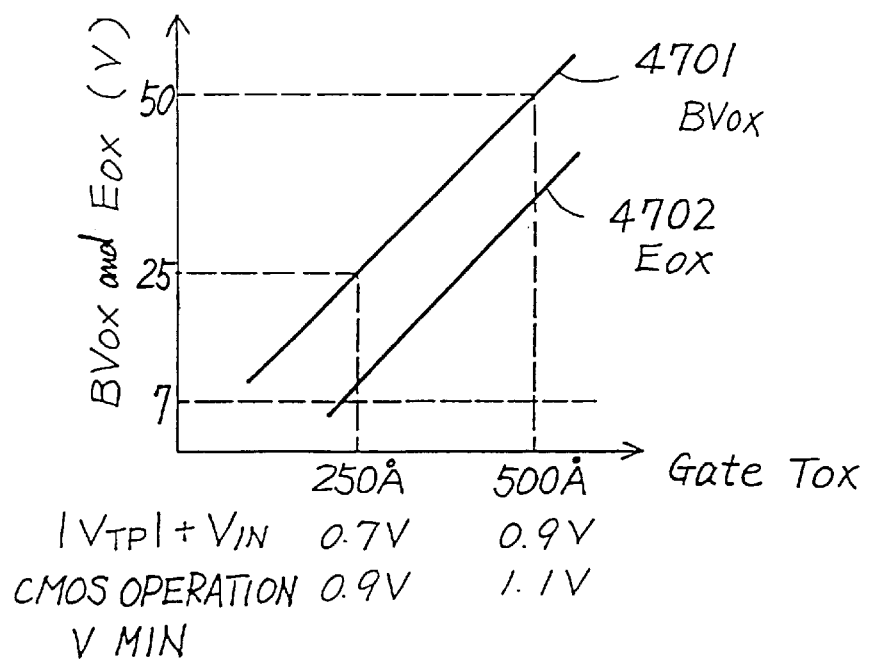
FIG. 47 is a graph showing a characteristic of a semiconductor integrated circuit device according to a sixth embodiment of the present invention.

FIG. 47 is a graph showing a relationship between gate $T_{OX}$ and gate withstand voltage of a semiconductor integrated circuit device according to a sixth embodiment of the present invention. The reference numeral (4701) denotes a line of $BV_{OX}$ and (4702) a line of $E_{OX}$ for maintaining an electric field of less than 3 MV/cm. $V_{ddmin}$ of a CMOS IC is determined approximately by:

$$V_{ddmin} \approx |V_{TP}| + V_{TN} + 0.2$$

$V_{TP}$: threshold voltage of P-channel transistor
$V_{TN}$: threshold value of N-channel transistor.

Accordingly, if it is tried to lower $V_{ddmin}$ from 1.1 V to 0.9 V, $|V_{TP}| + V_{TN}$ has to be 0.7 V. Then, if it is tried to lower the channel concentration while keeping the gate $T_{OX}$=500 Å, the gate $T_{OX}$ has to be thin since leak increases. It is found from the graph that the gate $T_{OX}$ may be thinned to 250 Å if the same $V_{ddmax}$ of 7 V is kept. However, from this fact, it is found that $BV_{OX}$ drops by 50% if $V_{ddmin}$ is lowered by 20%. That means that the ESD immunity is extremely worsened. Accordingly, when an IC having 1.5 V line of $V_{ddmin}$ is to be realized, 0.9 V of $V_{ddmin}$ is necessary in reality taking a degradation and temperature characteristics of battery into account. Then, it may be realized for the first time by the measures explained in the first to fifth embodiments of the present invention. It is particularly effective when applied to a power system.

Figure 48:
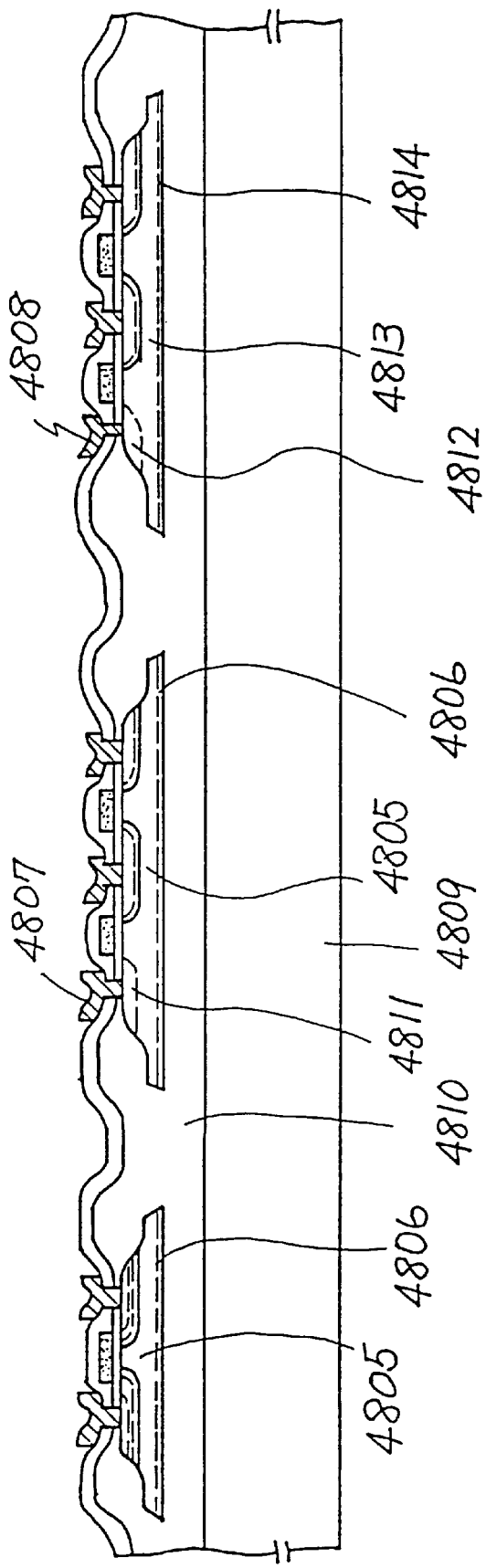
FIG. 48 is a section view of a semiconductor integrated circuit device according to a seventh embodiment of the present invention.

FIG. 48 is a section view showing a semiconductor integrated circuit device according to a seventh embodiment of the present invention.

Figure 49:
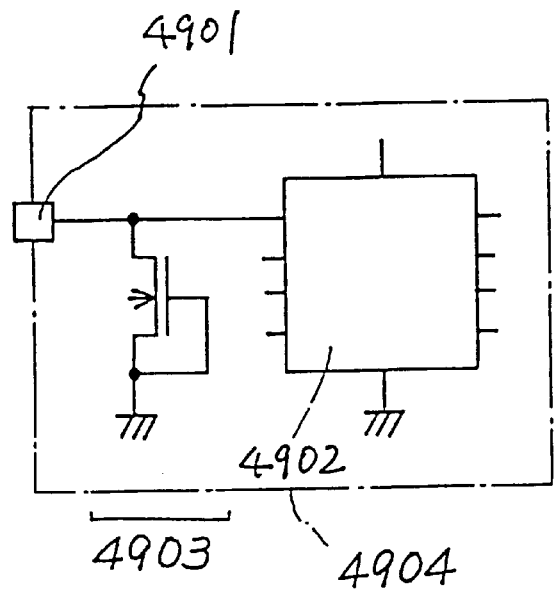
FIG. 49 is a block diagram showing a circuit of the semiconductor integrated circuit device of the seventh embodiment of the present invention.
Figure 50:
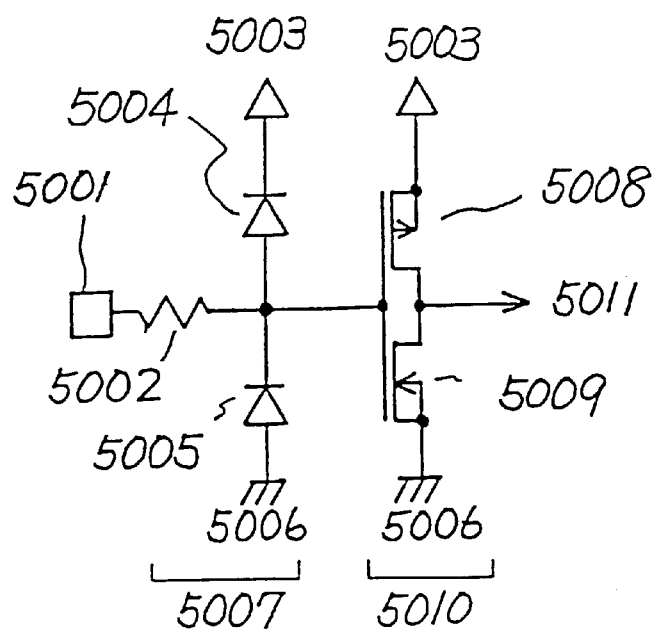
FIG. 50 is a block diagram showing a prior art input protection circuit.
Figure 51:
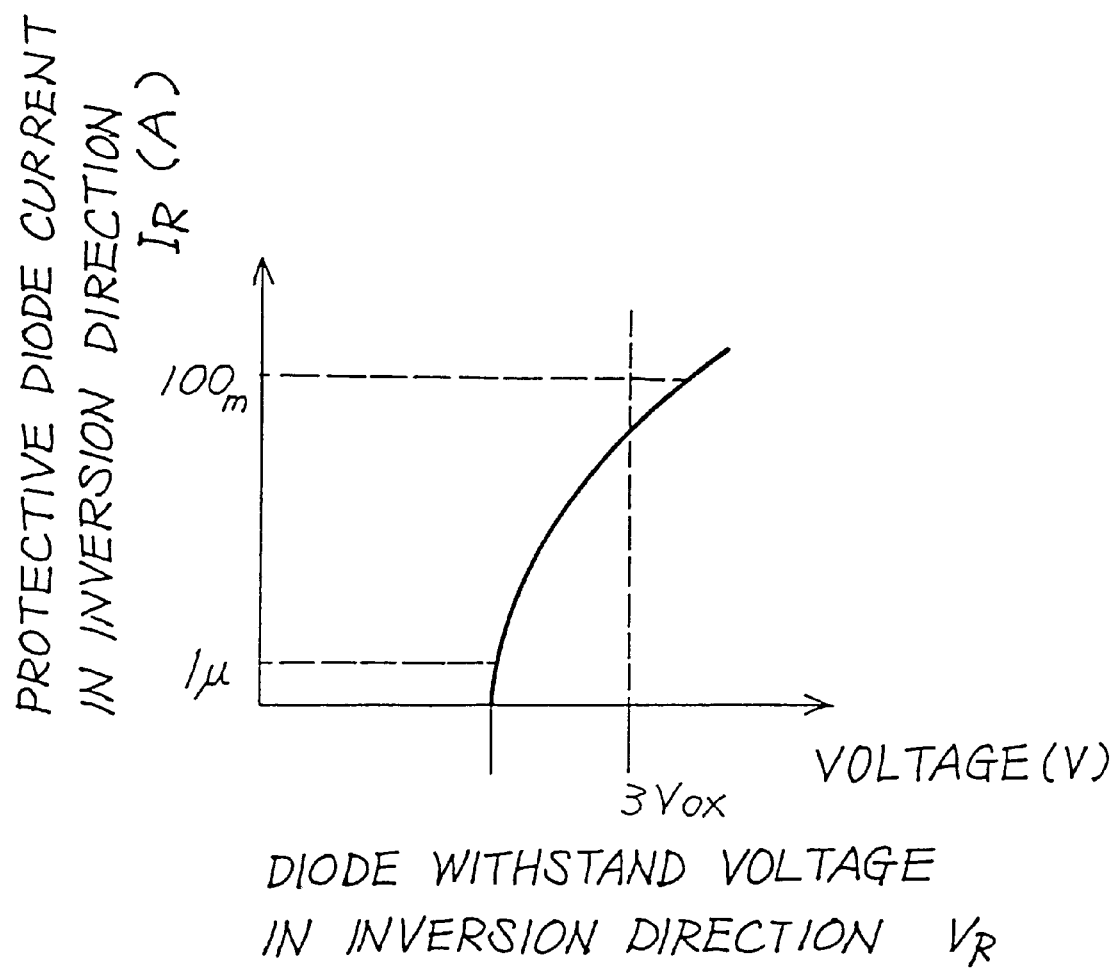
FIG. 51 is a graph showing a characteristic of the prior art input protection circuit.

FIG. 49 is a block diagram showing a circuit of the semiconductor integrated circuit device of the seventh embodiment of the present invention. The reference numeral (4801) denotes the NROM transistor of the present invention, (4802) a CMOS of an internal circuit, (4803) an internal NMOS transistor, (4804) an internal PMOS transistor, (4805) a P⁻ type substrate, (4806) a P⁺ type layer, (4807) an NMOS substrate electrode, (4811) a P⁺ type layer, (4808) a PMOS substrate electrode, (4812) an N⁺ type layer, (4813) an N⁻ type layer, (4814) an N⁺ type layer, (4809) a support substrate, and (4810) an insulating film (embedded SiO₂), respectively. The reference numeral (4801) denotes various terminals, (4803) the NROM off-transistor of the seventh embodiment of the present invention (substrate is automatically and intentionally floated), (4802) an internal circuit, and (4804) an IC of the present embodiment.

Since such IC as shown in FIG. 48 which uses a so-called SOI substrate and which are aimed at increasing speed, whose radiation resistance is enhanced or having a function which requires separation of dielectric (such as multi-circuit power source) has a thin Si substrate on which the transistors are created and since thermal conductivity of the embedded SiO₂ is bad, its ESD immunity is extremely weak.

Accordingly, it may reach to the practical level for the first time when the measures explained in the first through fifth embodiments of the present invention are adopted.

It is equally effective to one in which the SOI and Si layer are separated as shown in FIG. 48 or to one in which they are not separated. It is convenient if only the protection element portion is separated from the Si layer.

Although FIG. 49 shows a case in which the protection element is added, the output terminal itself, for example, may be the NROM transistor as described before. Although the internal transistor is also effective since the NROM transistor of the present invention can set $V_{trig}$ low even if the substrate is floating, an ideally strong ESD immunity may be maintained by a structure in which the internal transistor properly takes the substrate potential and the NROM off-transistor does not take the substrate potential (automatically or intentionally). It is needless to say that it is also effective to add between power supplies (not shown) and it is essential depending on a chip size. Instead of using SOI substrate, it is possible to make floating the substrate by utilizing a CMOS formed in a P-well in a N-type substrate. Therefore, in this case, all the embodiments of the present invention can be used as a protective element.

Figure 62:
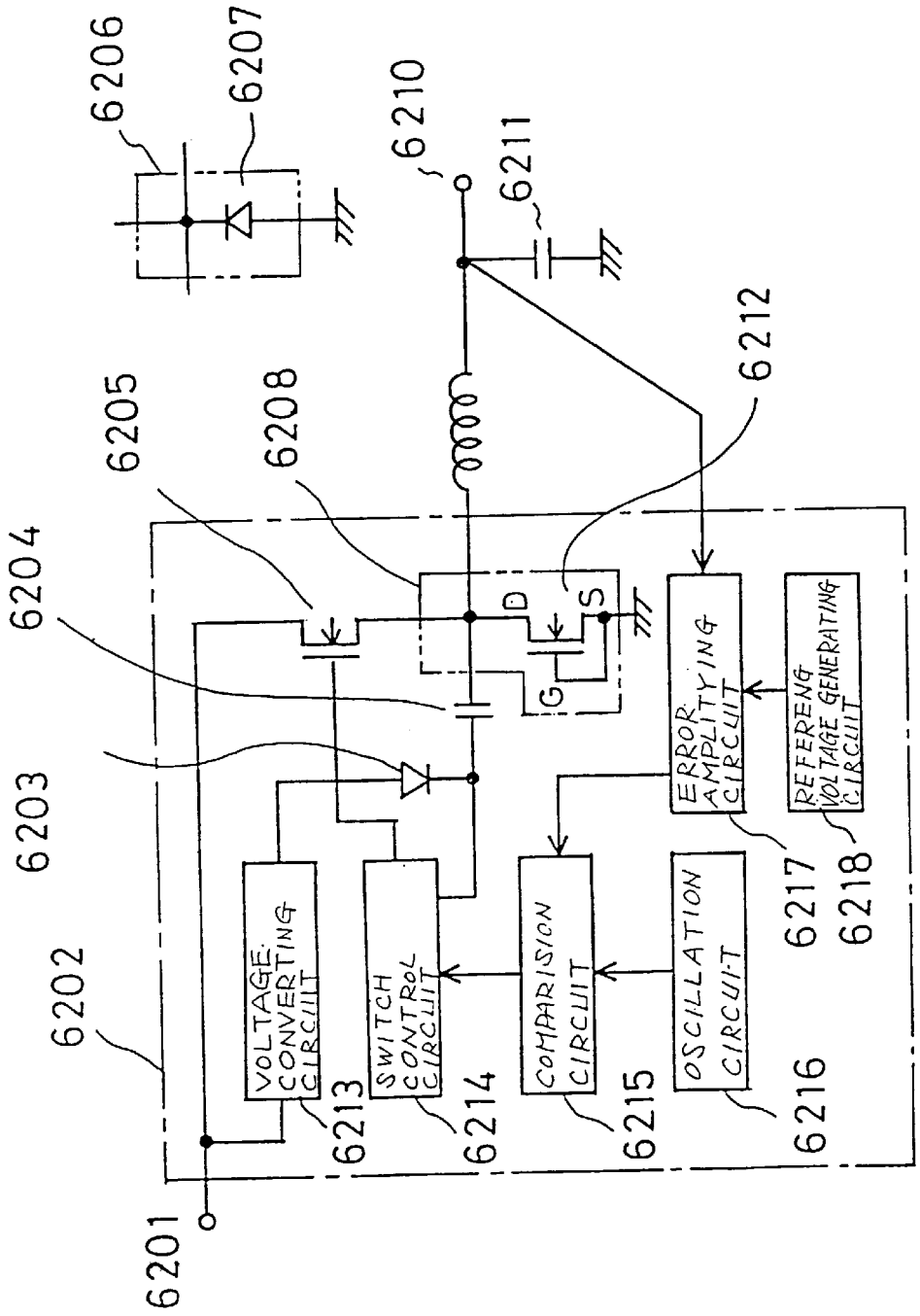
FIG. 62 is a block diagrams showing a circuit of a first semiconductor integrated circuit device according to an eight embodiment of the present invention.

FIG. 62 is a block diagram showing a circuit of a first semiconductor integrated circuit device 6202 according to an eight embodiment of the present invention. The so-called switching method DC—DC converter basically comprises a switching element (MOS transistor 6205), a rectifier diode 6207 (flywheel diode), a coil 6209, a capacitor ($C_1$) 6211 and a control circuit section (comprising a voltage converting circuit 6213, a switch control circuit 6214, a comparison circuit 6215, an oscillation circuit 6216, an error amplifying circuit 6217, a reference voltage generating circuit 6218, and a step up circuit composed of a diode 6203 and a capacitor $C_2$ 6204) (as an example, a step-down method is shown). A PN junction diode has been used for the rectifier diode 6207 (part K 6208, conventionally 6206) which had 0.6 V of $V_F$ (voltage drop in forward direction) in the past. When 5 V of voltage or 3 V due to the recent decrease of voltage has come be requested on an output 6210, $V_F$ has come to occupy a large weight (50% of loss) in terms of the conversion efficiency. Then, the use of a SBD (Schottky Barrier Diode) using a barrier metal having less Schottky barrier has been proposed lately. Because it allows to lower $V_F$ to about 0.3 V, as compared to the PN type. However, there is still 0.3 V of $V_F$, and the SBD has such problems that it has more leak than PN and that thermorunaway takes place, hindering the efficiency from being improved further. Then, the NROM off-transistor 6212 of the present invention is applied as a rectifier element in the present embodiment.

Figure 64:
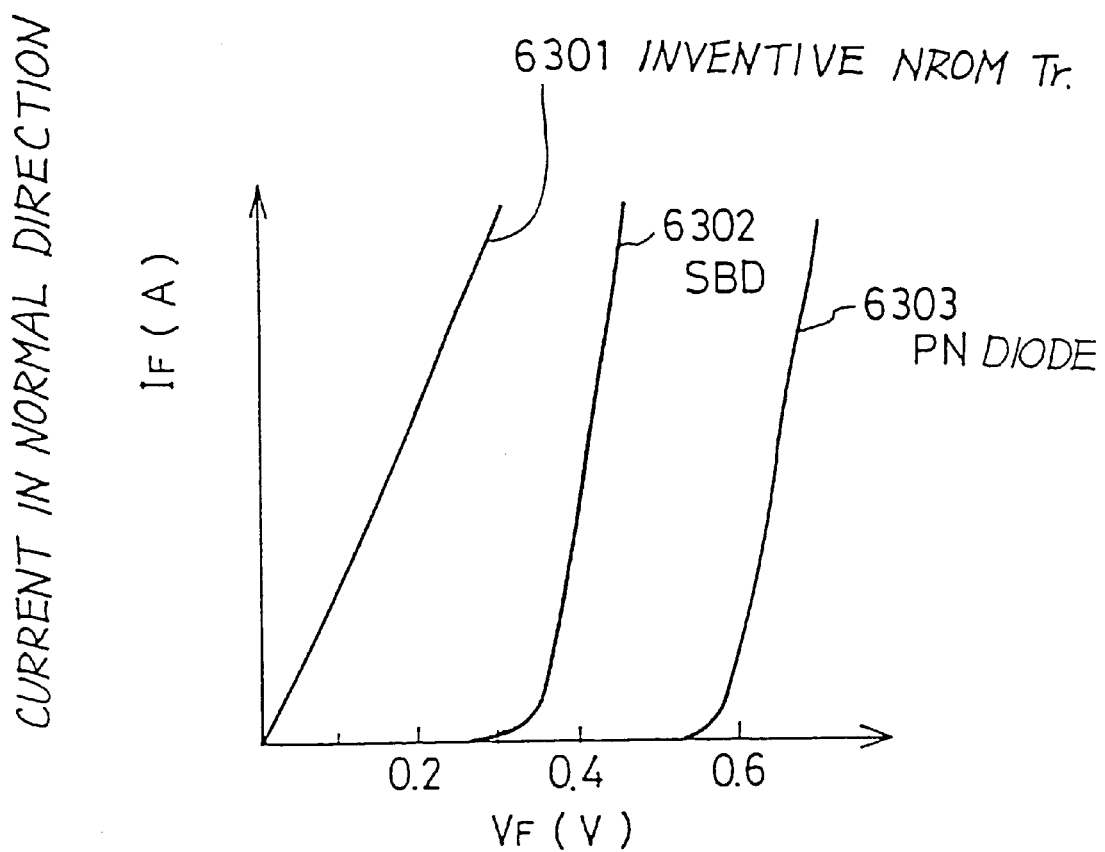
FIG. 64 is a graph showing an I-V characteristic of an NROM transistor of the eighth embodiment of the present invention.

FIG. 64 is a graph showing an I-V characteristic of an NROM transistor of the eighth embodiment of the present invention. The NROM off-transistor (plot line 6301) of the present invention allows to realize a very high conversion efficiency (improvement of about 50% to about 85% in average, though it depends on various conditions) since current rises from 0 V even though there is a $V_F$ drop of 0.6 V in the PN junction type diode (plot line 6303) and of 0.3 V in the SBD (plot line 6302). The gradient of the line 6301 may be set at a necessary size (current value) in the design of transistor size (L/W). Accordingly, no scale is shown for the forward current $I_F$ (A) on the vertical axis.

On the other hand, the SBD and PN junction type diodes have the drop of $V_F$ of 0.3 V and 0.6 V, respectively, as a barrier regardless of the design size. The efficiency of the DC—DC converter circuit (or the semiconductor integrated circuit device 6202 for controlling the DC—DC converter as in the present embodiment) may be increased so much by constructing the part k in FIG. 62 by the NROM transistor 6212 of the present invention. In addition to that, the NROM transistor has a primary merit that it is strong against surge as described before in various ways. It will be a most suitable device for applications such as the DC—DC converter which uses a coil (creates surge).

Accordingly, it will be more convenient if a MOS transistor for switching 6205 is made from the NROM transistor of the present invention (though it should not be off-connected). Further, the use of the offset CONV type described before (for switching and for rectification) allows more high-speed operation since it has less overlap of the gate electrode and the drain area from its structure (it may be approached to zero if set well) and hence it has less gate-drain overlap capacitance.

Increasing the speed (frequency) in the switching method means that it is possible to advance the increase of the efficiency and the miniaturization further. The reference numeral (6201) denotes an input terminal and (6210) an output terminal. Even if the NROM transistor of the present invention is constructed as a two-terminal semiconductor device by connecting the gate and source and floating the substrate (it may be an array of course), it may be used instead of a diode on such circuit and is very convenient.

Figure 63:
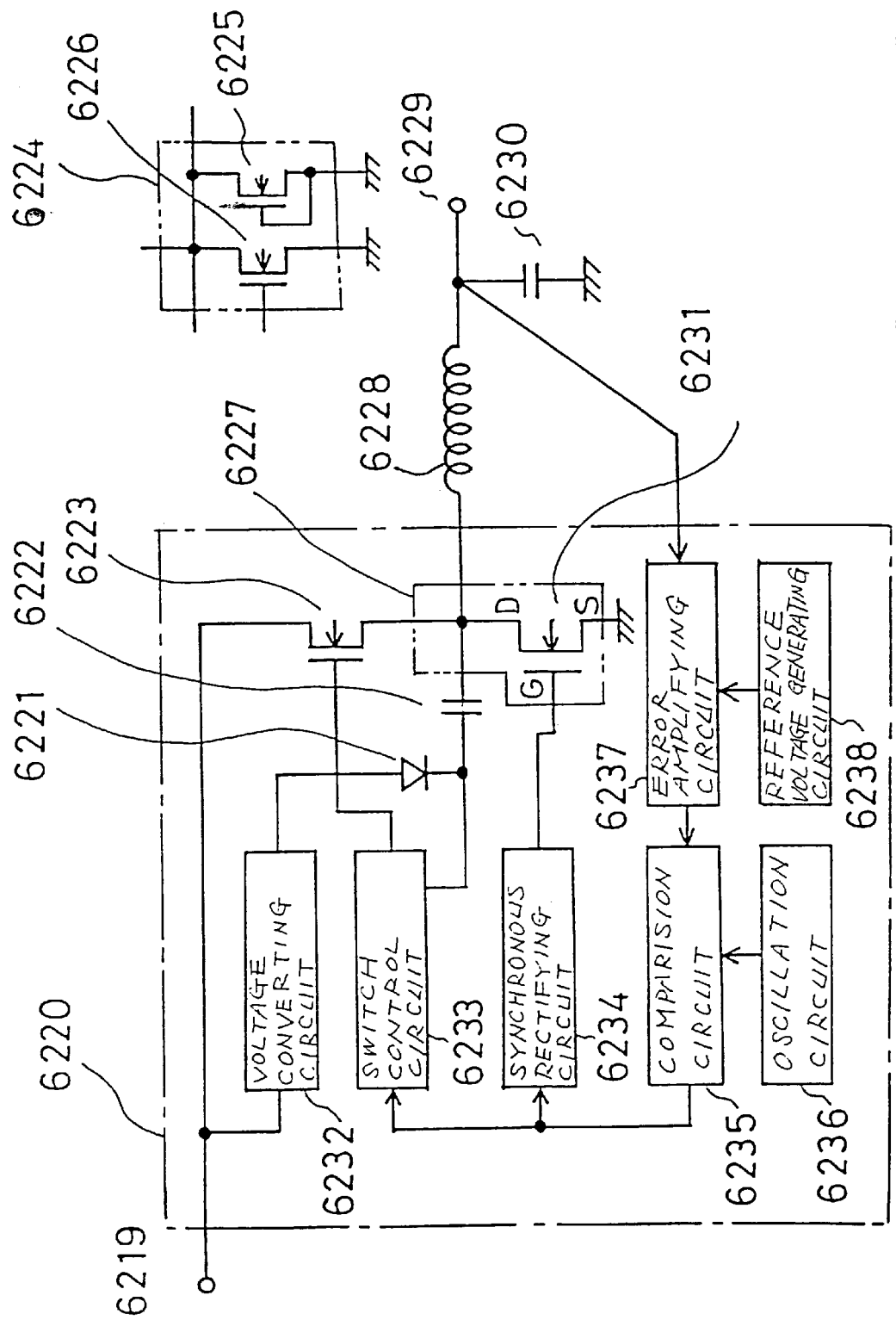
FIG. 63 is a block diagrams showing a circuit of a first semiconductor integrated circuit device according to an eight embodiment of the present invention.

FIG. 63 is a block diagram showing a circuit of a second semiconductor integrated circuit device 6220 according to the eight embodiment of the present invention. A synchronous rectifying switching type DC—DC converter basically comprises a switching element (MOS transistor 6223), a coil 6228, a capacitor ($C_1$) 6230 and a control circuit section (comprising a voltage converting circuit 6232, a switch control circuit 6233, a synchronous rectifying switch 6234, a comparison circuit 6235, an oscillation circuit 6236, an error amplifying circuit 6237, a reference voltage generating circuit 6238, and a step up circuit composed of a diode 6221 and a capacitor $C_2$ 6222) and a synchronous rectifying MOS transistor inserted in parallel with a rectifier diode (in part L 6227 in FIG. 63, the NROM transistor 6231 of the present invention is inserted without rectifier diode; described later). Signals having a phase inverse to the switching MOS transistor enter the gate (G) of this synchronous MOS transistor. The switching MOS transistor 6223 is turned off by the switching control circuit 6233. Then, a current flows in the coil 6228 and an electromotive force is generated.

Next, the control circuit turns off the switching MOS transistor 6223. Along that, energy stored in the coil is drawn out to the side of an output 6229. In the same time when the switching MOS transistor 6223 is turned off, the control circuit turns on the rectifying MOS transistor 6231 to provide current to the coil (at this time, it is necessary to provide a period in which two transistors are turned off in order to prevent a through current). It allows to improve the efficiency further as compared to the case when an inverse electromotive force is supplied only by the rectifier diode.

It is also possible to improve the efficiency by constructing as shown in a part L 6224 (application example) in which the NROM transistor 6225 of the present invention is provided instead of the rectifier diode in addition to the synchronous rectifying MOS transistor 6226. It is also possible to construct a part L 6227 only by the NROM transistor 6231 of the present invention for synchronous rectification as shown in the figure. It is because the NROM transistor of the present invention has a high surge resistance as described before and fully plays the role of the rectifier diode during off. Thus, it allows to realize a DC—DC converter circuit (or the semiconductor integrated circuit device for controlling DC—DC converter 6220 as in the present invention) having a conversion efficiency of 90 to 98% which is almost ideal as a DC—DC converter. The reference numeral 6319 denotes an input terminal. The substrate of the NROM transistor 6231 of the present invention must be floating, not connecting to a source (S) as shown in the figure (it is the same in the embodiment of FIG. 62).

While an example in which the NROM transistor of the present invention is applied to the DC—DC converter has been explained, it also has high performances from the aspect of rectifier function (surge resistance, high responsibility, etc.) and is useful when a semiconductor integrated circuit device or electrical equipment in which it is applied for rectifying AC or high frequency is constructed.

Figure 65:
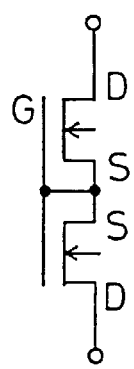
FIGS. 65(a) through 65(d) are symbolic drawings showing a semiconductor device (TVS) according to a ninth embodiment of the present invention.
Figure 65:
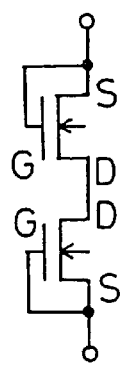
Figure 65:
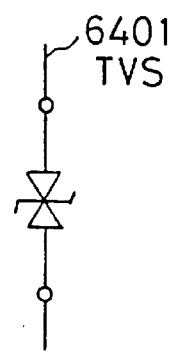
Figure 65:
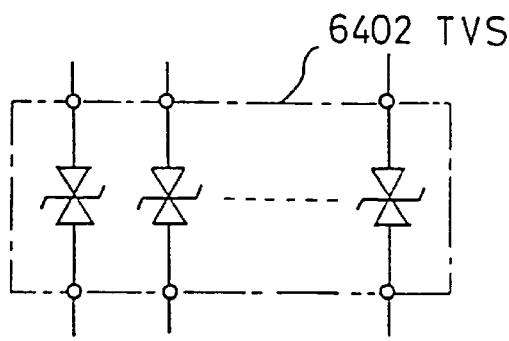

FIGS. 65(a) through 65(d) are symbolic drawings showing a semiconductor device (TVS) according to a ninth embodiment of the present invention. When two NROM transistors of the present invention are connected as shown in FIG. 65(a) or 65(b), two-terminal elements having a preset withstand voltage ($BV_s$, $V_{trig}$, 12 V or 24 V) are created on the both sides (non-polarity) (at this time, the substrate may be connected to the source (S), be connected with a resistance or be floating. It is floating in FIG. 65). It is indicated by the symbol as shown in FIG. 65(c), is called as a surge killer or TVS (transient voltage suppressor) 6401 and is used as a part of a circuit. FIG. 65(d) shows a semiconductor device 6402 (TVS array) composed of a plurality of TVSs.

Figure 66:
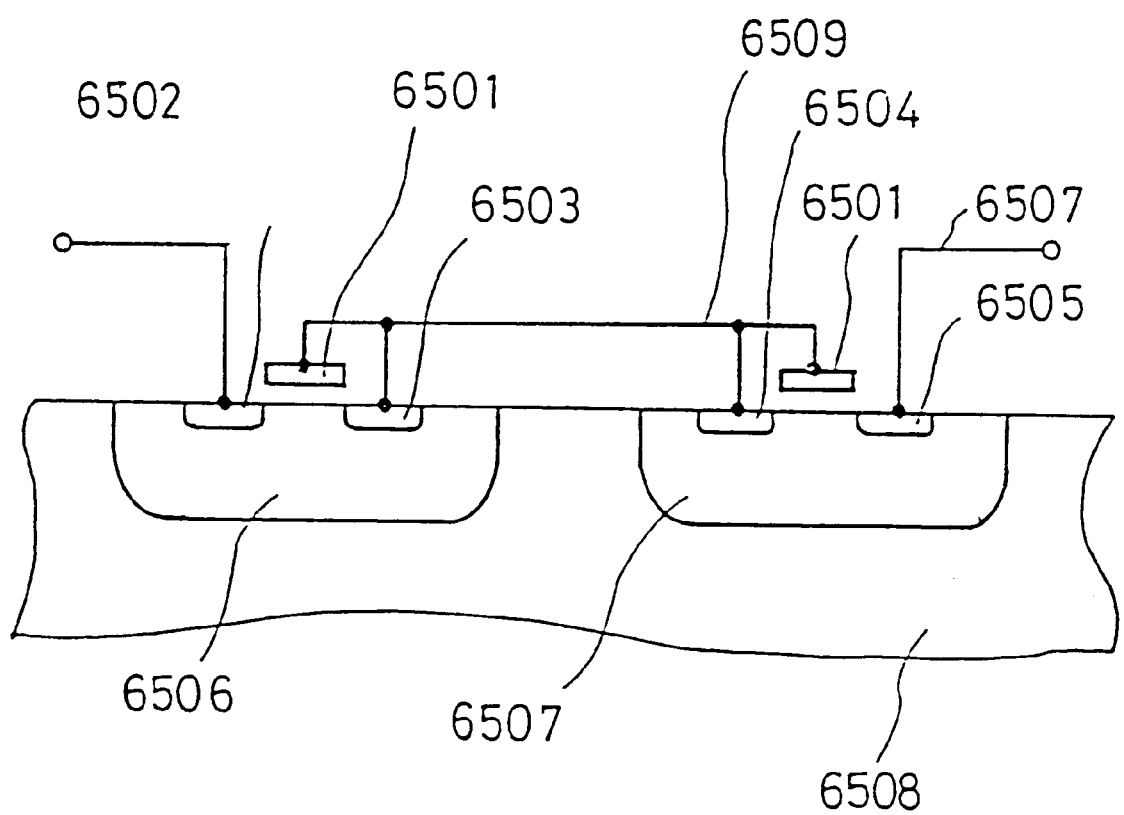
FIG. 66 is a section view showing the semiconductor device of the ninth embodiment of the present invention.

FIG. 66 is a section view showing the semiconductor device of the ninth embodiment of the present invention. A P-well 1 6506 and a P-well 2 6507 are formed exclusively within an $N^-$ type substrate 6508, and an $N^+$ type layer 1, a drain area 6502, an $N^+$ type layer 2, a source area 6503, an $N^+$ type layer 3, a source area 6504, an $N^+$ type layer 4, and a drain area 6505 are formed. The state in which gate electrodes 6501 and others are connected with a diagrammatic line 6509 and others representing electrical connections corresponds to FIG. 65(a).

Other intermediate insulating film and electrodes are omitted to simplify the drawing.

The plurality of pairs of NROM transistors (TVS connection) shown in FIG. 65(d) may be obtained by forming a plurality of exclusive P-well pairs in the similar fashion. In the description of the present invention so far, mainly the semiconductor device itself whose ESD immunity is improved has been explained. The present embodiment is a case in which a semiconductor device for protecting another semiconductor device (IC) from ESD is constructed. ESD immunity of IC is considered many times when it is handled singularly. That is, it is ESD from human body, from an automatic machine when it is packaged to a circuit board by the automatic machine or from a packaging case. It was not considered so much after when it is assembled into a circuit board together with other ICs and other circuit parts (after also finishing soldering). However, ICs often caused ESD destruction in a circuit board related to an interface portion (I/O function section, RS-232, etc.) with another equipment for example, depending on a type of the circuit board, posing a problem. Even if they have cleared a certain ESD immunity as a single IC, it is hard to find which one will be destroyed when they are mixed with other ICs having various ESD immunity in a large circuit, thereby posing a big problem.

The TVS or TVS array of the present invention is a semiconductor device for equally protecting the ICs by inserting the TVS between power supplies of each IC and in a signal line where surge may come.

As described above, the NROM transistor of the present invention allows to realize such semiconductor device (TVS) since it has a high degree of freedom in setting the withstand voltage ($BV_s$, $V_{tring}$, etc.) (also 5 V system, 12 V system or 24 V system) and has a very high dissipation ability. Above all, because it allows to obtain a very fast response speed by taking the offset CONV structure, it can protect the other ICs by quickly escaping surge before stress (surge) is applied to the ICs to be protected.

As described above, according to the present invention, various semiconductor devices and semiconductor integrated circuit devices having a good ESD immunity may be realized without increasing the cost considerably by constructing the N-channel MOS transistor in which the high concentrated drain area is provided under the gate. Specifically, it is not too much to say that ESD immunity of high withstanding CMOS ICs (high $V_{ddmax}$: more than 12 to 24 V), of ICs whose chip size is small, of highly integrated ICs of the future (less than 0.5 micro in terms of rule) and of low voltage CMOS ICs (low $V_{ddmin}$: less than 3 V) may be maintained for the first time by the present invention.

What is claimed is:

1. A semiconductor device including an N-channel MOS transistor, the N-channel MOS transistor comprising: a semiconductor substrate having a first conductivity type; source and drain regions having a second conductivity type formed in the semiconductor substrate; a gate electrode formed over the semiconductor substrate between the source and drain regions, the gate electrode having a portion disposed directly over a portion of the drain region; and a gate insulating film formed between the semiconductor substrate and the gate electrode; wherein the drain region has a first impurity region formed laterally spaced from the gate electrode and extending slightly under the gate electrode due to lateral diffusion, and a second impurity region formed substantially and directly under the gate electrode but not formed by lateral diffusion, the second impurity region having an impurity concentration of at least $5 \times 10^{18}$ $cm^{-3}$ and having an impurity concentration which monotonically decreases without a kink in the direction towards the source region under the gate electrode.

2. The semiconductor device according to claim 1; wherein a length of the extended portion of the gate electrode over the drain region is greater than 0.5 $\mu$m.

3. The semiconductor device according to claim 1; wherein the gate electrode is electrically connected to the source region.

4. A semiconductor device according to claim 3; wherein a length of the extended portion of the gate electrode disposed over a portion of the drain region is greater than 0.5 $\mu$m.

5. A semiconductor device according to claim 3; wherein the gate electrode of the N-channel MOS transistor is elongated to completely surround the drain region thereof in one plane.

6. A semiconductor device according to claim 3; wherein the N-channel MOS transistor is configured to undergo bipolar operation when the gate electrode and the source region are electrically grounded and a predetermined hold voltage is applied to the drain region; and wherein a hold voltage associated with the bipolar operation is greater than the maximum operating voltage of the semiconductor device.

7. A semiconductor device according to claim 3; further comprising an external connection terminal for electrical connection with an external circuit; and an internal circuit containing one or more MOS transistors formed on a semiconductor substrate, the external connection terminal and the internal circuit being electrically connected, the external connection terminal also being electrically connected to the N-channel MOS transistor, such that the N-channel MOS transistor undergoes a bipolar operation when the gate electrode and the source region are electrically grounded and a predetermined hold voltage is applied to the drain region, wherein a trigger voltage of the bipolar operation is lower than a trigger voltage of a bipolar operation of the one or more MOS transistors in the internal circuit.

8. A semiconductor device according to claim 3; further comprising an external connection terminal for connection to an external circuit; an internal circuit containing one or more MOS transistors; and a peripheral portion disposed between the external connection terminal and the internal circuit to electrically couple the external connection terminal and the internal circuit; wherein the peripheral portion contains the N-channel MOS transistor.

9. A semiconductor device according to claim 3; wherein the minimum operating voltage of the semiconductor device is less than 1.5 volts.

10. A semiconductor device according to claim 3; wherein the maximum operating voltage of the semiconductor device is greater than 12 volts.

11. A semiconductor device according to claim 3; wherein the semiconductor substrate comprises a semiconductor film formed on a support substrate via an insulating film.

12. A semiconductor device according to claim 3; further comprising an internal circuit containing one or more MOS transistors; and a power supply terminal and a ground terminal for supplying power to the internal circuit to drive the one or more MOS transistors therein; wherein the N-channel MOS transistor is electrically connected between the power supply and ground terminals.

13. A semiconductor device according to claim 12; further comprising a peripheral portion disposed between and electrically connected to the terminals and the internal circuit; wherein the peripheral portion contains the N-channel MOS transistor, the drain region of the N-channel MOS transistor is connected to the power supply terminal, and the source region of the N-channel MOS transistor is connected to the ground terminal.

14. A semiconductor device according to claim 13; wherein the minimum operating voltage of the semiconductor device is less than 1.5 volts.

15. A semiconductor device according to claim 3; wherein the N-channel MOS transistor and the internal circuit are both formed on the semiconductor substrate and the length of one side of a chip comprising the semiconductor substrate is less than 1.5 mm.

16. A semiconductor device according to claim 3; further comprising a plurality of terminals including an input terminal, an output terminal and a ground terminal; an internal circuit containing one or more MOS transistors; and a peripheral portion disposed between one of the input and output terminals and the internal circuit, the peripheral portion having a transistor electrically connected between the input terminal and the output terminal, and containing the N-channel MOS transistor, the drain region of the N-channel MOS transistor being electrically connected to the output terminal and the source region thereof being electrically connected to the ground terminal.

17. A semiconductor device according to claim 3; further comprising at least one external connection terminal comprising an input terminal or an output terminal; an internal circuit containing one or more MOS transistors; and a peripheral portion disposed between the external connection terminal and the internal circuit; wherein the external connection terminal, the internal circuit and the peripheral portion are electrically connected, the peripheral portion contains the N-channel MOS transistor, the drain region of the N-channel MOS transistor is electrically connected to the external connection terminal, and the source region of the N-channel MOS transistor is electrically connected to the ground terminal.

18. A semiconductor device according to claim 17; wherein the output terminal and the internal circuit are electrically coupled via a resistor.

19. A semiconductor device according to claim 3; further comprising an external connection terminal comprising one of an input and an output terminal; a ground terminal; an internal circuit containing one or more MOS transistors; and a peripheral portion disposed between the external terminal and the internal circuit, the external connection terminal and the internal circuit being electrically connected; wherein the peripheral portion contains the N-channel MOS transistor, the drain region of the N-channel MOS transistor is electrically connected to the external connection terminal, and the source region thereof is electrically connected to the ground terminal.

20. A semiconductor device according to claim 19; wherein the output terminal and the internal circuit are electrically coupled via a resistor.

21. A semiconductor device according to claim 19; wherein the external connection terminal and the internal circuit are electrically coupled via an inverter composed of an NMOS transistor and a PMOS transistor.

22. A semiconductor device according to claim 19; further comprising an open drain transistor; wherein the output terminal and the internal circuit are electrically coupled via the open drain transistor, a drain terminal of the open drain transistor is electrically connected to the output terminal, and a gate terminal of the open drain transistor is electrically connected to the internal circuit.

23. A semiconductor device according to claim 22; wherein the output terminal and the drain terminal of the open drain transistor are electrically coupled via a resistor.

24. A semiconductor device according to claim 22; further comprising a first inverter and a second inverter, each of the inverters comprising an NMOS transistor and a PMOS transistor; wherein an input section of the first inverter is connected to the input/output terminal, an output section of the first inverter is connected to the internal circuit, an output section of the second inverter is connected to the input/output terminal, and an input section of the second inverter is connected to said internal circuit.

25. A semiconductor device according to claim 3; further comprising a plurality of terminals including an input/output terminal for inputting and outputting signals and a ground terminal; an internal circuit containing one or more MOS transistors; and a peripheral portion disposed between the input/output terminal and the internal circuit, the input/output terminal, the internal circuit and the peripheral portion being electrically connected; wherein the peripheral portion contains the N-channel MOS transistor, the drain region of the N-channel MOS transistor is electrically connected to the input/output terminal, and the source region thereof is electrically connected to the ground terminal.

26. A semiconductor device according to claim 3; further comprising a plurality of terminals including an external connection terminal comprising one of an input and an output terminal, and a ground terminal; an internal circuit containing one or more MOS transistors; and a peripheral portion disposed between the external connection terminal and the internal circuit, the external connection terminal, the internal circuit and the peripheral portion being electrically connected; wherein the peripheral portion contains the N-channel MOS transistor, the drain region of the N-channel MOS transistor is electrically connected to the external connection terminal, and the source region thereof is electrically connected to the ground terminal, and wherein the external connection terminal is exposed to a voltage of more than 12 volts from an external circuit.

27. The semiconductor device according to claim 1; wherein the gate electrode is elongated to completely surround the drain area in one plane.

28. The semiconductor device according to claim 1; wherein the N-channel MOS transistor is configured to undergo bipolar operation when the gate electrode and the source region are electrically grounded and a predetermined voltage is applied to the drain region; and wherein a hold voltage associated with the bipolar operation is greater than the maximum operating voltage of the semiconductor device.

29. The semiconductor device according to claim 1; further comprising an external connection terminal for electrical connection with an external circuit; and an internal circuit containing a MOS transistor formed on a semiconductor substrate, the external connection terminal and the internal circuit being electrically connected, said external connection terminal also being electrically connected to the N-channel MOS transistor such that the N-channel MOS transistor undergoes a bipolar operation when the gate electrode and the source area are electrically grounded and a predetermined voltage is applied to the drain area, and a trigger voltage of the bipolar operation is lower than a trigger voltage of a bipolar operation of the MOS transistor in the internal circuit.

30. The semiconductor device according to claim 1; further comprising an input/output terminal; an internal circuit containing a MOS transistor; and a peripheral portion disposed between the input/output terminal and the internal circuit to electrically couple the input/output terminal and the peripheral portion; wherein the peripheral portion contains the N-channel MOS transistor.

31. A semiconductor device according to claim 30; wherein the internal circuit contains a plurality of MOS transistors, and a MOS transistor of the internal circuit that is electrically arranged closest to the N-channel MOS transistor of the peripheral portion has a drain region at the surface of the semiconductor substrate that is closed plane-wise.

32. A semiconductor device according to claim 30; wherein a MOS transistor of the internal circuit comprises a second semiconductor substrate having a first conductivity type, source and drain regions having a second conductivity type formed in the second semiconductor substrate, a gate electrode formed over the second semiconductor substrate between the source and drain regions, the gate electrode having an extended portion disposed over a portion of the drain region, and a gate insulating film disposed between the second semiconductor substrate and the gate electrode; wherein the drain region of the MOS transistor has an impurity concentration of at least $5 \times 10^{18}$ cm$^{-3}$ in a region proximate the extended portion of the gate electrode, and the impurity concentration of the drain region at the surface of the second semiconductor substrate monotonically decreases with a kink in the direction towards the source region under the gate electrode.

33. The semiconductor device according to claim 1; wherein the minimum operating voltage of the semiconductor device is less than 1.5 volts.

34. The semiconductor device according to claim 1; wherein the maximum operating voltage of the semiconductor device is more than 12 volts.

35. The semiconductor device according to claim 1; wherein the semiconductor substrate comprises a semiconductor film is formed on a support substrate via an insulating film.

36. The semiconductor device according to claim 1; further comprising an internal circuit containing a MOS transistor; and at least two terminals for supplying power to the internal circuit; wherein the N-channel MOS transistor is electrically connected between the two terminals.

37. The semiconductor device according to claim 36; wherein the minimum operating voltage of the semiconductor device is less than 1.5 volts.

38. The semiconductor device according to claim 36; wherein the N-channel MOS transistor and the internal circuit are both formed on the semiconductor substrate and the length of one side of a chip comprising said semiconductor substrate is less than 1.5 mm.

39. A semiconductor device according to claim 36; wherein the maximum operating voltage of the semiconductor device is greater than 12 volts.

40. The semiconductor device according to claim 1; further comprising a switching transistor for inputting a predetermined voltage; a switch control circuit for controlling the switching transistor; a coil electrically connected to the switching transistor; and a switching regulator comprising the N-channel MOS transistor electrically connected between the switching transistor and the coil.

41. The semiconductor device according to claim 1; further comprising an input terminal receptive of an external input signal; an internal circuit electrically connected to the input terminal; and an electrostatic protection element electrically connected to the input terminal; wherein the electrostatic protection element includes the N-channel MOS transistor.

42. The semiconductor device according to claim 41; wherein the drain area of the N-channel MOS transistor is electrically connected to the input terminal and the source area is electrically grounded.

43. The semiconductor device according to claim 41; wherein the input terminal and the internal circuit are electrically coupled via a resistor.

44. The semiconductor device according to claim 1; further comprising an output terminal for outputting signals; an internal circuit electrically connected to the output terminal; and an electrostatic protection element electrically connected to the output terminal; wherein the electrostatic protection element includes the N-channel MOS transistor.

45. The semiconductor device according to claim 44; wherein the drain area of the N-channel MOS transistor is electrically connected with the output terminal and the source area is electrically grounded.

46. The semiconductor device according to claim 45; wherein the gate electrode of the N-channel MOS transistor is electrically coupled to the internal circuit.

47. The semiconductor device according to claim 44; wherein the output terminal and the internal circuit are electrically connected via a resistor.

48. The semiconductor device according to claim 44; wherein the internal circuit has an output section comprising an inverter composed of an NMOS transistor and a PMOS transistor, an output section of the inverter is electrically connected to the output terminal and the NMOS transistor is the N-channel MOS transistor.

49. The semiconductor device according to claim 44; wherein the internal circuit has an output section comprising an open drain transistor, the open drain transistor is electrically coupled to the output terminal and the N-channel MOS transistor is electrically coupled to the output terminal.

50. The semiconductor device according to claim 49; wherein the open drain transistor is electrically coupled to the output terminal via a resistor.

51. The semiconductor device according to claim 1; further comprising an input/output terminal for inputting and outputting signals; an internal circuit electrically coupled to the input/output terminal; and an electrostatic protection element electrically connected to the input/output terminal; wherein the electrostatic protection element comprises the N-channel MOS transistor.

52. The semiconductor device according to claim 51; further comprising a first inverter and a second inverter, each of the inverters comprising an NMOS transistor and a PMOS transistor; wherein an input section of the first inverter is connected to the input/output terminal and an output section thereof is connected with said internal circuit, and an output section of the second inverter is connected to the input/output terminal and an input section thereof is connected to the internal circuit.

53. The semiconductor device according to claim 52; wherein the NMOS transistor is the N-channel MOS transistor.

54. The semiconductor device according to claim 1; further comprising an internal circuit operable at less than 5 volts; and an output terminal electrically coupled to the internal circuit, to the N-channel MOS transistor and to an external circuit operable at more than 12 volts.

55. The semiconductor device according to claim 54; wherein the internal circuit and the output terminal are electrically connected via an NMOS transistor, a gate of said NMOS transistor and said internal circuit are electrically connected, a drain of said NMOS transistor is electrically connected with said output terminal and said NMOS transistor is made from said N-channel MOS transistor.

56. A semiconductor device according to claim 54; wherein a gate electrode of the N-channel MOS transistor is electrically connected to the internal circuit.

57. A semiconductor device according to claim 1; further comprising an internal circuit containing a MOS transistor; a power supply terminal and a ground terminal for supplying electrical power to the internal circuit; and a peripheral portion disposed between the terminals and the internal circuit; wherein at least one of the terminals, the internal circuit and the peripheral portion are electrically connected to one another, the peripheral portion contains the N-channel MOS transistor, the drain region is electrically connected to the power supply terminal, and the source region is electrically connected to the ground terminal.

58. A semiconductor device according to claim 1; further comprising first and second terminals; and wherein the N-channel MOS transistor comprises a pair of N-channel MOS transistors having interconnected source regions and interconnected gate electrodes, the interconnected gate electrodes being electrically connected to the interconnected source regions, the drain region of one of the N-channel MOS transistors being electrically connected to the first terminal and the drain region of the other N-channel MOS transistor being electrically connected to the second terminal.

59. A semiconductor device according to claim 1; further comprising an external connection terminal; a ground terminal; an internal circuit; and a peripheral portion disposed between the external connection terminal and the internal circuit; wherein the external connection terminal, the internal circuit and the peripheral portion are electrically connected to each other, the peripheral portion contains the N-channel MOS transistor, the drain region of the N-channel MOS transistor is electrically connected to the external connection terminal and the source region is electrically connected to the ground terminal.

60. A semiconductor device according to claim 59; wherein the external connection terminal and the internal circuit are electrically coupled via a resistor.

61. A semiconductor device according to claim 1; further comprising first and second terminals; and wherein the N-channel MOS transistor comprises a pair of N-channel MOS transistors having interconnected drain regions, a gate electrode of a first N-channel MOS transistors being electrically connected to a source region of the second N-channel MOS transistor, the gate electrode of the second N-channel MOS transistor being electrically connected to the source region of the first N-channel MOS transistor, and the source region of the first N-channel MOS transistor being electrically connected to the first terminal and the source region of the second N-channel MOS transistor being electrically connected to the second terminal.

62. A semiconductor device according to claim 1; further comprising an external connection terminal; a ground terminal; an internal circuit; and a peripheral portion disposed between the external connection terminal and the internal circuit; wherein the external connection terminal, the internal circuit and the peripheral portion are electrically connected to each other, the peripheral portion contains the N-channel MOS transistor, the drain region of the N-channel MOS transistor is electrically connected to the external connection terminal, and the source region of the N-channel MOS transistor is electrically connected to the ground terminal.

63. A semiconductor device according to claim 62; wherein the external connection terminal and the internal circuit are electrically coupled via a resistor.

64. A semiconductor device according to claim 62; wherein the external connection terminal and the internal circuit are electrically coupled via an inverter comprising an NMOS transistor and a PMOS transistor.

65. A semiconductor device according to claim 62; wherein the external connection terminal and the internal circuit are electrically coupled via an open drain transistor, a drain terminal of the open drain transistor is electrically connected to the external connection terminal, and a gate terminal of the open drain transistor is electrically connected to the internal circuit.

66. A semiconductor device according to claim 65; wherein the external connection terminal and the drain terminal of the open drain transistor are electrically coupled via a resistor.

67. A semiconductor device according to claim 62; wherein a gate terminal of the N-channel MOS transistor is electrically connected to the internal circuit.

68. A semiconductor device according to claim 1; further comprising an input/output terminal for inputting and outputting signals; a ground terminal; an internal circuit; and a peripheral portion disposed between the input/output terminal and the internal circuit; wherein the input/output terminal, the internal circuit, and the peripheral portion are electrically connected to each other, the peripheral portion contains the N-channel MOS transistor, the drain region of the N-channel MOS transistor is electrically connected to the input/output terminal, and the source region of the N-channel MOS transistor is electrically connected to the ground terminal.

69. A semiconductor device according to claim 68; further comprising a first inverter and a second inverter, each inverter comprising an NMOS transistor and a PMOS transistor; wherein an input section of the first inverter is connected to the input/output terminal and an output section thereof is connected to the internal circuit, and an output section of the second inverter is connected to the input/output terminal and an input section thereof is connected to the internal circuit.

70. A semiconductor device according to claim 1; further comprising an input/output terminal for inputting and outputting signals; a ground terminal; an internal circuit; a peripheral portion disposed between the input/output terminal and the internal circuit, the input/output terminal, the internal circuit and the peripheral portion being electrically connected to each other; and first and second inverters, each comprising an NMOS transistor and a PMOS transistor; wherein an input section of the first inverter is connected to the input/output terminal and an output section thereof is connected to the internal circuit, and an output section of the second inverter is connected to the input/output terminal and an input section thereof is connected to the internal circuit, and the NMOS transistor of the second inverter is the N-channel MOS transistor.

71. A semiconductor device according to claim 1; further comprising an external connection terminal; a ground terminal; an internal circuit; and a peripheral portion disposed between the external connection terminal and the internal circuit, the external connection terminal, the internal circuit, and the peripheral portion being electrically connected together; wherein the peripheral portion includes the N-channel MOS transistor, the drain region of the N-channel MOS transistor is electrically connected to the external connection terminal, the source region of the N-channel MOS transistor is electrically connected to the ground terminal, and the external connection terminal is receptive of a voltage greater than 12 volts from an external circuit.

72. A semiconductor device according to claim 1; wherein the gate insulating film has a thickness of less than 200 Å.

73. A semiconductor device according to claim 1; wherein the source region of the N-channel MOS transistor is electrically connected to the gate electrode thereof, and the gate insulating film has a thickness greater than 500 Å.

74. A semiconductor device according to claim 1; wherein the N-channel MOS transistor is configured to undergo bipolar operation when the gate electrode and the source region thereof are electrically grounded and a voltage is applied to the drain region thereof, and wherein the bipolar operation of the N-channel MOS transistor has a first breakdown point at which snapback occurs to permit continued bipolar operation and a second breakdown point at which a low impedance state occurs, and the maximum current through the N-channel MOS transistor at the second breakdown point of the bipolar operation is greater than 50 mA.

75. A semiconductor device according to claim 1; wherein the source region of the N-channel MOS transistor is electrically connected to the gate electrode thereof, and wherein the relationship between the maximum impurity concentration of the drain region and a junction depth of the drain region is set in accordance with the following relationship:

$$Cs > \frac{1}{5}\left[\sqrt{\frac{1}{xj}} + 1\right]$$

wherein Cs is the maximum impurity concentration of the drain region and xj is the junction depth of the drain region.

76. A semiconductor device according to claim 1; wherein the source region of the N-channel MOS transistor is electrically connected to the gate electrode thereof, the maximum impurity concentration of the drain region of the N-channel MOS transistor is greater than $5\times10^{18}$ cm$^{-3}$, and a junction depth of the drain region is less than 0.5 μm.

77. A semiconductor device according to claim 1; wherein the source region of the N-channel MOS transistor is electrically connected to the gate electrode thereof, the maximum impurity concentration of the drain region of the N-channel MOS transistor is greater than $6\times10^{18}$ cm$^{-3}$, and a junction depth of the drain region is less than 0.3 μm.

78. A semiconductor device according to claim 1; wherein the source region of the N-channel MOS transistor is electrically connected to the gate electrode thereof, the maximum impurity concentration of the drain region of the N-channel MOS transistor is greater than $1\times10^{19}$ cm$^{-3}$, and a junction depth of the drain region is less than 0.1 μm.

79. A semiconductor device according to claim 1; wherein the source region of the N-channel MOS transistor is electrically connected to the gate electrode thereof, the maximum impurity concentration of the drain region of the N-channel MOS transistor is greater than $5\times10^{18}$ cm$^{-3}$, and the minimum channel length between the drain and source regions of the N-channel MOS transistor is less than 3 μm.

80. A semiconductor device according to claim 1; wherein the source region of the N-channel MOS transistor is electrically connected to the gate electrode thereof, the maximum impurity concentration of the drain region of the N-channel MOS transistor is greater than $6\times10^{18}$ cm$^{-3}$, and the minimum channel length between the drain and source regions of the N-channel MOS transistor is less than 2 μm.

81. A semiconductor device according to claim 1; wherein the source region of the N-channel MOS transistor is electrically connected to the gate electrode thereof, the maximum impurity concentration of the drain region of the N-channel MOS transistor is greater than $7\times10^{18}$ cm$^{-3}$, and the minimum channel length between the drain and source regions of the N-channel MOS transistor is less than 1 μm.

82. A semiconductor device according to claim 1; wherein the source region of the N-channel MOS transistor is electrically connected to the gate electrode thereof, the maximum impurity concentration of the drain region of the N-channel MOS transistor is greater than $8\times10^{18}$ cm$^{-3}$, and the minimum channel length between the drain and source regions of the N-channel MOS transistor is less than 0.5 μm.

83. A semiconductor device according to claim 1; wherein the source region of the N-channel MOS transistor is electrically connected to the gate electrode thereof, the maximum impurity concentration of the drain region of the N-channel MOS transistor is greater than $1\times10^{19}$ cm$^{-3}$, and the minimum channel length between the drain and source regions of the N-channel MOS transistor is less than 0.3 μm.

* * * * *